United States Patent
Tanaka et al.

(10) Patent No.: US 9,412,877 B2
(45) Date of Patent: Aug. 9, 2016

(54) SEMICONDUCTOR DEVICE

(71) Applicant: Semiconductor Energy Laboratory Co., Ltd., Atsugi-shi, Kanagawa-ken (JP)

(72) Inventors: Tetsuhiro Tanaka, Kanagawa (JP);
Yasumasa Yamane, Kanagawa (JP);
Hideomi Suzawa, Kanagawa (JP);
Daisuke Matsubayashi, Kanagawa (JP);
Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/176,472

(22) Filed: Feb. 10, 2014

(65) Prior Publication Data

US 2014/0225105 A1    Aug. 14, 2014

(30) Foreign Application Priority Data

Feb. 12, 2013    (JP) .................................. 2013-025025

(51) Int. Cl.
*H01L 27/14*    (2006.01)
*H01L 29/786*    (2006.01)

(52) U.S. Cl.
CPC ...... *H01L 29/78696* (2013.01); *H01L 29/7869* (2013.01)

(58) Field of Classification Search
CPC ......................... H01L 27/1214; H01L 29/7869
USPC .............................................. 257/43, 59, 72
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Masashi Ono et al.; "Novel High Performance IGZO-TFT with High Mobility over 40 cm2/Vs and High Photostability Incorporated Oxygen Diffusion"; IDW '11 : Proceedings of the 18th International Display Workshops; pp. 1689-1690; Dec. 7, 2011.

(Continued)

*Primary Examiner* — Tan N Tran
(74) *Attorney, Agent, or Firm* — Fish & Richardson P.C.

(57) ABSTRACT

A transistor or the like having excellent electrical characteristics is provided. A semiconductor device includes a gate electrode; a gate insulating film in contact with the gate electrode; and a multilayer film which is in contact with the gate insulating film and includes a first oxide semiconductor layer, a second oxide semiconductor layer, and a third oxide semiconductor layer in the order from a side farthest from the gate insulating film. The first oxide semiconductor layer, the second oxide semiconductor layer, and the third oxide semiconductor layer each contain indium, an element M (aluminum, gallium, yttrium, or tin), and zinc. The first oxide semiconductor layer has a thickness greater than or equal to 20 nm and less than or equal to 200 nm. The third oxide semiconductor layer has a thickness greater than or equal to 0.3 nm and less than 10 nm.

12 Claims, 50 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,923,722 B2 | 4/2011 | Ryu et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 * | 6/2012 | Imai ................. H01L 29/7869 257/43 |
| 8,274,078 B2 | 9/2012 | Itagaki et al. |
| 8,421,083 B2 | 4/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0181565 A1 | 7/2010 | Sakata et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0090204 A1 | 4/2011 | Yamazaki et al. |
| 2011/0140100 A1 | 6/2011 | Takata et al. |
| 2011/0193083 A1 | 8/2011 | Kim et al. |
| 2011/0215328 A1 | 9/2011 | Morosawa et al. |
| 2011/0240991 A1 | 10/2011 | Yamazaki |
| 2012/0119205 A1 | 5/2012 | Taniguchi et al. |
| 2012/0153278 A1 | 6/2012 | Jeong et al. |
| 2012/0305913 A1 | 12/2012 | Yamazaki et al. |
| 2013/0009209 A1* | 1/2013 | Yamazaki ................. 257/192 |
| 2013/0009220 A1* | 1/2013 | Yamazaki et al. ........ 257/288 |
| 2013/0063675 A1* | 3/2013 | Misaki ........................ 349/46 |
| 2013/0270552 A1 | 10/2013 | Yamazaki et al. |
| 2013/0320330 A1 | 12/2013 | Yamazaki |
| 2013/0320334 A1 | 12/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-270617 A | 9/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2009-231613 A | 10/2009 |

(56) References Cited

FOREIGN PATENT DOCUMENTS

| JP | 2010-016347 | A | 1/2010 |
|---|---|---|---|
| JP | 4415062 | B1 | 2/2010 |
| JP | 2010-067954 | | 3/2010 |
| JP | 2010-073881 | A1 | 4/2010 |
| JP | 2010-177431 | A | 8/2010 |
| JP | 4571221 | B1 | 10/2010 |
| JP | 2011-124360 | A | 6/2011 |
| JP | 2011-243745 | | 12/2011 |
| JP | 2011-243745 | A | 12/2011 |
| JP | 2012-160679 | A | 8/2012 |
| WO | 2004/114391 | A1 | 12/2004 |
| WO | 2008/133345 | A1 | 11/2008 |

OTHER PUBLICATIONS

Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; p. 21-008; Mar. 17, 2010 with English translation.

Noboru Kimizuka et al.; "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System"; Journal of Solid State Chemistry, vol. 116; pp. 170-178; 1995.

Asakuma, N et al., "Crystallization and Reduction of sol-gel-Derived Zinc Oxide Films by Irradiation With Ultraviolet Lamp," Journal of sol-gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2006, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

(56) References Cited

OTHER PUBLICATIONS

Li, C et al., "Modulated Structures of Homologous Compounds InMO3(ZnO)m (M=In,Ga; m=Integer) Described by Four-Dimensional Superspace Group," Journal of Solid State Chemistry, 1990, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1616-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada. T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AMOLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International. Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9. pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

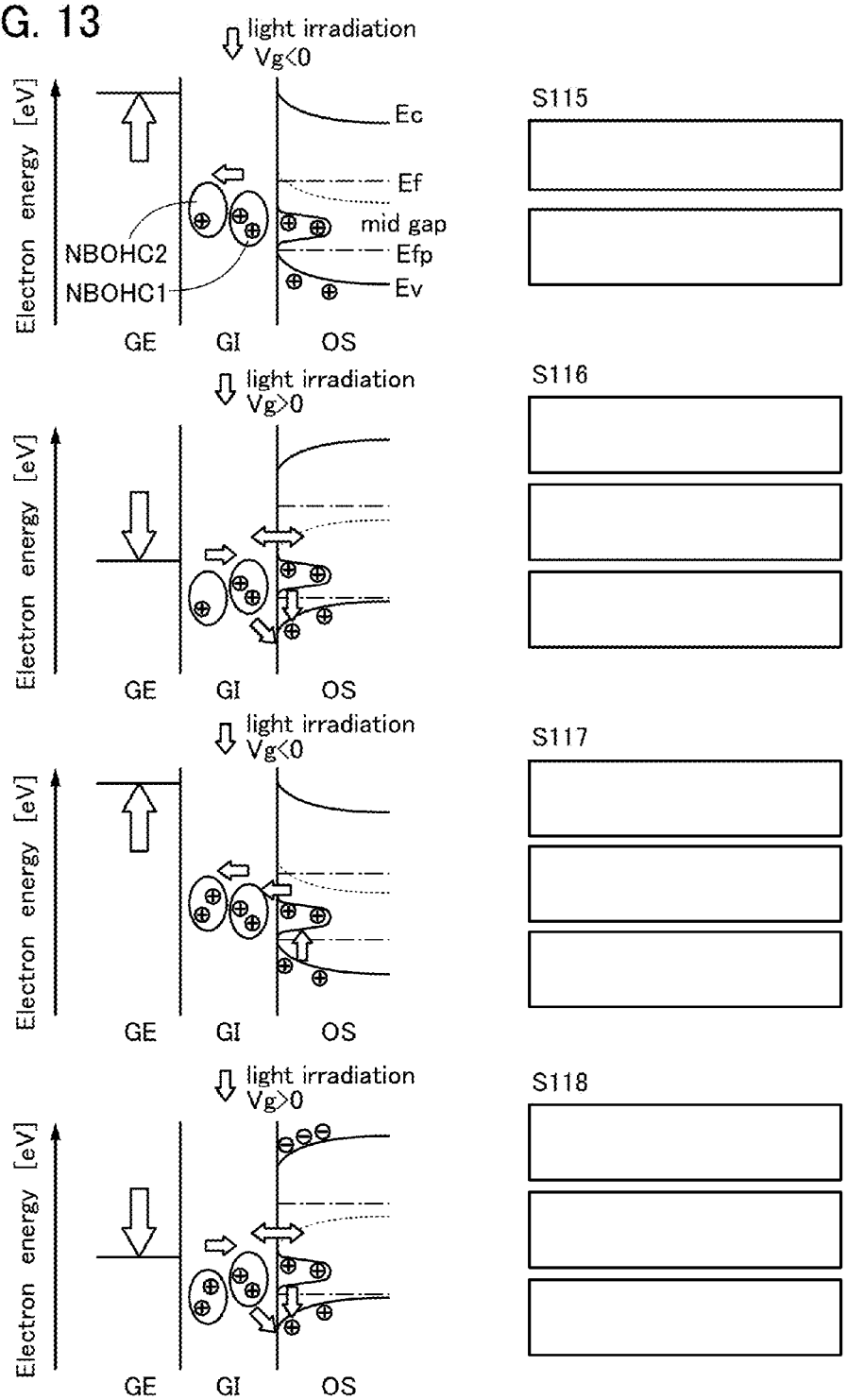

FIG. 29A
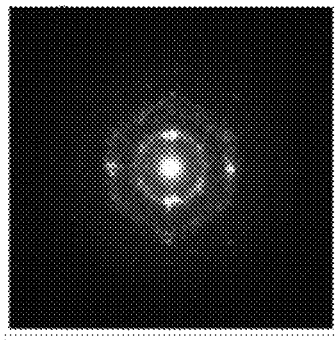
40nm thinned sample CAAC
FIG. 29B
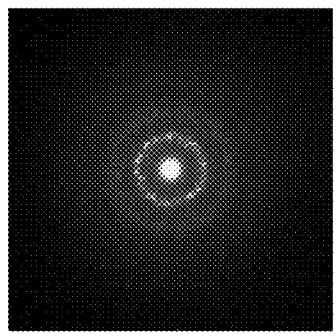
40nm thinned sample nc
FIG. 29C1
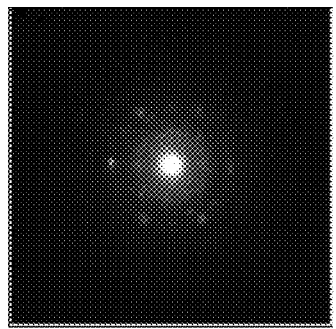
5-10nm thinned sample nc
measurement position 1
FIG. 29C2
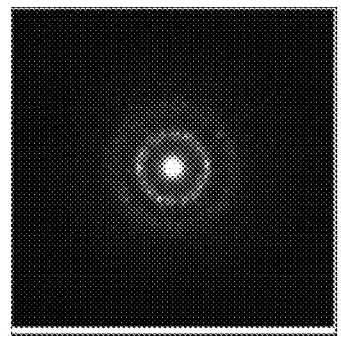
5-10nm thinned sample nc
measurement position 2

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor layer, a semiconductor device, a display device, a liquid crystal display device, or a light-emitting device. In addition, the present invention relates to a method for manufacturing a semiconductor device, a display device, a liquid crystal display device, or a light-emitting device. Alternatively, the present invention relates to a driving method of a semiconductor device, a display device, a liquid crystal display device, or a light-emitting device. In particular, the present invention relates to a semiconductor device, a display device, or a light-emitting device each including a transistor, or a driving method thereof, for example. Further, the present invention relates to, for example, an electronic appliance including the semiconductor device, the display device, or the light-emitting device.

Note that in this specification, a semiconductor device refers to any device that can function by utilizing semiconductor characteristics, and an electro-optical device, a semiconductor circuit, an electronic appliance, and the like are all included in the category of the semiconductor device.

2. Description of the Related Art

A technique by which a transistor is formed using a semiconductor film formed over a substrate having an insulating surface has been attracting attention. The transistor is applied to a wide range of semiconductor devices such as an integrated circuit and a display device. A silicon film is known as a semiconductor film applicable to a transistor.

As the silicon film used as a semiconductor film of a transistor, either an amorphous silicon film or a polycrystalline silicon film is used depending on the purpose. For example, in the case of a transistor included in a large-sized display device, it is preferable to use an amorphous silicon film, which can be formed using the established technique for forming a film on a large-sized substrate. On the other hand, in the case of a transistor included in a high-performance display device where driver circuits are formed over the same substrate, it is preferable to use a polycrystalline silicon film, which can form a transistor having a high field-effect mobility. As a method for forming a polycrystalline silicon film, high-temperature heat treatment or laser light treatment which is performed on an amorphous silicon film has been known.

In recent years, an oxide semiconductor film has attracted attention.

For example, a transistor which includes an amorphous oxide semiconductor film containing indium, gallium, and zinc is disclosed (see Patent Document 1).

An oxide semiconductor film can be formed by a sputtering method or the like, and thus can be used for a channel formation region of a transistor in a large display device. A transistor including an oxide semiconductor film has a high field-effect mobility; therefore, a high-performance display device where driver circuits are formed over the same substrate can be obtained. Moreover, there is an advantage that capital investment can be reduced because part of production equipment for a transistor including an amorphous silicon film can be retrofitted and utilized.

Note that homologous compounds represented by $InMO_3(ZnO)_m$ (M is Fe, Ga, or Al and m is a natural number) are known (see Non-Patent Document 1). Among homologous compounds represented by $InMO_3(ZnO)_m$, a crystal where M is gallium (Ga) is sometimes referred to as "Kimizuka crystal" named after Dr. Noboru Kimizuka who succeeded in synthesizing the crystal for the first time.

REFERENCE

Patent Document

[Patent Document 1] Japanese Published Patent Application No. 2006-165528

Non-Patent Document

N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", *J. Solid State Chem.*, 1995, Vol. 116, pp. 170-178

SUMMARY OF THE INVENTION

An object is to provide a transistor or the like having excellent electrical characteristics. Another object is to provide a transistor or the like having a high on-state current. Another object is to provide a transistor or the like having stable electrical characteristics.

Another object is to provide a transistor or the like having a low off-state current. Another object is to provide a transistor or the like having a high field-effect mobility. Another object is to provide a transistor or the like with a high yield. Another object is to provide a semiconductor device or the like including the transistor or the like. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a gate electrode; a gate insulating film in contact with the gate electrode; and a multilayer film which is in contact with the gate insulating film and includes a first oxide semiconductor layer, a second oxide semiconductor layer, and a third oxide semiconductor layer in the order from a side farthest from the gate insulating film. The first oxide semiconductor layer, the second oxide semiconductor layer, and the third oxide semiconductor layer each contain indium, an element M (aluminum, gallium, yttrium, or tin), and zinc. The first oxide semiconductor layer has an atomic ratio of the element M to indium which is higher than an atomic ratio of the element M to indium of the second oxide semiconductor layer and has a thickness greater than or equal to 20 nm and less than or equal to 200 nm. The third oxide semiconductor layer has an atomic ratio of the element M to indium which is higher than an atomic ratio of the element M to indium of the second oxide semiconductor layer and has a thickness greater than or equal to 0.3 nm and less than 10 nm.

Another embodiment of the present invention is a semiconductor device including a gate electrode; a gate insulating film in contact with the gate electrode; and a multilayer film which is in contact with the gate insulating film and includes a first oxide semiconductor layer, a second oxide semiconductor layer, and a third oxide semiconductor layer in the order from a side farthest from the gate insulating film. The first oxide semiconductor layer, the second oxide semiconductor layer, and the third oxide semiconductor layer each contain indium, an element M, and zinc. The first oxide semiconductor layer has an atomic ratio of the element M to indium which is 1.5 times or more as high as an atomic ratio of the element M to indium of the second oxide semiconductor layer and has a thickness greater than or equal to 20 nm and less than or equal to 200 nm. The third oxide semiconductor layer has an atomic ratio of the element M to indium which is 1.5 times or more as high as an atomic ratio of the element M to indium of the second oxide semiconductor layer and has a thickness greater than or equal to 0.3 nm and less than 10 nm.

Another embodiment of the present invention includes a semiconductor device including a gate electrode; a gate insulating film in contact with the gate electrode; and a multilayer film which is in contact with the gate insulating film and includes a first oxide semiconductor layer, a second oxide semiconductor layer, and a third oxide semiconductor layer in the order from a side farthest from the gate insulating film. The first oxide semiconductor layer, the second oxide semiconductor layer, and the third oxide semiconductor layer each contain indium, an element M, and zinc. The first oxide semiconductor layer has energy at a bottom of a conduction band, which is higher than energy at a bottom of a conduction band of the second oxide semiconductor layer, and has a thickness greater than or equal to 20 nm and less than or equal to 200 nm. The third oxide semiconductor layer has energy at a bottom of a conduction band, which is higher than energy at a bottom of a conduction band of the second oxide semiconductor layer, and has a thickness greater than or equal to 0.3 nm and less than 10 nm.

Another embodiment of the present invention includes a semiconductor device including a gate electrode; a gate insulating film in contact with the gate electrode; and a multilayer film which is in contact with the gate insulating film and includes a first oxide semiconductor layer, a second oxide semiconductor layer, and a third oxide semiconductor layer in the order from a side farthest from the gate insulating film. The first oxide semiconductor layer, the second oxide semiconductor layer, and the third oxide semiconductor layer each contain indium, an element M, and zinc. The first oxide semiconductor layer has energy at a bottom of a conduction band, which is higher than energy at a bottom of a conduction band of the second oxide semiconductor layer by 0.2 eV or more and 2 eV or less, and has a thickness greater than or equal to 20 nm and less than or equal to 200 nm. The third oxide semiconductor layer has energy at a bottom of a conduction band, which is higher than energy at a bottom of a conduction band of the second oxide semiconductor layer by 0.2 eV or more and 2 eV or less, and has a thickness greater than or equal to 0.3 nm and less than 10 nm.

Alternatively, in the above semiconductor device of any of the embodiments of the present invention, a source electrode and a drain electrode are formed between the second oxide semiconductor layer and the third oxide semiconductor layer.

A transistor or the like having excellent electrical characteristics can be provided. A transistor or the like having a high on-state current can be provided. A transistor or the like having stable electrical characteristics can be provided.

A transistor or the like having a low off-state current can be provided. A transistor or the like having a high field-effect mobility can be provided. A transistor or the like with a high yield can be provided. A semiconductor device or the like including the transistor or the like can be provided. A novel semiconductor device or the like can be provided.

BRIEF DESCRIPTION OF THE DRAWINGS

FIG. 13 illustrates deterioration of a transistor including an oxide semiconductor layer under light irradiation.

FIGS. 29A to 29C (29C1 and 29C2) are each a nanobeam electron diffraction pattern of an oxide semiconductor.

DETAILED DESCRIPTION OF THE INVENTION

Figure 1A:
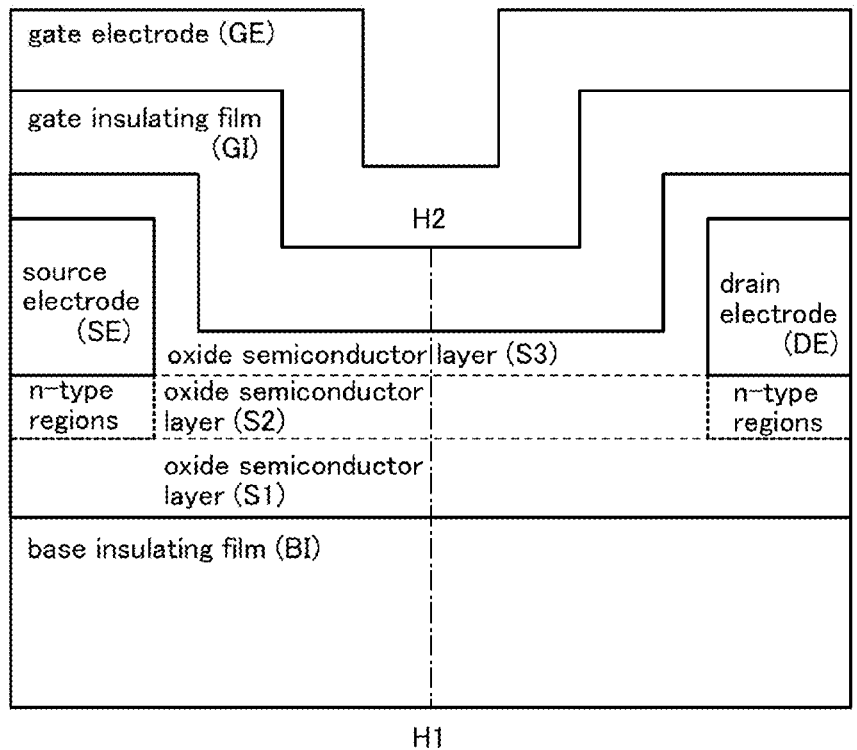
FIG. 1A is a cross-sectional view of a transistor.

An embodiment and examples of the present invention will be described in detail below with reference to the drawings. However, the present invention is not limited to the description below, and it is easily understood by those skilled in the art that modes and details can be modified in various ways. Further, the present invention is not construed as being limited to description of the embodiment and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that what is described (or part thereof) in one embodiment can be applied to, combined with, or exchanged with another content in the same embodiment.

Note that the size, the thickness of layers, or regions in drawings is sometimes exaggerated for simplicity and is not limited to such a scale.

Note that drawings are schematic views of ideal examples, and the embodiment of the present invention are not limited to the shape or the value illustrated in the drawings. For example, the following can be included: variation in shape due to a manufacturing technique; variation in shape due to an error; variation in signal, voltage, or current due to noise; variation in signal, voltage, or current due to a difference in timing; or the like.

A voltage usually refers to a difference in electric potential (hereinafter referred to as a potential) between a given potential and a reference potential (e.g., a source potential or a ground potential (GND)). Thus, a voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. In addition, the ordinal numbers in this specification do not denote particular names which specify the present invention.

In this specification, for example, when the shape of an object is described with the use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor layer refers to, for example, elements other than the main components of the semiconductor layer. For example, an element with a concentration lower than 0.1 atomic % is an impurity. When an impurity is contained, density of states (DOS) may be formed in the semiconductor layer, the carrier mobility may be decreased, or the crystallinity may be lowered, for example. In the case where the semiconductor layer is an oxide semiconductor layer, examples of an impurity which changes characteristics of the semiconductor layer include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case where the semiconductor layer is an oxide semiconductor layer, oxygen vacancies may be formed by entry of an impurity. Further, in the case where the semiconductor layer is a silicon layer, examples of an impurity which changes characteristics of the semiconductor layer include oxygen, Group 1 elements except hydrogen, Group 2 elements, Group 13 elements, and Group 15 elements.

In this specification, excess oxygen refers to oxygen in excess of the stoichiometric composition, for example. Alternatively, excess oxygen refers to oxygen released by heating, for example. Excess oxygen can move inside a film or a layer. Excess oxygen moves between atoms in a film or a layer or excess oxygen replace oxygen that is a constituent of a film or a layer and moves like a billiard ball. An insulating film containing excess oxygen means an insulating film from which oxygen is released by heat treatment, for example.

<On-State Current of Transistor Having Multilayer Film>

In a transistor having a multilayer film including an oxide semiconductor layer, calculation was performed to examine the relation between an on-state current (Ion) and physical properties or thickness of each layer.

FIG. 1A illustrates a cross-sectional schematic view of a transistor used for the calculation. The transistor includes a base insulating film (BI), an oxide semiconductor layer (S1) over the base insulating film (BI), an oxide semiconductor layer (S2) over the oxide semiconductor layer (S1), a source electrode (SE) and a drain electrode (DE) over the oxide semiconductor layer (S2), an oxide semiconductor layer (S3) over the oxide semiconductor layer (S2) and the source electrode (SE) and the drain electrode (DE), a gate insulating film (GI) over the oxide semiconductor layer (S3), and a gate electrode (GE) over the gate insulating film (GI). Note that the oxide semiconductor layer (S2) includes n-type regions in regions in contact with the source electrode (SE) and the drain electrode (DE).

Here, the oxide semiconductor layer (S1), the oxide semiconductor layer (S2), and the oxide semiconductor layer (S3) are collectively referred to as a multilayer film.

In the calculation, the values given below were used. The base insulating film (BI) was assumed to be a silicon oxynitride film with a thickness set to 300 nm and a relative dielectric constant set to 4.1.

The oxide semiconductor layer (S1) was assumed to be an In—Ga—Zn oxide having a high atomic ratio of Ga with a thickness set to 20 nm, a relative dielectric constant set to 15, an electron affinity set under three conditions (4.2 eV, 4.3 eV, and 4.4 eV), an energy gap set to 3.6 eV, a donor density set to $1\times10^{-9}/cm^3$, an electron mobility set to 0.1 $cm^2/Vs$, and a hole mobility set to 0.01 $cm^2/Vs$. The electron affinity refers to a difference between energy at the vacuum level and energy at a bottom of a conduction band (Ec).

The oxide semiconductor layer (S2) was assumed to be an In—Ga—Zn oxide having an atomic ratio of In as high as that of Ga with a thickness set to 15 nm, a relative dielectric constant set to 15, an electron affinity set to 4.6 eV, an energy gap set to 3.2 eV, a donor density set to $1\times10^{-9}/cm^3$, an electron mobility set to 10 $cm^2/Vs$, and a hole mobility set to 0.01 $cm^2/Vs$. Further, the donor density of the n-type region was $5\times10^{18}/cm^3$.

The oxide semiconductor layer (S3) was assumed to be an In—Ga—Zn oxide having a high atomic ratio of Ga with a thickness set under seven conditions (0 nm, 5 nm, 10 nm, 20 nm, 30 nm, 40 nm, and 50 nm), a relative dielectric constant set to 15, an electron affinity set under three conditions (4.2 eV, 4.3 eV, and 4.4 eV), an energy gap set to 3.6 eV, a donor density set to $1\times10^{-9}/cm^3$, an electron mobility set to 0.1 $cm^2/Vs$, and a hole mobility set to 0.01 $cm^2/Vs$. Note that the oxide semiconductor layer (S1) and the oxide semiconductor layer (S3) had the same electron affinity.

The gate insulating film (GI) was assumed to be a silicon oxynitride film with a thickness set under three conditions (10 nm, 20 nm, and 30 nm) and a relative dielectric constant set to 4.1.

The gate electrode (GE) was assumed to be a tungsten film with a work function set to 5.0 eV.

The channel length and the channel width of the transistor were each 0.8 μm. Note that a region of the oxide semiconductor layer (S2) where a channel is formed corresponds to a region which is overlapped with the gate electrode (GE) and which is between the source electrode (SE) and the drain electrode (DE) when seen from the above. Thus, when seen from the above, the channel length of the transistor corresponds to a distance between the source electrode (SE) and the drain electrode (DE) When seen from the above, the channel width of the transistor corresponds to a length perpendicular to that of a channel formation region in a channel length direction.

Figure 1B:
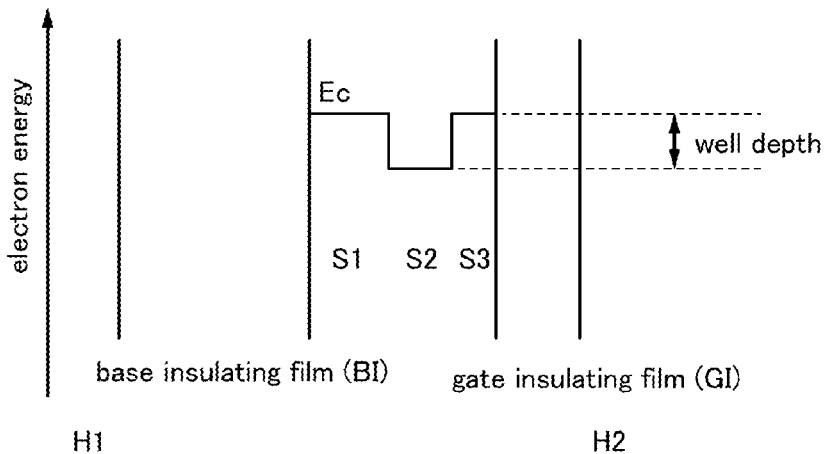
FIG. 1B is a diagram illustrating the band structure of the transistor.

The transistor whose cross section is illustrated in FIG. 1A has a band structure shown in FIG. 1B along dashed-dotted line H1-H2 obtained from the relations of electron affinities of the oxide semiconductor layer (S1), the oxide semiconductor layer (S2), and the oxide semiconductor layer (S3). Here, a well is formed in the oxide semiconductor layer (S2). A difference in electron affinity between the oxide semiconductor layer (S2), and each of the oxide semiconductor layer (S1) and the oxide semiconductor layer (S3) (such a difference corresponds to a difference in energy between the bottoms of the conduction bands) is called a well depth.

The electron affinity of the oxide semiconductor layer (S2) is 4.6 eV. Therefore, when the electron affinities of the oxide semiconductor layer (S1) and the oxide semiconductor layer (S3) are each 4.2 eV, 4.3 eV, or 4.4 eV, the well depth is 0.4 eV, 0.3 eV, or 0.2 eV, respectively.

In general, DOS is formed at an interface between a semiconductor layer and a base insulating film, an interface between the semiconductor layer and a gate insulating film, or the like. Whereas, in some cases, DOS decreases on-state current or reliability, a channel can be formed in the well, which is the oxide semiconductor layer (S2) in the multilayer film, of the transistor in FIG. 1A. In that case, the influences from the interface between the base insulating film (BI) and the oxide semiconductor layer (S1) and the interface between the oxide semiconductor layer (S3) and the gate insulating film (GI) become relatively smaller; thus, in some cases, a decrease in on-state current or reliability can be suppressed.

The calculation was performed using device simulation software "ATLAS" produced by Silvaco Inc under the above conditions. Note that the calculation was performed under the assumption of an ideal situation. For example, the calculation was performed in the case where DOS was not provided on the interface between the base insulating film (BI) and the oxide semiconductor layer (S1), the interface between the oxide semiconductor layer (S3) and the gate insulating film (GI), or the like. That is, the calculation was performed not to demonstrate the effect of the well formed in the multilayer film but to demonstrate the relation between an on-state current (Ion) and physical properties or thickness of each layer.

Figure 2:
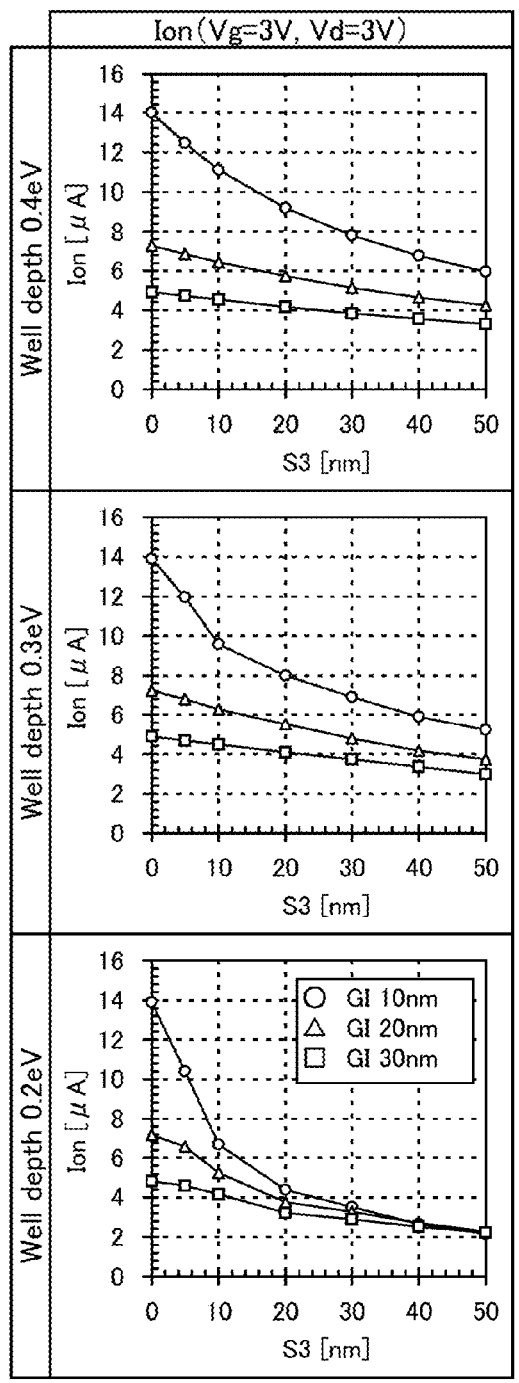
FIG. 2 is graphs each showing a relation between a structure of a multilayer film and on-state current.

FIG. 2 is graphs on which the values of on-state current (Ion) are plotted with respect to the thicknesses of the oxide semiconductor layer (S3). Note that the on-state current is a drain current Id when the gate voltage Vg is 3 V and the drain voltage Vd is 3V. In FIG. 2, the plots of the values of on-state current when the well depths are 0.4 eV, 0.3 eV, and 0.2 eV are shown in the top graph, the middle graph, and the bottom graph, respectively. In each case, white circles are plots of the on-state current value in the case where the thickness of the gate insulating film (GI) was 10 nm, white triangles are plots of the on-state current value in the case where the thickness of the gate insulating film (GI) was 20 nm, and white squares are plots of the on-state current value in the case where the thickness of the gate insulating film (GI) was 30 nm.

According to FIG. 2, there were the following findings. On-state current became lower as the thickness of the oxide semiconductor layer S3 got smaller. The on-state current became extremely lower with respect to the thickness of the oxide semiconductor layer (S3) as the well depth got smaller. Further, on-state current became lower as the thickness of the gate insulating film (GI) got larger.

In the case where the channel is formed only in the oxide semiconductor layer (S2) including interfaces thereof, the oxide semiconductor layer (S3) can function as part of the gate insulating film. Note that it is known that the on-state current of a transistor is proportional to the capacitance of a gate insulating film.

Figure 3:
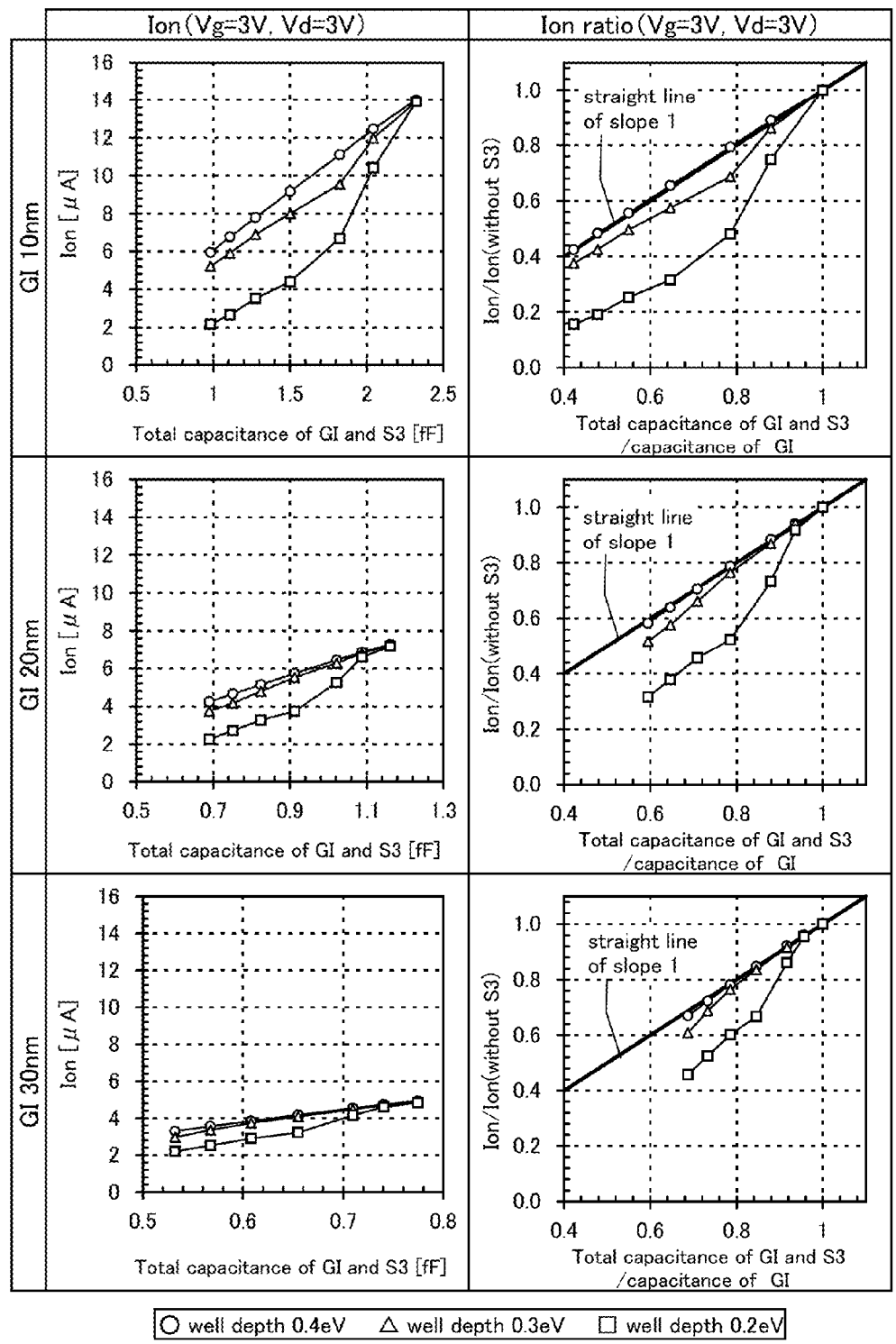
FIG. 3 is graphs each showing a relation between a structure of a multilayer film and on-state current.

Left graphs of FIG. 3 are graphs plotting data, where the horizontal axis represents total capacitance of the oxide semiconductor layer (S3) and the gate insulating film (GI), and the vertical axis represents on-state current of the transistors. Right graphs of FIG. 3 are graphs plotting data, where the horizontal axis represents a value obtained by dividing the total capacitance of the oxide semiconductor layer (S3) and the gate insulating film (GI) by the capacitance of the gate insulating film (GI) (such value corresponds to normalized capacitance), and the vertical axis represents values obtained by dividing the on-state currents of the transistors by the on-state currents in the case without the oxide semiconductor layer (S3) (0 nm) (such a value corresponds to a normalized on-state current or an Ion ratio).

In each of the right graphs of FIG. 3, there is a straight line having a slope of 1. In the case where the oxide semiconductor layer (S3) functions as part of the gate insulating film, the normalized capacitance and the normalized on-state current are ideally plotted on the straight line having a slope of 1. However, some plots in the case where the well depth is 0.3 eV and some plots in the case where the well depth is 0.2 eV are positioned below the straight line having a slope of 1. This is probably because the oxide semiconductor layer (S3) does not function as a gate insulating film.

That is, depending on the condition, electrons were induced to the oxide semiconductor layer (S3) by the electric field of the gate electrode (GE) and the electron density of the oxide semiconductor layer (S3) was increased, which resulted in the block of the electric field of the gate electrode (GE). Consequently, it is probable that the electric field applied to the oxide semiconductor layer (S2) was weakened and the on-state current of the transistor was decreased.

Thus, calculation results of current density and electron density at the interface between the oxide semiconductor layer (S2) and the oxide semiconductor layer (S3) (S2\S3 interface) or the interface between the oxide semiconductor layer (S3) and the gate insulating film (GI) (S3\GI interface) are described next.

Figure 4:
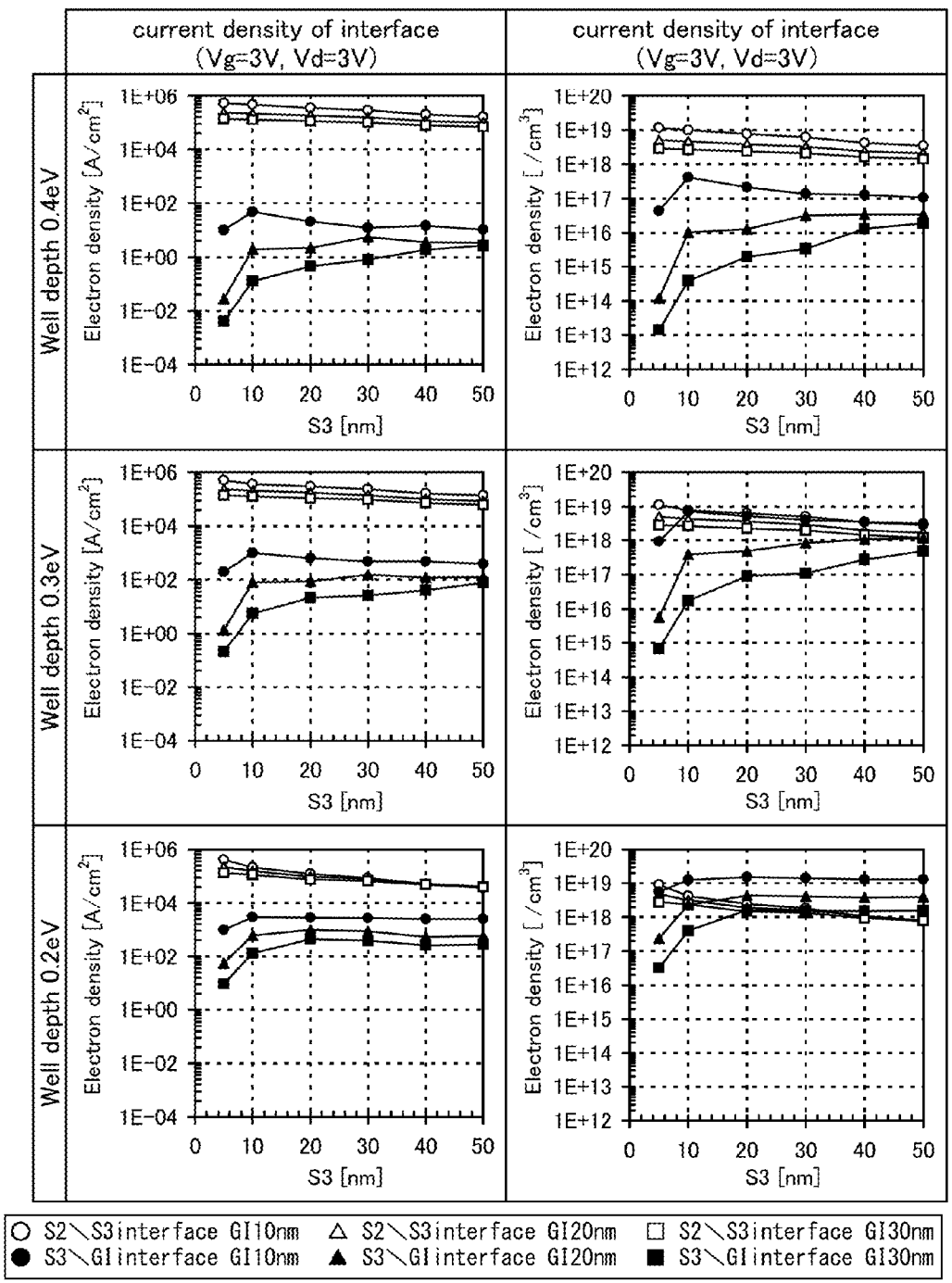
FIG. 4 is graphs each showing a relation between a structure of a multilayer film and current density, and a relation between the structure of the multilayer film and electron density.

Left graphs of FIG. 4 are graphs on which the values of current density are plotted with respect to the thickness of the oxide semiconductor layer (S3). Note that the current density is a current density when the gate voltage Vg is 3 V and the drain voltage Vd is 3 V. White circles, white triangles, and white squares are plots of the S2\S3 interface, and black circles, black triangles, and black squares are plots of the S3\GI interface. In the left graphs of FIG. 4, the plots of the values of current density when the well depths are 0.4 eV, 0.3 eV, and 0.2 eV are shown in the top graph, the middle graph, and the bottom graph, respectively. In each case, the circles are plots of the current density value in the case where the thickness of the gate insulating film (GI) was 10 nm, the triangles are plots of the current density value in the case where the thickness of the gate insulating film (GI) was 20 nm, and the squares are plots of the current density value in the case where the thickness of the gate insulating film (GI) was 30 nm.

According to the left graphs of FIG. 4, the current density at the S2\S3 interface was higher than the current density at the S3\GI interface under any conditions. Thus, this result showed that the channel of the transistor was formed at the S2\S3 interface.

Note that in this calculation, it is estimated that the electron mobility of the oxide semiconductor layer (S3) is lower than the electron mobility of the oxide semiconductor layer (S2). Therefore, it is probable that the channel was formed at the S2\S3 interface because of a difference between the oxide semiconductor layer (S3) and the oxide semiconductor layer (S2) in electron mobility.

Right graphs of FIG. 4 are graphs on which the values of current density are plotted with respect to the thickness of the oxide semiconductor layer (S3). Note that the electron density is an electron density when the gate voltage Vg is 3 V and the drain voltage Vd is 3 V. White circles, white triangles, and white squares are plots of the S2\S3 interface, and black circles, black triangles, and black squares are plots of the S3\GI interface. In the right graphs of FIG. 4, the plots of the values of electron density when the well depths are 0.4 eV, 0.3 eV, and 0.2 eV are shown in the top graph, the middle graph, and the bottom graph, respectively. In each case, the circles are plots of the electron density value in the case where the thickness of the gate insulating film (GI) was 10 nm, the triangles are plots of the electron density value in the case where the thickness of the gate insulating film (GI) was 20 nm, and the squares are plots of the electron density value in the case where the thickness of the gate insulating film (GI) was 30 nm.

According to the right graphs of FIG. 4, the electron density at the S2\S3 interface was the same as or higher than the electron density at the S3\GI interface under some conditions. That is, this result showed that, in some cases, many electrons are induced to the oxide semiconductor layer (S3) by the electric field of the gate electrode (GE). In the case where many electrons were induced to the oxide semiconductor layer (S3), the electric field of the gate electrode (GE) was blocked with the oxide semiconductor layer (S3) whose electron density were increased. Consequently, it is probable that the electric field applied to the oxide semiconductor layer (S2) was weakened and the on-state current of the transistor was decreased.

Specifically, in the case where the well depth was 0.2 eV and the thickness of the gate insulating film (GI) was 10 nm, the electron density at the S3\GI interface was greater than or equal to $1\times10^{18}/cm^3$ regardless of the thickness of the oxide semiconductor layer (S3) (in the range of 5 nm to 50 nm). In the case where the well depth was 0.2 eV and the thickness of the gate insulating film (GI) was 20 nm, the electron density at the S3\GI interface was greater than or equal to $1\times10^{18}/cm^3$ when the thickness of the oxide semiconductor layer (S3) was greater than or equal to 10 nm and less than or equal to 50 nm. In the case where the well depth was 0.2 eV and the thickness of the gate insulating film (GI) was 30 nm, the electron density at the S3\GI interface was greater than or equal to $1\times10^{18}/cm^3$ when the thickness of the oxide semiconductor layer (S3) was greater than or equal to 20 nm and less than or equal to 50 nm.

In the case where the well depth was 0.3 eV and the thickness of the gate insulating film (GI) was 10 nm, the electron density at the S3\GI interface was greater than or equal to $1\times10^{18}/cm^3$ when the thickness of the oxide semiconductor layer (S3) was greater than or equal to 10 nm and less than or equal to 50 nm. In the case where the well depth was 0.3 eV and the thickness of the gate insulating film (GI) was 20 nm, the electron density at the S3\GI interface was greater than or equal to $1\times10^{18}/cm^3$ when the thickness of the oxide semiconductor layer (S3) was greater than or equal to 40 nm and less than or equal to 50 nm. In the case where the well depth was 0.3 eV and the thickness of the gate insulating film (GI) was 30 nm, the electron density at the S3\GI interface was less than $1\times10^{18}/cm^3$ regardless of the thickness of the oxide semiconductor layer (S3) (in the range of 5 nm to 50 nm).

In the case where the well depth was 0.4 eV, the electron density at the S2\S3 interface was less than $1\times10^{18}/cm^3$ under any conditions.

The above results showed that the oxide semiconductor layer (S3) causes a decrease in the on-state current of the transistor under some conditions.

Thus, this indicates that it is preferable to select each layer under a condition that does not decrease the on-state current of the transistor.

Specifically, in the case where the well depth was 0.2 eV and the thickness of the gate insulating film (GI) was 20 nm, the thickness of the oxide semiconductor layer (S3) may be set to be smaller than 10 nm (or smaller than or equal to 5 nm). In the case where the well depth was 0.2 eV and the thickness of the gate insulating film (GI) was 30 nm, the thickness of the oxide semiconductor layer (S3) may be set to be smaller than 20 nm (or smaller than or equal to 10 nm).

In the case where the well depth was 0.3 eV and the thickness of the gate insulating film (GI) was 10 nm, the thickness of the oxide semiconductor layer (S3) may be set to be smaller than 10 nm (or smaller than or equal to 5 nm). In the case where the well depth was 0.3 eV and the thickness of the gate insulating film (GI) was 20 nm, the thickness of the oxide semiconductor layer (S3) may be set to be smaller than 40 nm (or smaller than or equal to 30 nm).

Alternatively, the well depth may be greater than or equal to 0.4 eV.

<Structure of Transistor with Less Deterioration Due to DOS>

As described above, in the transistor including an oxide semiconductor layer, DOS is likely to be formed at the interface between the oxide semiconductor layer and an insulating film. In addition, when the formed DOS traps charges, it causes the threshold voltage of the transistor to be shifted.

For example, by employing a structure of a transistor having a multilayer film, a channel can be separated from DOS; however, the DOS itself cannot be eliminated completely. A model of deterioration where DOS shifts the threshold voltage of the transistor is considered. Further, a structure in which the shift in the threshold voltage is reduced is also considered.

Figure 5A:
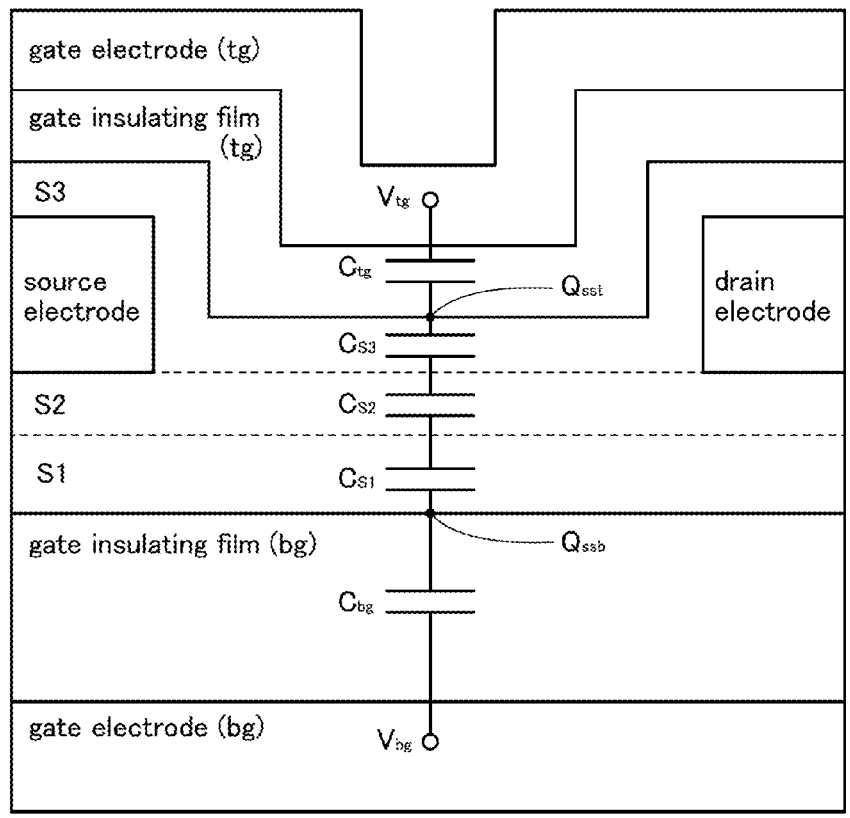
FIG. 5A is a cross-sectional view of a transistor.

FIG. 5A is an example of a cross-sectional view of the transistor including an oxide semiconductor layer. The transistor illustrated in FIG. 5A includes a gate electrode (bg), a gate insulating film (bg) over the gate electrode (bg), an oxide semiconductor layer (S1) over the gate insulating film (bg), an oxide semiconductor layer (S2) over the oxide semiconductor layer (S1), a source electrode and a drain electrode over the oxide semiconductor layer (S2), an oxide semiconductor layer (S3) over the oxide semiconductor layer (S2) and the source electrode and the drain electrode, a gate insulating film (tg) over the oxide semiconductor layer (S3), and a gate electrode (tg) over the gate insulating film (tg). Note that the transistor illustrated in FIG. 5A includes the gate electrode (bg) for easy understanding, but the deterioration model described below can be applied to a transistor without the gate electrode (bg). In addition, when the transistor does not include the gate electrode (bg), the gate insulating film (bg) serves as a base insulating film.

Here, the oxide semiconductor layer (S1) and the oxide semiconductor layer (S3) include, for example, at least one metal element, preferably at least two metal elements, further preferably at least three metal elements of metal elements contained in the oxide semiconductor layer (S2). In addition, the gate insulating film (bg) does not include any of the metal elements contained in the oxide semiconductor layer (S1), for example. In addition, the gate insulating film (tg) does not include any of the metal elements contained in the oxide semiconductor layer (S3), for example.

The interface between the gate insulating film (bg) and the oxide semiconductor layer (S1) is a bonding interface between different substances, so that the DOS is increased. In addition, the interface between the gate insulating film (tg) and the oxide semiconductor layer (S3) is a bonding interface between different substances, so that the DOS is increased. On the other hand, the interface between the oxide semiconductor layer (S1) and the oxide semiconductor layer (S2) is a bonding interface between the same types of substances, so that the DOS is decreased. In addition, the interface between the oxide semiconductor layer (S3) and the oxide semiconductor layer (S2) is a bonding interface between the same types of substances, so that the DOS is decreased.

The DOS at the interface between the gate insulating film (bg) and the oxide semiconductor layer (S1) is assumed to be a charge trap. Further, the DOS at the interface between the gate insulating film (tg) and the oxide semiconductor layer (S3) is assumed to be a charge trap. In addition, when it is assumed that a charge trapped in the DOS has an extremely long charge relaxation time, the charge might shift the threshold voltage of the transistor. A charge can be trapped in the DOS, resulting from an operation stress of the transistor.

Here, the charge trapped in the DOS at the interface between the gate insulating film (bg) and the oxide semiconductor layer (S1) is referred to as $Q_{ssb}$. The charge trapped in the DOS at the interface between the gate insulating film (tg) and the oxide semiconductor layer (S3) is referred to as $Q_{sst}$. It is verified below that $Q_{ssb}$ and $Q_{sst}$ shift the threshold voltage of the transistor.

Note that the potential of the gate electrode (bg) is fixed, for example. Accordingly, the transistor is controlled to be turned on or off, for example, by the gate electrode (tg). FIG. 5A illustrates the state where the gate electrode (bg) and the gate insulating film (bg) are provided, as an non-limiting example. As the gate electrode (bg), a conductive layer, a semiconductor layer, or a semiconductor layer (e.g., a p-type semiconductor or an n-type semiconductor) supplied with an impurity may be provided. In addition, the gate electrode (bg) does not necessarily function as a gate electrode. The gate insulating film (bg) does not necessarily function as a gate insulating film.

Figure 5B:
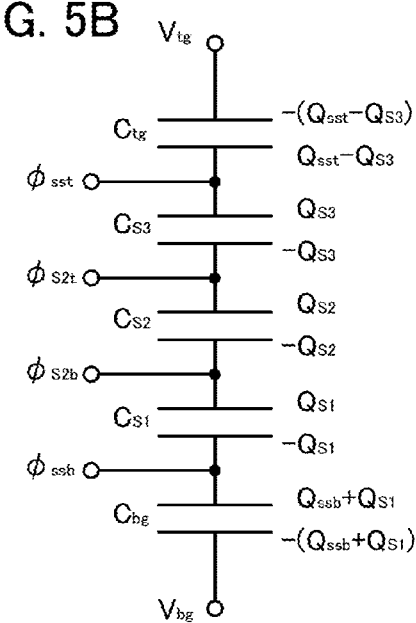
FIG. 5B is a diagram illustrating an equivalent circuit of the transistor.

FIG. 5B is an equivalent circuit of a stacked-layer structure up to the gate electrode (tg) from the gate electrode (bg) in the transistor in FIG. 5A. The capacitance of the gate insulating film (bg) is referred to as $C_{bg}$, the capacitance of the oxide semiconductor layer (S1) is referred to as $C_{S1}$, the capacitance of the oxide semiconductor layer (S2) is referred to as $C_{S2}$, the capacitance of the oxide semiconductor layer (S3) is referred to as $C_{S3}$, and the capacitance of the gate insulating film (tg) is referred to as $C_{tg}$. As illustrated in FIG. 5B, the stacked-layer structure up to the gate electrode (tg) from the gate electrode (bg) in the transistor in FIG. 5A can be illustrated as an equivalent circuit having a capacitor where components between the gate electrode (bg) and the gate electrode (tg), i.e., the gate insulating film (bg), the oxide semiconductor layer (S1), the oxide semiconductor layer (S2), the oxide semiconductor layer (S3), and the gate insulating film (tg) are connected in series.

The potential of the gate electrode (bg) is $V_{bg}$ and the potential of the gate electrode (tg) is $V_{tg}$. The potential of the interface between the gate insulating film (bg) and the oxide semiconductor layer (S1) is $\phi_{ssb}$, the potential of the interface between the oxide semiconductor layer (S1) and the oxide semiconductor layer (S2) is $\phi_{S2b}$, the potential of the interface between the oxide semiconductor layer (S2) and the oxide semiconductor layer (S3) is $\phi_{S2t}$, and the potential of the interface between the oxide semiconductor layer (S3) and the gate insulating film (tg) is $\phi_{sst}$.

The gate insulating film (bg) has a charge $-(Q_{ssb}+Q_{S1})$ on the gate electrode (bg) side, and a charge $Q_{ssb}+Q_{S1}$ on the oxide layer (S1) side. The oxide semiconductor layer (S1) has a charge $-Q_{S1}$ on the gate insulating film (bg) side, and a charge $Q_{S1}$ on the oxide semiconductor layer (S2) side. The oxide semiconductor layer (S2) has a charge $-Q_{S2}$ on the oxide semiconductor layer (S1) side, and a charge $Q_{S2}$ on the oxide semiconductor layer (S3) side. The oxide semiconductor layer (S3) has a charge $-Q_{S3}$ on the oxide semiconductor layer (S2) side, and has a charge $Q_{S3}$ on the gate insulating film (tg) side. The gate insulating film (tg) has a charge $Q_{sst}-Q_{S3}$ on the oxide semiconductor layer (S3) side, and has a charge $-(Q_{sst}-Q_{S3})$ on the gate electrode (tg) side.

The relations between capacitances and charges are expressed below. Note that the oxide semiconductor layer (S1) and the oxide semiconductor layer (S3) are assumed to be insulators.

In the gate insulating film (tg), the relation between a capacitance and a charge is expressed by Formula (1).

$$C_{tg}[(V_{tg}-V_{fbt})-\phi_{sst}]=-(Q_{sst}-Q_{S3}) \quad \text{[Formula 1]}$$

In the oxide semiconductor layer (S3), the relation between a capacitance and a charge is expressed by Formula (2).

$$C_{S3}(\phi_{sst}-\phi_{S2t})=Q_{S3} \quad \text{[Formula 2]}$$

In the oxide semiconductor layer (S2), the relation between a capacitance and a charge is expressed by Formula (3).

$$C_{S2}(\phi_{S2t}-\phi_{S2b})=Q_{S2} \quad \text{[Formula 3]}$$

In the oxide semiconductor layer (S1), the relation between a capacitance and a charge is expressed by Formula (4).

$$C_{S1}(\phi_{S2b}-\phi_{ssb})=Q_{S1} \quad \text{[Formula 4]}$$

In the gate insulating film (bg), the relation between a capacitance and a charge is expressed by Formula (5).

$$C_{bg}[\phi_{ssb}-(V_{bg}-V_{fbb})]=Q_{ssb}+Q_{S1} \quad \text{[Formula 5]}$$

Next, Formula (6) is obtained by eliminating $\phi_{sst}$ from Formula (1) and Formula (2). Note that $V_{fbt}$ is a flat band voltage.

$$(V_{tg}-V_{fbt})-\phi_{S2t}+\frac{Q_{sst}}{C_{tg}}=\left(\frac{1}{C_{tg}}+\frac{1}{C_{S3}}\right)Q_{S3} \quad \text{[Formula 6]}$$

In addition, Formula (7) is obtained by eliminating $\phi_{ssb}$ from Formula (4) and Formula (5). Note that $V_{fbb}$ is a flat band voltage.

$$\phi_{S2b}-(V_{bg}-V_{fbb})-\frac{Q_{ssb}}{C_{bg}}=\left(\frac{1}{C_{bg}}+\frac{1}{C_{S1}}\right)Q_{S1} \quad \text{[Formula 7]}$$

The whole oxide semiconductor layer (S2) is assumed to be depleted. In other words, $\phi(x)<0$ is satisfied when $0<x<t_{S2}$ where $t_{S2}$ is a thickness of the oxide semiconductor layer (S2). At this time, Poisson's equation in the oxide semiconductor layer (S2) is expressed by Formula (8).

$$\frac{d^2\phi}{dx^2}=-\frac{e(N_D-n)}{\varepsilon_{S2}} \quad \text{[Formula 8]}$$

In Formula (8), e is an elementary charge, $N_D$ is a donor density of the oxide semiconductor layer (S2), n is an electron density of the oxide semiconductor layer (S2), and $\varepsilon_{S2}$ is a dielectric constant of the oxide semiconductor layer (S2).

When the whole oxide semiconductor layer (S2) is depleted, Formula (8) can be approximated to Formula (9) because of $N_D \gg n$.

$$\frac{d^2\phi}{dx^2}=-\frac{eN_D}{\varepsilon_{S2}} \quad \text{[Formula 9]}$$

Next, Formula (9) is modified into Formula (10) and Formula (11) where E(x) is an electric field in a film-thickness direction and $k_1$ and $k_2$ are undetermined coefficients.

$$\phi(x)=-\frac{eN_D}{2\varepsilon_{S2}}x^2+k_1 x+k_2 \quad \text{[Formula 10]}$$

$$E(x)=-\frac{d\phi}{dx}=\frac{eN_D}{\varepsilon_{S2}}x-k_1 \quad \text{[Formula 11]}$$

Under boundary conditions $\phi(0)=\phi_{S2t}$ and $\phi(t_{S2})=\phi_{S2b}$, $k_1$ and $k_2$ are obtained as expressed in Formula (12) and Formula (13) from Formula (10) and Formula (11).

$$k_1=\frac{\phi_{S2b}-\phi_{S2t}}{t_{S2}}+\frac{eN_D t_{S2}}{2\varepsilon_{S2}} \quad \text{[Formula 12]}$$

$$k_2=\phi_{S2t} \quad \text{[Formula 13]}$$

In addition, based on Gauss's law, a surface charge density is expressed by Formula (14) and Formula (15).

$$Q_{S3} = \epsilon_{S2} E(0) \qquad \text{[Formula 14]}$$

$$Q_{S1} = \epsilon_{S2} E(t_{S2}) \qquad \text{[Formula 15]}$$

Accordingly, $Q_{S3}$ and $Q_{S1}$ are obtained as expressed by Formula (16) and Formula (17).

$$Q_{S3} = C_{S2}(\phi_{S2t} - \phi_{S2b}) - \frac{eN_D t_{S2}}{2} \qquad \text{[Formula 16]}$$

$$Q_{S1} = C_{S2}(\phi_{S2t} - \phi_{S2b}) + \frac{eN_D t_{S2}}{2} \qquad \text{[Formula 17]}$$

Formula (18) and Formula (19) are obtained by substituting Formula (16) and Formula (17) into Formula (6) and Formula (7).

$$(V_{tg} - V_{fbt}) + \frac{Q_{sst}}{C_{tg}} = \left[\left(\frac{1}{C_{tg}} + \frac{1}{C_{S3}}\right)C_{S2} + 1\right]\phi_{S2t} - \qquad \text{[Formula 18]}$$
$$\left(\frac{1}{C_{tg}} + \frac{1}{C_{S3}}\right)\left(C_{S2}\phi_{S2b} + \frac{eN_D t_{S2}}{2}\right)$$

$$(V_{bg} - V_{fbb}) + \frac{Q_{ssb}}{C_{bg}} = -\left(\frac{1}{C_{bg}} + \frac{1}{C_{S1}}\right) \qquad \text{[Formula 19]}$$
$$\left(C_{S2}\phi_{S2t} + \frac{eN_D t_{S2}}{2}\right) + \left[\left(\frac{1}{C_{bg}} + \frac{1}{C_{S1}}\right)C_{S2} + 1\right]\phi_{S2b}$$

Here, when a channel of a transistor is assumed to be formed at the side of the interface between the oxide semiconductor layer (S1) and the oxide semiconductor layer (S2), the threshold voltage $V_{th}$ is $V_{tg}$ when $\phi_{S2b}=0$. Therefore, Formula (18) and Formula (19) are calculated as simultaneous equations and $\phi_{S2t}$ is eliminated, so that the threshold voltage $V_{th}$ is obtained as expressed in Formula (20).

$$V_{th} = V_{fbt} - \frac{Q_{sst}}{C_{tg}} - \qquad \text{[Formula 20]}$$
$$\left(\frac{1}{C_{tg}} + \frac{1}{C_{S1}} + \frac{1}{C_{S2}}\right)\frac{C_{S1}}{C_{bg} + C_{S1}}[Q_{ssb} + C_{bg}(V_{bg} - V_{fbb})] -$$
$$\left(\frac{1}{C_{tg}} + \frac{1}{C_{S3}} + \frac{1}{2C_{S2}}\right)eN_D t_{S2}$$

Accordingly, the shift amount $\Delta V_{th}$ in the threshold voltage $V_{th}$ due to the charge $Q_{sst}$ and the charge $Q_{ssb}$ is expressed in Formula (21).

$$\Delta V_{th} = -\frac{Q_{sst}}{C_{tg}} - \left(\frac{1}{C_{tg}} + \frac{1}{C_{S3}} + \frac{1}{C_{S2}}\right)\frac{C_{S1}}{C_{bg} + C_{S1}} Q_{ssb} \qquad \text{[Formula 21]}$$

According to the above formula, $Q_{ssb}$ contributes less to $\Delta V_{th}$ by increasing $C_{S3}$ (e.g., the thickness of the oxide semiconductor layer (S3) is reduced). $Q_{ssb}$ contributes less to $\Delta V_{th}$ by increasing $C_{S2}$ (e.g., the thickness of the oxide semiconductor layer (S2) is reduced). $Q_{ssb}$ contributes less to $\Delta V_{th}$ by decreasing $C_{S1}$ (e.g., the thickness of the oxide semiconductor layer (S1) is increased).

In addition, by increasing $C_{tg}$ (the thickness of the gate insulating film (tg) is reduced), $Q_{ssb}$ contributes less to $\Delta V_{th}$. By increasing $C_{bg}$ (the thickness of the gate insulating film (bg) is reduced), $Q_{ssb}$ contributes less to $\Delta V_{th}$.

On the other hand, $C_{S3}$, $C_{S2}$, and $C_{S1}$ do not contribute to $Q_{sst}$. In addition, by increasing $C_{tg}$ (reducing the thickness of the gate insulating film (tg)), $Q_{sst}$ contributes less to $\Delta V_{th}$.

Therefore, the oxide semiconductor layer (S3) should be thinned so that the shift amount in the threshold voltage due to DOS can be reduced in the transistor illustrated in FIG. 5A. Alternatively, the oxide semiconductor layer (S2) should be thinned. Alternatively, the oxide semiconductor layer (S1) should be thickened. Alternatively, the gate insulating film (tg) should be thinned. Alternatively, the gate insulating film (bg) should be thinned.

Figure 6A:
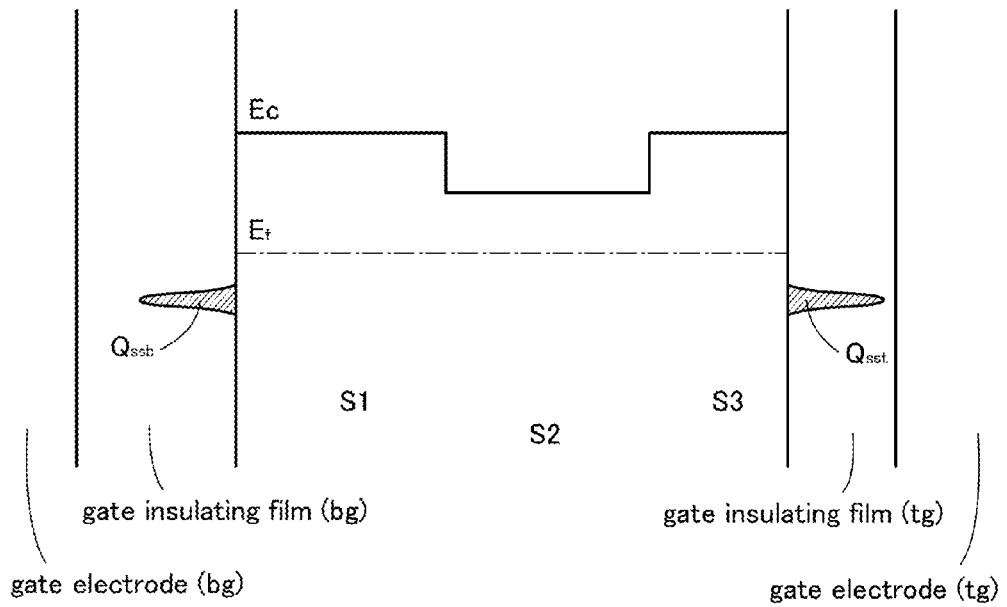
FIGS. 6A and 6B each illustrate a band structure.

Further, the channel of the transistor is formed in the oxide semiconductor layer (S2). In other words, the oxide semiconductor layer (S1) and the oxide semiconductor layer (S3) have energy (Ec) at the bottom of the conduction band higher than that of the oxide semiconductor layer (S2). The band structure at this time of the transistor is illustrated in FIGS. 6A and 6B.

In the above-described model of deterioration, the potential of DOS at the interface between the gate insulating film (bg) and the oxide semiconductor layer (S1) and the potential of DOS at the interface between the gate insulating film (tg) and the oxide semiconductor layer (S3) are lower than the Fermi level. In this case, when the potentials of the gate electrode (bg) and the gate electrode (tg) are 0V, electrons are trapped in the DOS at the interface with the gate electrode (bg) and in the DOS at the interface with the gate electrode (tg), and a charge $Q_{ssb}$ and a charge $Q_{sst}$ are accumulated (see FIG. 6A).

On the other hand, when the transistor includes the oxide semiconductor layer (S1) and the oxide semiconductor layer (S3), the potentials of DOS at the interfaces are higher than Fermi level (are closer to energy at the bottom of the conduction band) as compared to the transistor not including the oxide semiconductor layer (S1) and the oxide semiconductor layer (S3) in some cases. When the potentials of DOS at the interfaces are higher than the Fermi level, electrons are not trapped in DOS at the interfaces and thus the charge $Q_{ssb}$ and the charge $Q_{sst}$ are not accumulated (see FIG. 6B). In addition, by application of voltage to the gate electrode (tg) or the like, charges are trapped in the DOS at the interfaces in some cases. The trapped charge is eliminated in a short relaxation time because the potential of DOS at each interface is close to energy at the bottom of the conduction band. Accordingly, the DOS at each interface hardly causes the shift in the threshold voltage of the transistor.

Figure 6B:
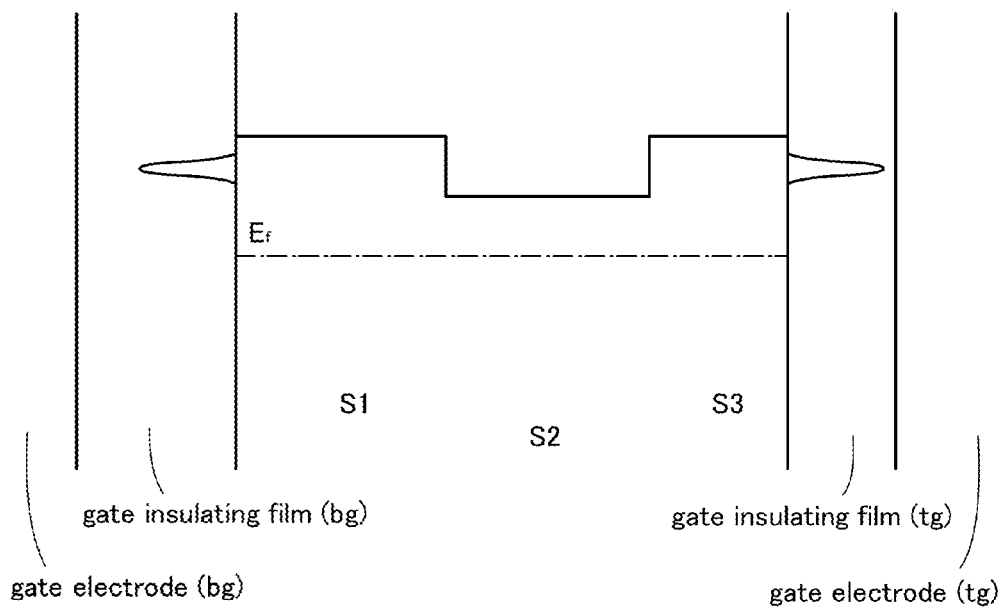

As illustrated in FIG. 6B, because of the magnitude relation between the potential of DOS at each interface and the Fermi level, the charge $Q_{sst}$ is not accumulated by formation of the oxide semiconductor layer (S3) in some cases. When the charge $Q_{sst}$ is not accumulated, the reliability of the transistor is high because the cause of deterioration does not exist.

Based on the model of deterioration is described the structure in which the shift amount in the threshold voltage is reduced in the transistor having the multilayer film. In order to reduce the shift amount in the threshold voltage due to DOS, the thickness of the oxide semiconductor layer near the gate electrode controlling on/off of the transistor should be reduced. In addition, the thickness of the oxide semiconductor layer far from the gate electrode controlling on/off of the transistor should be increased.

<Model of DOS in Oxide Semiconductor Layer and DOS-Causing Element>

As described above, when DOS is present inside an oxide semiconductor layer and in the vicinity of the interface between the oxide semiconductor layer and the outside, the DOS causes deterioration of a transistor including the oxide semiconductor layer. Thus, knowing the origin of DOS in an oxide semiconductor layer leads to knowing the deterioration of a transistor.

The DOS inside an oxide semiconductor layer and in the vicinity of the interface between the oxide semiconductor layer and the outside can be explained in terms of positions of and bonding between oxygen (O), oxygen vacancy (Vo), and hydrogen (H). A concept of our model is described.

A conclusion is that it is necessary to reduce oxygen vacancies and hydrogen to reduce DOS inside the oxide semiconductor layer and in the vicinity of the interface. It is explained below with a model why oxygen vacancies and hydrogen should be reduced for minimizing DOS inside an oxide semiconductor layer and in the vicinity of the interface.

Figure 7:
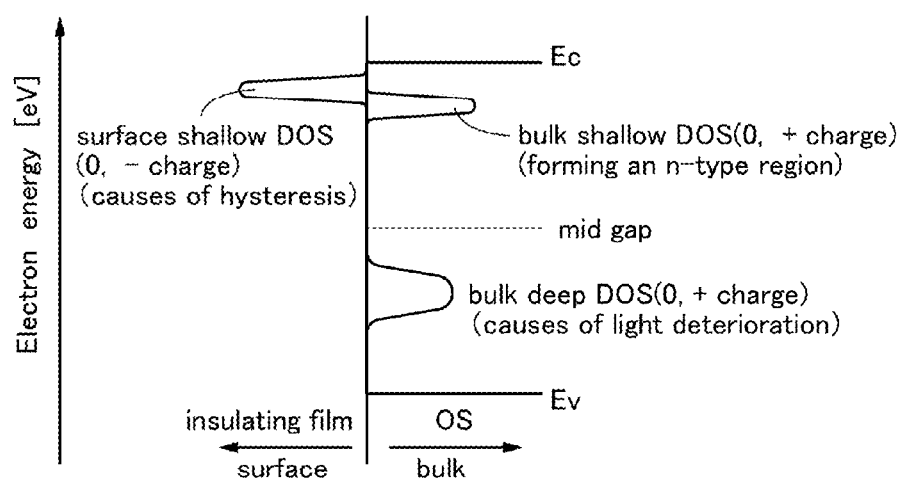
FIG. 7 illustrates a band structure of DOS inside an oxide semiconductor layer and in the vicinity of the interface of the oxide semiconductor layer.

FIG. 7 illustrates a band structure of DOS inside an oxide semiconductor layer and in the vicinity of the interface of the oxide semiconductor layer. DOS formed when the oxide semiconductor layer is an oxide semiconductor layer containing indium, gallium, and zinc is described below.

There are two types of DOS, DOS at a shallow level (shallow level DOS) and DOS at a deep level (deep level DOS). Note that in this specification, the shallow level DOS refers to DOS between energy at the bottom of the conduction band (Ec) and energy at the mid gap. Thus, for example, the shallow level DOS is located closer to energy at the bottom of the conduction band. Note that in this specification, the deep level DOS refers to DOS between energy at the top of the valence band (Ev) and energy at the mid gap. Thus, for example, the deep level DOS is located closer to energy at the mid gap than to energy at the top of the valence band.

Thus, considering DOS in an oxide semiconductor layer, there are two types of shallow level DOS. One is DOS in the vicinity of a surface of the oxide semiconductor layer (at the interface with an insulating film or in the vicinity of the interface with the insulating film), that is, surface shallow DOS. The other is DOS inside the oxide semiconductor layer, that is, bulk shallow DOS. Furthermore, as a type of the deep level DOS, there is DOS inside the oxide semiconductor layer, that is, bulk deep DOS.

These types of DOS are likely to act as described below. The surface shallow DOS in the vicinity of the surface of an oxide semiconductor layer is located at a shallow level from the bottom of the conduction band, and thus trapping and loss of a charge are likely to occur easily. The bulk shallow DOS inside the oxide semiconductor layer is located at a deep level from the bottom of the conduction band as compared to the surface shallow DOS in the vicinity of the surface of the oxide semiconductor layer, and thus loss of a charge does not easily occur.

An element causing DOS in an oxide semiconductor layer is described below.

For example, when a silicon oxide film is formed over an oxide semiconductor layer, in some cases, indium contained in the oxide semiconductor layer is taken into the silicon oxide film and replaces silicon to form a shallow level DOS.

For example, in the interface between the oxide semiconductor layer and the silicon oxide film, a bond between oxygen and indium contained in the oxide semiconductor layer is broken and a bond between the oxygen and silicon is generated. This is because the bonding energy between silicon and oxygen is higher than the bonding energy between indium and oxygen, and the valence of silicon (tetravalence) is larger than the valence of indium (trivalence). Oxygen contained in the oxide semiconductor layer is trapped by silicon, so that a site of oxygen that has been bonded to indium becomes an oxygen vacancy. In addition, this phenomenon occurs similarly when silicon is contained inside the oxide semiconductor layer, as well as in the surface. Such an oxygen vacancy forms a deep level DOS.

Another cause as well as silicon can break the bonding between indium and oxygen. For example, in an oxide semiconductor layer containing indium, gallium, and zinc, the bonding between indium and oxygen is weaker and cut more easily than the bonding between oxygen and gallium or zinc. For this reason, the bonding between indium and oxygen is broken by plasma damages or damages due to sputtering particles, so that an oxygen vacancy might be generated. The oxygen vacancy forms a deep level DOS. The deep level DOS can trap a hole and thus serve as a hole trap (hole trapping center). This means that the oxygen vacancy forms a bulk deep DOS inside the oxide semiconductor layer.

The deep level DOS formed by such oxygen vacancies is one of causes of formation of the surface shallow DOS in the vicinity of the surface of an oxide semiconductor layer or the bulk shallow DOS inside an oxide semiconductor layer because of hydrogen, as will be described below.

Such oxygen vacancies form DOS, and thus are an instability factor to the oxide semiconductor layer. In addition, an oxygen vacancy in the oxide semiconductor layer traps hydrogen to be metastable. In other words, when an oxygen vacancy that is in the deep level DOS and serves as a hole trap capable of capturing a hole traps hydrogen, a shallow level DOS is formed. As a result, the shallow level DOS can serve as an electron trap that can trap an electron or serve as a generator of an electron. In this manner, an oxygen vacancy traps hydrogen. However, an oxygen vacancy can be positively (neutrally or positively) charged or negatively (neutrally or negatively) charged, depending on a location of hydrogen in the oxide semiconductor layer. Thus, hydrogen might give an adverse effect on a transistor including the oxide semiconductor layer.

Figure 8:
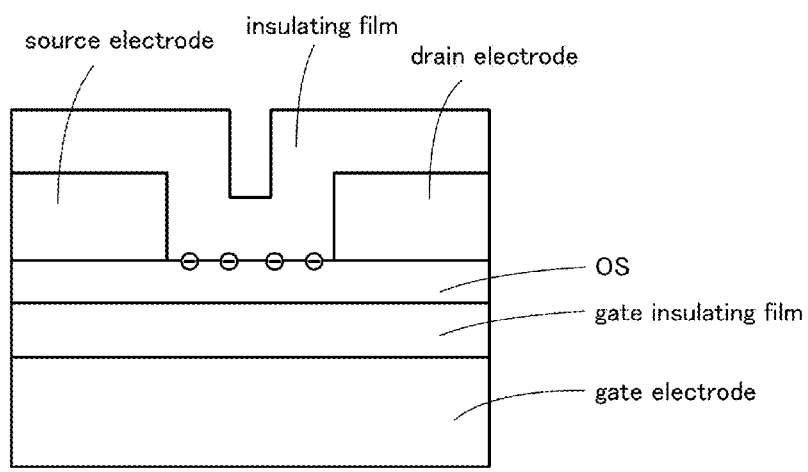
FIG. 8 is a cross-sectional schematic view of a transistor including an oxide semiconductor layer.

FIG. 8 is an example of a schematic cross-sectional view of a bottom-gate and top-contact transistor. An oxide semiconductor layer (OS) has a surface shallow DOS in the vicinity of the interface with an insulating film. An electron is trapped in the surface shallow DOS and the DOS is negatively charged. Thus, the surface shallow DOS causes the threshold voltage of the transistor to be shifted.

Therefore, it is important to reduce the density of oxygen vacancies so that the oxygen vacancies do not give an adverse effect on the transistor. The density of oxygen vacancies in the oxide semiconductor layer can be reduced in such a manner that excess oxygen is supplied to the oxide semiconductor layer, that is, oxygen vacancies are compensated with excess oxygen. The oxygen vacancies can be stable and electrically neutral by entry of excess oxygen. For example, when excess oxygen is supplied into the oxide semiconductor layer or an insulating film formed near the interface with the oxide semiconductor layer, the excess oxygen compensates for oxygen vacancies in the oxide semiconductor layer, thereby effectively eliminating or reducing oxygen vacancies in the oxide semiconductor layer.

As described above, the oxygen vacancy may become a metastable state or a stable state by hydrogen or oxygen. In the case where the concentration of hydrogen in the oxide semiconductor layer is high, more oxygen vacancies trap hydrogen. In addition, when hydrogen exists in an oxygen vacancy and excess oxygen is supplied, the excess oxygen has a function of removing hydrogen from the oxygen vacancy first. Thus, excess oxygen compensates for the oxygen vacancy after removing hydrogen. Accordingly, when the concentration of hydrogen in the oxide semiconductor layer is high, the number of the oxygen vacancies reduced by excess oxygen gets smaller. On the other hand, when the concentration of hydrogen in the oxide semiconductor layer is low, less hydrogen is trapped by oxygen vacancies. Therefore, by supplying excess oxygen, the density of oxygen vacancies can be greatly reduced.

As described above, an oxygen vacancy traps hydrogen and can be positively (neutrally or positively) charged or negatively (neutrally or negatively) charged, depending on the way how hydrogen is trapped. Here, the bulk shallow DOS inside an oxide semiconductor layer and the surface shallow DOS in the vicinity of the surface are considered. The fact that these types of shallow level DOS are charged neutrally or negatively, or neutrally or positively can be understood in consideration of only relative positions of hydrogen (a hydrogen bond), an oxygen vacancy, and oxygen. For example, inside the oxide semiconductor layer, hydrogen is trapped by an oxygen vacancy to form VoH, and it is charged neutrally or positively. In other words, $H^+ + e^-$ forms a bulk shallow DOS inside the oxide semiconductor layer to form an n-type region in the oxide semiconductor layer.

Hydrogen can be charged neutrally or negatively, as well as being charged neutrally or positively. In light of that, models of formation of the bulk shallow DOS inside the oxide semiconductor layer and the surface shallow DOS in the vicinity of the surface of the oxide semiconductor layer are provided as described below. Note that the symbol [ . . . ] in the models does not denote a bond or bonding and is used to be distinguished from the symbol [-] indicating an ionic bond.

Models where the bonding between oxygen and indium contained in the oxide semiconductor layer is broken, the bonding between the oxygen and silicon is formed, and hydrogen exists are shown in Table 1.

TABLE 1

| Model | Type of defect | |
|---|---|---|
| Model A | In . . . Vo | $H^{\delta-}\cdot O^{\delta+}$—Si |
| Model B | In . . . VoH$^{\delta-}$ | $O^{\delta-}$—Si |
| Model C | In . . . Vo | $H^{\delta+}$—$O^{\delta-}$—In |
| Model D | In . . . VoH$^{\delta-}$ | $O^{\delta-}$—In |

For example, Model A is a model where hydrogen and oxygen are bonded.

For example, Model B is a model where hydrogen is trapped by an oxygen vacancy.

The same applies to a model where silicon is replaced with indium. For example, Model C is a model where hydrogen and oxygen are bonded.

For example, Model D is a model where hydrogen is trapped by an oxygen vacancy.

Such four models A to D can be considered. With the models, either charging neutrally or positively or charging neutrally or negatively can be explained. Note that because the bonding with silicon is stronger than the bonding with indium, the probability of Model B is lower than that of Model D.

Accordingly, hydrogen is likely to be charged either positively or negatively depending on relative positions of hydrogen, an oxygen vacancy, and oxygen. In other words, an oxygen vacancy and hydrogen can form a positively-charged DOS or a negatively-charged DOS. The DOS can be charged positively or negatively depending on surroundings (electronegativity of an element existing peripherally).

<Model of Hysteresis Deterioration in Dark State of Transistor Including Oxide Semiconductor Layer>

A mechanism in deterioration of a transistor including an oxide semiconductor layer is described next. The transistor including an oxide semiconductor layer deteriorates differently depending on whether or not the transistor is irradiated with light. When the transistor is irradiated with light, deterioration is likely to result from the bulk deep DOS at the deep level inside the oxide semiconductor layer. When the transistor is not irradiated with light, deterioration is likely to result from the surface shallow DOS at the shallow level in the vicinity of the surface of the oxide semiconductor layer (at the interface with an insulating film or in the vicinity thereof).

Thus, a state where the transistor including an oxide semiconductor layer is not irradiated with light (dark state) is described. As for this state, the deterioration mechanism of the transistor can be explained on the basis of trapping and releasing of a charge by the surface shallow DOS at the shallow level in the vicinity of the surface of the oxide semiconductor layer (at the interface with an insulating film or in the vicinity of the interface).

Figure 9:
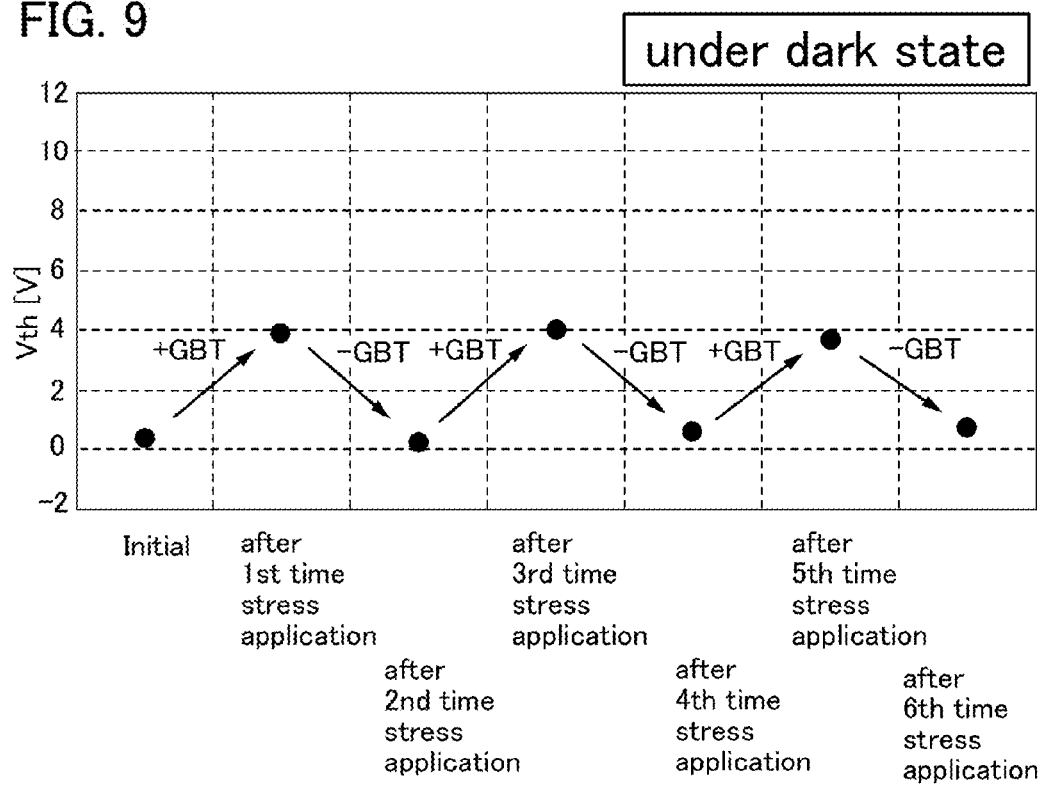
FIG. 9 is a graph showing deterioration of a transistor including an oxide semiconductor layer in a dark state.

FIG. 9 shows shifts in a threshold voltage (Vth) when the transistor including an oxide semiconductor layer is subjected to a gate bias temperature (BT) stress test repeatedly in a dark state. As apparent from FIG. 9, the threshold voltage is shifted to a positive side by the positive gate BT (+GBT) stress test. Then, the transistor is subjected to a negative gate BT (−GBT) stress test, so that the threshold voltage is shifted to a negative side and is substantially equal to the initial value (Initial). In this manner, by repeating the positive gate BT stress test and the negative gate BT stress test alternately, the threshold voltage is shifted positively and negatively (i.e., a hysteresis occurs). In other words, it is found that, when the positive gate BT stress test and the negative gate BT stress test are repeated without light irradiation, the threshold voltage is shifted alternately to a positive side and then a negative side, but the shift fits in certain range as a whole.

Figure 10:
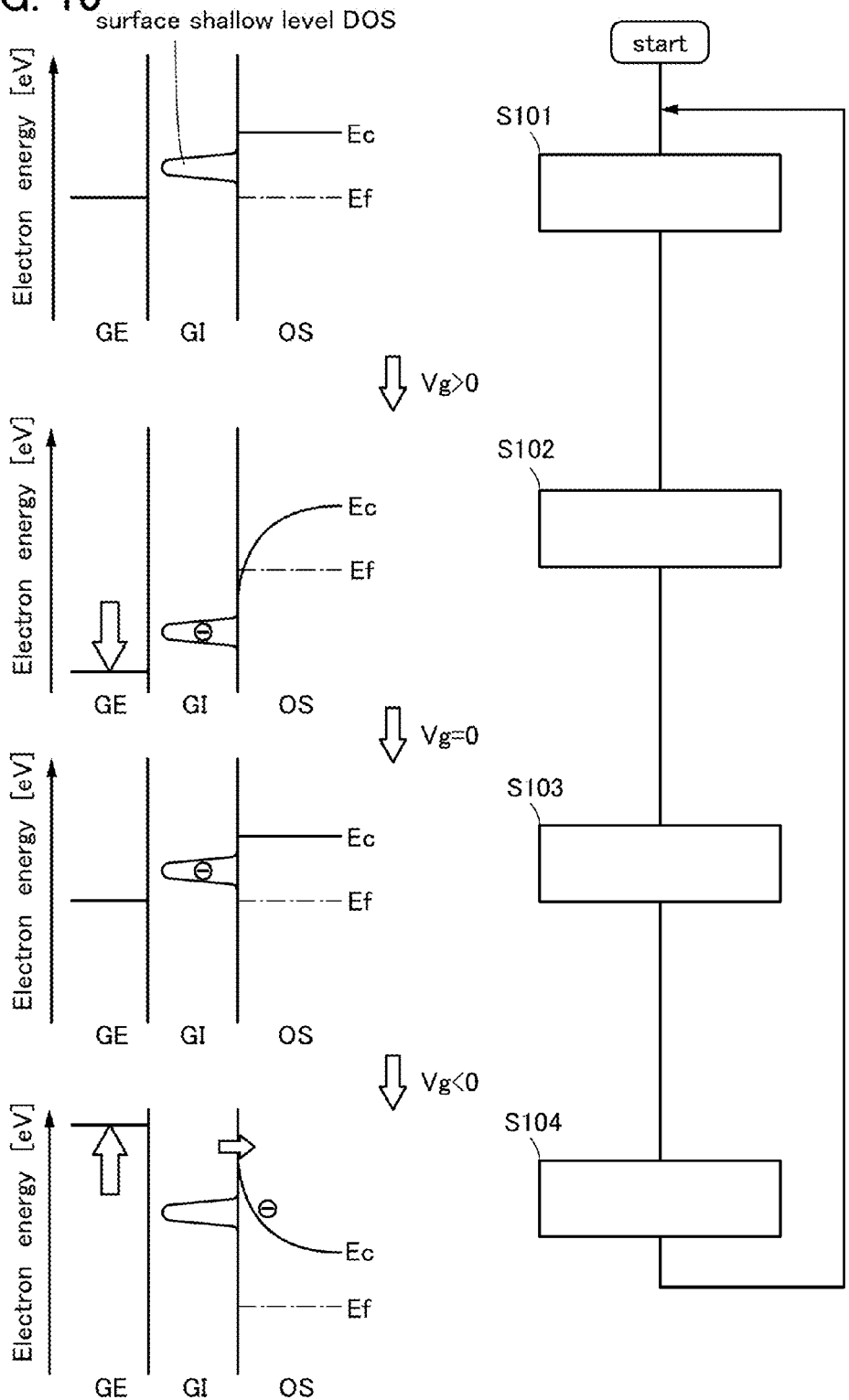
FIG. 10 illustrates deterioration of a transistor including an oxide semiconductor layer in a dark state.

The shifts in the threshold voltage of the transistor due to the gate BT stress test in the dark state can be explained with the surface shallow DOS in the vicinity of the surface of an oxide semiconductor layer. FIG. 10 illustrates a band structure of an oxide semiconductor layer and flow charts corresponding to the band structure. Here, because the mechanism of deterioration when the transistor is not irradiated with light is considered, light irradiation is not performed before, during, and after the gate BT stress test.

Before application of the gate BT stress (at the gate voltage (Vg) of 0 V), the surface shallow DOS in the vicinity of the surface of an oxide semiconductor layer has energy higher than the Fermi level (Ef) and is electrically neutral because an electron is not trapped (Step S101). The threshold voltage measured at this time is set as an initial value before the gate BT stress is applied.

Next, a positive gate voltage is applied as the positive gate BT stress test (dark state). When the positive gate voltage is applied, the conduction band is curved and the energy of the surface shallow DOS in the vicinity of the surface of the oxide semiconductor layer becomes lower than the Fermi level. Thus, an electron is trapped in the surface shallow DOS in the vicinity of the surface of the oxide semiconductor layer, so that the DOS is charged negatively (Step S102).

Next, the application of stress is stopped such that the gate voltage is 0 V. By the gate voltage at 0 V, the surface shallow DOS in the vicinity of the surface of an oxide semiconductor layer has energy higher than the Fermi level. However, it takes a long time for the electron trapped in the surface shallow DOS in the vicinity of the surface of the oxide semiconductor layer to be released. Thus, the surface shallow DOS in the vicinity of the surface of the oxide semiconductor layer remains charged negatively (Step S103). At this time, a channel formation region of the transistor is being subjected to application of a negative voltage as well as the gate voltage. Accordingly, a gate voltage that is higher than the initial value should be applied so as to turn on the transistor, so that the threshold voltage is shifted to a positive side. In other words, the transistor tends to be normally off.

Next, a negative gate voltage is applied as the negative gate BT stress test (dark state). When the negative gate voltage is applied, the conduction band is curved and the energy of the surface shallow DOS in the vicinity of the surface of the oxide semiconductor layer becomes much higher. Thus, the electron trapped in the surface shallow DOS in the vicinity of the surface of the oxide semiconductor layer is released, so that the DOS becomes electrically neutral (Step S104). Because of the release of the electron, the threshold voltage is likely to be substantially equal to the initial value before the gate BT stress tests.

Next, the application of stress is stopped such that the gate voltage is 0 V. The surface shallow DOS in the vicinity of the surface of an oxide semiconductor layer at this time has released the trapped electron and is electrically neutral (Step S101). Thus, the threshold voltage is shifted to a positive side, so that it returns to the initial value before the gate BT stress tests. The negative gate BT test and the positive gate BT stress test are repeated without irradiation with light, so that the threshold voltage is shifted repeatedly to the positive side and to the negative side. However, an electron trapped in the surface shallow DOS in the vicinity of the surface of an oxide semiconductor layer at the time of the positive gate BT stress test is released at the time of the negative gate BT stress test; therefore, it is found that the threshold voltage is shifted within a certain range as a whole.

As described above, the shift in the threshold voltage of a transistor due to the gate BT stress test in a dark state can be explained on the basis of the understanding of the surface shallow DOS in the vicinity of the surface of the oxide semiconductor layer.

<Model of Deterioration of Transistor Including Oxide Semiconductor Layer Under Light Irradiation>

As described above, deterioration of a transistor including an oxide semiconductor layer occurs differently depending on whether or not the transistor is irradiated with light. Deterioration without light irradiation has been described above. Thus, a deterioration mechanism under light irradiation is described here. The deterioration with light irradiation is related to the bulk deep DOS at the deep level inside the oxide semiconductor layer. The deterioration mechanism of the transistor with light irradiation (in a bright state) is explained on the basis of the trapping and releasing of an electron in the bulk deep DOS at the deep level inside the oxide semiconductor layer.

Figure 11:
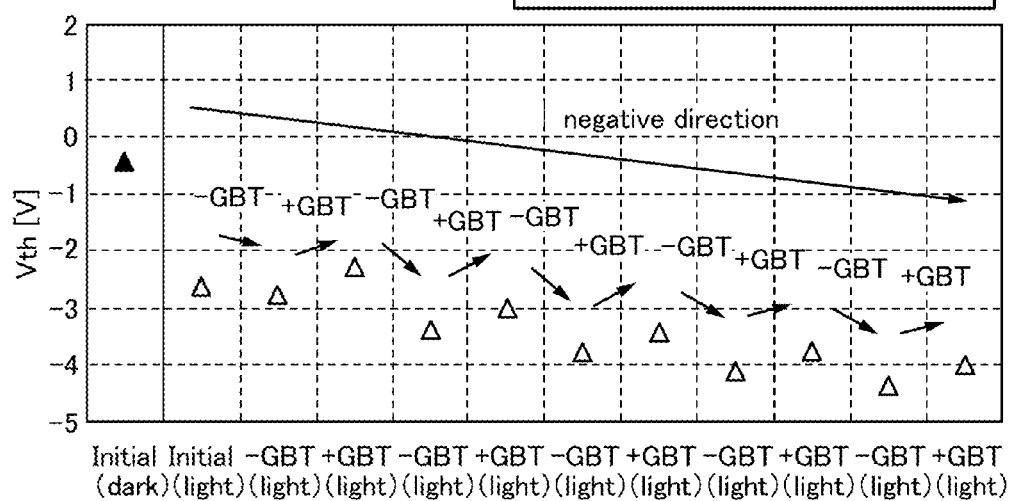
FIG. 11 is a graph showing deterioration of a transistor including an oxide semiconductor layer under light irradiation.

FIG. 11 shows the shift in the threshold voltage (Vth) when the gate BT stress test is repeatedly conducted on the transistor including an oxide semiconductor layer under light irradiation. As shown in FIG. 11, the threshold voltage (Vth) is shifted from the initial value (Initial).

In FIG. 11, a value measured when the gate BT stress is not applied and light is shielded (dark state) is plotted as the initial value of the threshold voltage. Then, the threshold voltage is measured under light irradiation (bright state) without application of the gate BT stress. As a result, the threshold voltage under light irradiation (bright state) is shifted to a negative side greatly from the threshold voltage under light-shielding state (dark state). This is likely to occur because an electron and a hole are generated by light irradiation and the generated electron is excited to the conduction band. In other words, even when the gate BT stress is not applied, the threshold voltage of the transistor including an oxide semiconductor layer is shifted to a negative side by light irradiation, so that the transistor is easily normally on. In this case, fewer electrons are excited as the energy gap of the oxide semiconductor layer gets larger or as DOS in the gap got lower. For that reason, the shift in the threshold voltage due to light irradiation is small in that case.

Then when the negative gate BT stress is applied under light irradiation (−GBT), the threshold voltage is further shifted to a negative side. This probably occurs because a hole trapped in the bulk deep DOS inside the oxide semiconductor layer is injected to a non bridging oxygen hole center (NBOHC) in a gate insulating film (GI) by an electric field and is charged positively.

After that, the positive gate BT (+GBT) stress test is conducted under light irradiation, so that the threshold voltage is shifted to a positive side. This is likely to occur because the number of holes in the non bridging oxygen hole center (NBOHC) in the gate insulating film is reduced by the electric field. However, because the threshold voltage does not return completely to the initial value, it is found that not all of the holes trapped in the gate insulating film are released.

Further, when the negative gate BT stress test and the positive gate BT stress test are repeated under light irradiation, the threshold voltage is shifted to a positive side and a negative side (up and down) repeatedly; as a result, it is found that the threshold voltage is shifted gradually to a negative side as a whole. This can be considered to result from the hole trapped in the non bridging oxygen hole center (NBOHC) in the gate insulating film. In other words, the number of holes in the non bridging oxygen hole center (NBOHC) is reduced by the positive gate BT stress test. Note that not all of the holes are released and some of the holes are left in the non bridging oxygen hole center (NBOHC) in the gate insulating film. Furthermore, when the negative gate BT stress test is conducted with some of the holes left, holes are added to the bridging oxygen hole center (NBOHC) in the gate insulating film so as to be accumulated on the holes left in bridging oxygen hole center (NBOHC). When the positive gate BT stress test is conducted again, the holes in the non bridging oxygen hole center (NBOHC) in the gate insulating film is slightly reduced, and then by the next negative gate BT stress test, holes are added again. In other words, by the positive gate BT stress test, the holes in the non bridging oxygen hole center (NBOHC) in the gate insulating film are reduced, but some of the holes are left, and by the next negative gate BT stress test, holes are added to the non bridging oxygen hole center (NBOHC) in the gate insulating film. As a result, the threshold voltage is shifted repeatedly to the positive side and the negative side, and as a whole, the threshold voltage is shifted to a negative side gradually.

Figure 12:
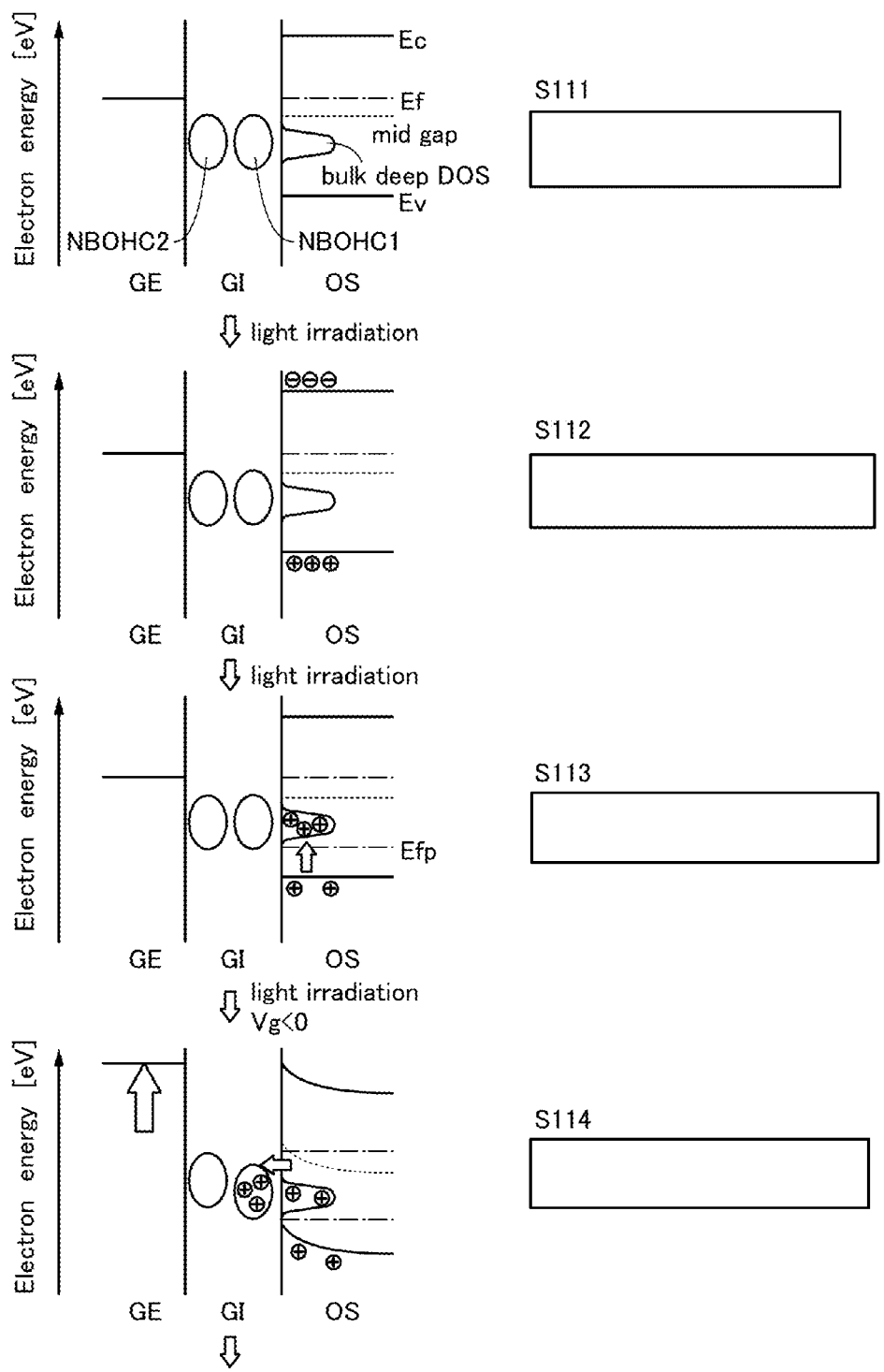
FIG. 12 illustrates deterioration of a transistor including an oxide semiconductor layer under light irradiation.

In the gate BT stress tests (where the positive gate BT stress test and the negative gate BT stress test are repeated) under light irradiation, a mechanism of the shift in the threshold voltage of the transistor is explained with reference to the band structures in FIG. 12 and FIG. 13. With reference to FIG. 12 and FIG. 13, the bulk deep DOS inside the oxide semiconductor layer and the non bridging oxygen hole centers (NBOHC1 and NBOHC2) in the gate insulating film are described. Note that the non bridging oxygen hole center (NBOHC1) is NBOHC that is located closer to the interface with the oxide semiconductor layer (on the surface side) than the non bridging oxygen hole center (NBOHC2) is.

Before the gate BT stress test and light irradiation (when the gate voltage (Vg) is 0 V), the bulk deep DOS inside the oxide semiconductor layer has energy lower than the Fermi level (Ef), and is electrically neutral because holes are not trapped (Step S111). At this time, the threshold voltage measured in the dark state is regarded as the initial value in the dark state.

Next, the oxide semiconductor layer is irradiated with light without being subjected to the gate BT stress, so that electrons and holes are generated (Step S112). The generated electrons are excited to the conduction band, so that the threshold voltage is shifted to a negative side (electrons are not described in the subsequent steps). In addition, the generated holes lower the quasi-Fermi level (Efp) of holes. Since the quasi-Fermi level (Efp) of holes is reduced, holes are trapped in the bulk deep DOS inside the oxide semiconductor layer (Step S113). Accordingly, under light irradiation without the gate BT stress test, the threshold voltage is shifted to the negative side, so that the transistor easily becomes normally on, unlike the transistor in the dark state.

Next, the negative gate BT stress test is conducted under light irradiation, so that an electric field gradient is generated and holes trapped in the bulk deep DOS inside the oxide semiconductor layer are injected to the non bridging oxygen hole center (NBOHC1) in the gate insulating film (Step S114). In addition, as illustrated in FIG. 13, some holes move into the non bridging oxygen hole centers (NBOHC2) further inside the gate insulating film by the electric field (Step S115). The movement of holes from the non bridging oxygen hole centers (NBOHC1) to the non bridging oxygen hole centers (NBOHC2) in the gate insulating film progresses with time of the electric field application. The holes in the non bridging oxygen hole centers (NBOHC1 and NBOHC2) in the gate insulating film act as positively-charged fixed charges, and shift the threshold voltage to the negative side, so that the transistor easily becomes normally on.

Light irradiation and the negative gate BT stress test are described as different steps for easy understanding, but the present invention is not construed as being limited to description in this embodiment. For example, Step S112 to Step S115 can occur in parallel.

Next, the positive gate BT stress test is conducted under light irradiation, and holes trapped in the bulk deep DOS inside the oxide semiconductor layer and holes in the non bridging oxygen hole centers (NBOHC1) in the gate insulating film are released by the application of the positive gate voltage (Step S116). Thus, the threshold voltage is shifted to the positive side. Note that because the non bridging oxygen hole center (NBOHC2) in the gate insulating film is at the deep level inside the gate insulating film, almost no holes in the non bridging oxygen hole centers (NBOHC2) are directly released even when the positive gate BT stress test is conducted under light irradiation. In order that the holes in the non bridging oxygen hole center (NBOHC2) in the gate insulating film can be released, the holes should move once to the non bridging oxygen hole centers (NBOHC1) on the surface side. The movement of a hole from the non bridging oxygen hole center (NBOHC2) to the non bridging oxygen hole center (NBOHC1) in the gate insulating film progresses little by little with the time of electric field application. Therefore, the shift amount to the positive side of the threshold voltage is small, and the threshold voltage does not return completely to the initial value.

In addition, the movement of a hole occurs between the non bridging oxygen hole center (NBOHC1) in the gate insulating film and the bulk deep DOS inside the oxide semiconductor layer. However, because many holes have been trapped in the bulk deep DOS inside the oxide semiconductor layer, the whole electric charge amount of the oxide semiconductor layer and the gate insulating film can be hardly reduced.

Next, the negative gate BT stress test is conducted again under light irradiation, so that an electric field gradient occurs and holes trapped in the bulk deep DOS inside the oxide semiconductor layer are injected into the non bridging oxygen hole center (NBOHC1) in the gate insulating film. In addition, some of the holes are injected into the non bridging oxygen hole center (NBOHC2) further inside the gate insulating film by an electric field (Step S117). Note that the holes in the non bridging oxygen hole centers (NBOHC2) in the gate insulating film, which have been injected thereinto in Step S115, are left without being released. Thus, more holes are injected, so that the number of holes serving as fixed charges is increased. The threshold voltage is further shifted to the negative side, so that the transistor easily becomes normally on.

Next, the positive gate BT stress test is conducted under light irradiation, so that holes trapped in the bulk deep DOS inside the oxide semiconductor layer and holes in the non bridging oxygen hole center (NBOHC1) in the gate insulating film are released by application of the positive gate voltage (Step S118). As a result, the threshold voltage is shifted to the positive side. However, the holes in the non bridging oxygen hole center (NBOHC2) in the gate insulating film are hardly released. Accordingly, the shift amount to the positive side of the threshold voltage is small, and the threshold voltage does not return completely to the initial value.

By repeating the negative gate BT stress test and the positive gate BT stress test under light irradiation as described above, the threshold voltage is shifted to the positive side and the negative side repeatedly; therefore the threshold voltage is gradually shifted to the negative side as a whole.

The shift in the threshold voltage of the transistor in the gate BT stress test under light irradiation can be explained on the basis of the bulk deep DOS inside the oxide semiconductor layer and the non bridging oxygen hole centers (NBOHC1 and NBOHC2) in the gate insulating film.

<Process Model of Dehydration and Dehydrogenation of Oxide Semiconductor Layer and Addition of Oxygen to Oxide Semiconductor Layer>

In order to fabricate a transistor with stable electrical characteristics, it is important to reduce the DOS inside the oxide semiconductor layer and in the vicinity of the interface of the oxide semiconductor layer (to make a highly purified intrinsic state). A process model where the oxide semiconductor layer is highly purified to be intrinsic is described below. Dehydration and dehydrogenation of the oxide semiconductor layer are described first and then addition of oxygen where an oxygen vacancy (Vo) is compensated with oxygen is described.

A model where the bonding between indium and oxygen is broken to form an oxygen vacancy is described.

When the bonding between indium and oxygen is broken, oxygen is released and a site of the oxygen that has been bonded to indium serves as an oxygen vacancy. The oxygen vacancy forms the deep level DOS at the deep level of the oxide semiconductor layer. Because the oxygen vacancy in the oxide semiconductor layer is instable, it traps oxygen or hydrogen to be stable. For this reason, when hydrogen exists near an oxygen vacancy, the oxygen vacancy traps hydrogen to become VoH. The VoH forms the shallow level DOS at the shallow level in the oxide semiconductor layer.

Figure 14A:
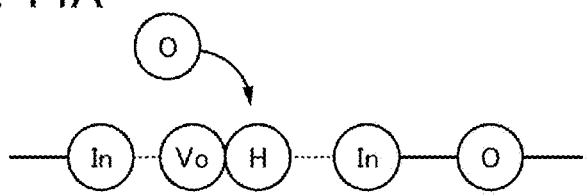
FIGS. 14A to 14F illustrate a model where an oxide semiconductor layer is highly purified to be intrinsic.
Figure 14B:
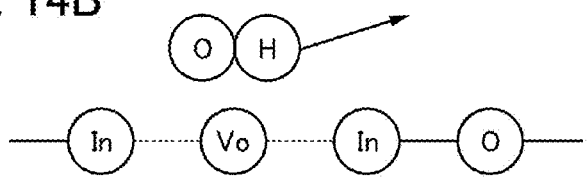

Next, when oxygen comes close to the VoH in the oxide semiconductor layer, oxygen extracts hydrogen from VoH to become a hydroxyl group (OH), so that hydrogen is released from the VoH (see FIGS. 14A and 14B). The oxygen can move in the oxide semiconductor layer so as to come closer to VoH by heat treatment.

Figure 14C:
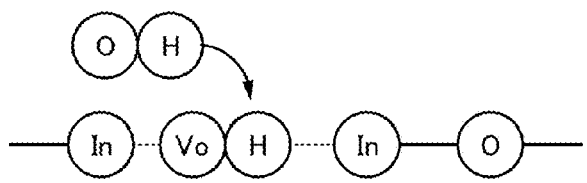
Figure 14D:
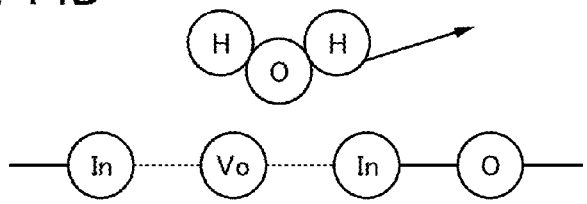

Further, when the hydroxyl group comes closer to another VoH in the oxide semiconductor layer, the hydroxyl group extracts hydrogen from VoH to become a water molecule ($H_2O$), so that hydrogen is released from VoH (see FIGS. 14C and 14D). In the above manner, one oxygen atom releases two hydrogen atoms from the oxide semiconductor layer. This is referred to as dehydration and dehydrogenation of the oxide semiconductor layer. By the dehydration and dehydrogenation, the shallow level DOS at the shallow level in the oxide semiconductor layer is reduced, and the deep level DOS is formed.

Figure 14E:
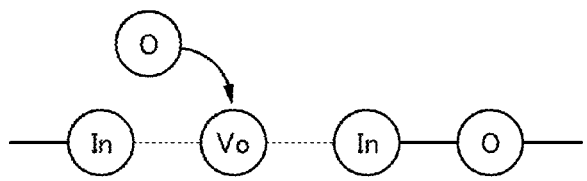
Figure 14F:
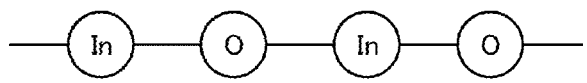

Next, when oxygen comes close to an oxygen vacancy in the oxide semiconductor layer, oxygen is trapped by the oxygen vacancy, so that the oxygen vacancy disappears (see FIGS. 14E and 14F). This is referred to as oxygen addition in the oxide semiconductor layer. By the oxygen addition, the deep level DOS at the deep level in the oxide semiconductor layer is reduced.

As described above, when dehydration and dehydrogenation of the oxide semiconductor layer are performed and oxygen is added to the oxide semiconductor layer, the shallow level DOS and the deep level DOS in the oxide semiconductor layer can be reduced. This process is referred to as a highly purification process for making an intrinsic oxide semiconductor.

<Description of Structure of Transistor Having Multilayer Film and Manufacturing Method Thereof>

The structure of the transistor having the multilayer film and a manufacturing method thereof are described below.

<Transistor Structure (1)>

First, an example of a top-gate top-contact transistor is described.

Figure 15A:
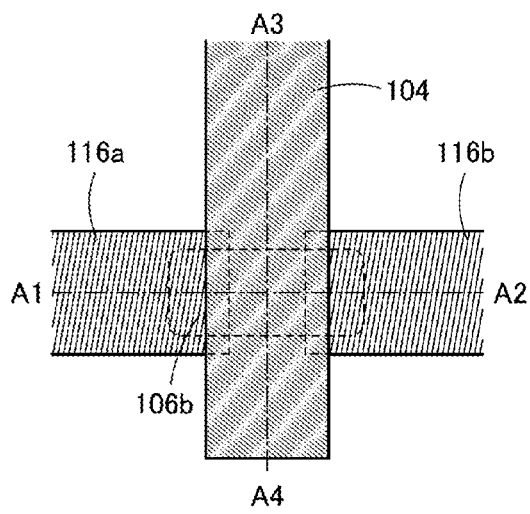
FIGS. 15A to 15C are a top view and cross-sectional views illustrating an example of a transistor of one embodiment of the present invention.
Figure 15C:
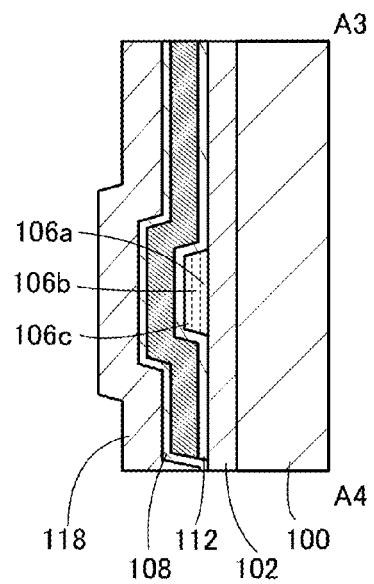
Figure 15B:
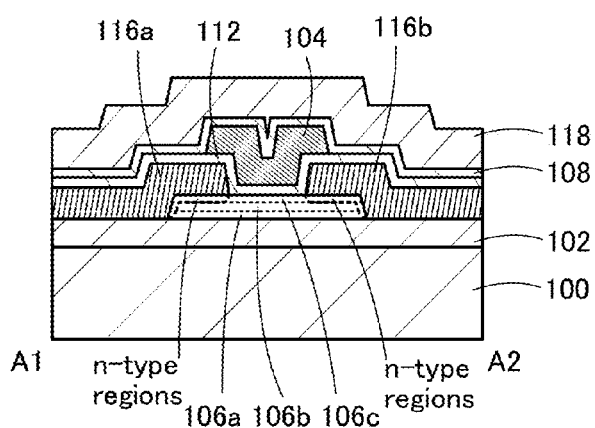

FIGS. 15A to 15C are a top view and cross-sectional views of the transistor. FIG. 15A is a top view of the transistor. FIG. 15B is the cross-sectional view taken along dashed-dotted line A1-A2 in FIG. 15A. FIG. 15C is the cross-sectional view taken along dashed-dotted line A3-A4 in FIG. 15A.

The transistor illustrated in FIG. 15B includes a base insulating film 102 over a substrate 100, an oxide semiconductor layer 106a over the base insulating film 102, an oxide semiconductor layer 106b over the oxide semiconductor layer 106a, an oxide semiconductor layer 106c over the oxide semiconductor layer 106b, a source electrode 116a and a drain electrode 116b in contact with the oxide semiconductor layer 106c, a gate insulating film 112 over the oxide semiconductor layer 106c and the source electrode 116a and the drain electrode 116b, and a gate electrode 104 over the gate insulating film 112. Preferably, a protective insulating film 108 is formed over the gate insulating film 112 and the gate electrode 104, and a protective insulating film 118 is formed over the protective insulating film 108. Note that the transistor does not necessarily include the base insulating film 102.

Figure 16A:
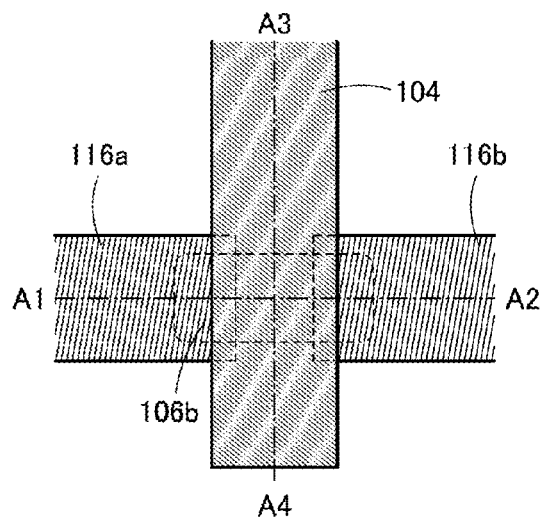
FIGS. 16A to 16C are a top view and cross-sectional views illustrating an example of a transistor of one embodiment of the present invention.
Figure 16C:
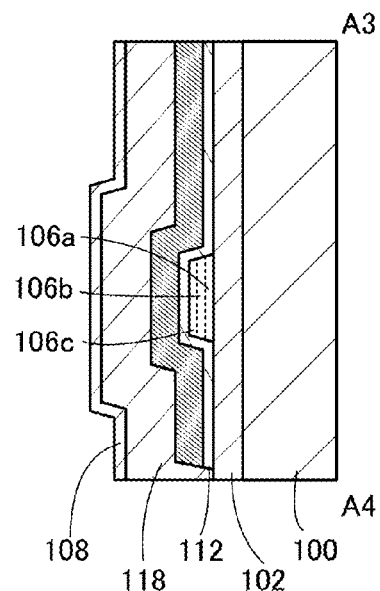
Figure 16B:
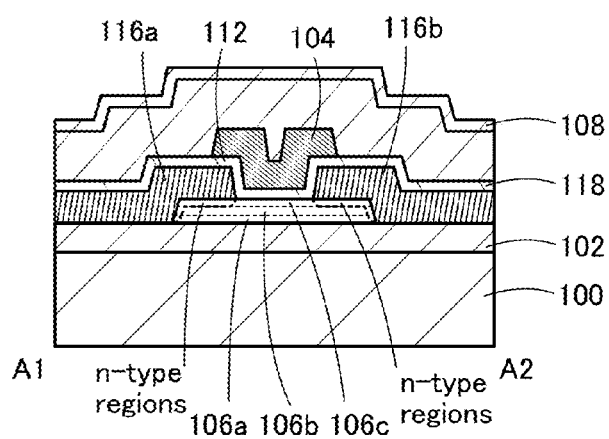

Note that the transistor illustrated in FIG. 15B may have a structure in which the stacking order of the protective insulating film 108 and the protective insulating film 118 is reversed (see FIGS. 16A to 16C). In the transistor illustrated in FIGS. 16A to 16C, in some cases, outward diffusion of excess oxygen released from the base insulating film 102 is less likely to occur than in the transistor illustrated in FIGS. 15A to 15C. Thus, there is a possibility that oxygen vacancies in the oxide semiconductor layer 106a, the oxide semiconductor layer 106b, and the oxide semiconductor layer 106c can be reduced (DOS can be reduced) more than those in the transistor illustrated in FIGS. 15A to 15C.

The oxide semiconductor layer 106a of the transistor in FIGS. 15A to 15C corresponds to the oxide semiconductor layer (S1) in FIG. 1A, for example. The oxide semiconductor layer 106b of the transistor in FIGS. 15A to 15C corresponds to the oxide semiconductor layer (S2) in FIG. 1A, for example. The oxide semiconductor layer 106c of the transistor in FIGS. 15A to 15C corresponds to the oxide semiconductor layer (S3) in FIG. 1A, for example.

The base insulating film 102 of the transistor in FIGS. 15A to 15C corresponds to the gate insulating film (bg) of the transistor in FIG. 5A, for example. In addition, the transistor in FIGS. 15A to 15C may include the gate electrode (bg) of the transistor in FIG. 5A, for example. The transistor in FIGS. 15A to 15C may include a back gate electrode that is opposite to the gate electrode 104 and is in contact with the bottom surface of the base insulating film 102, for example. In addition, in the transistor in FIGS. 15A to 15C, if the substrate 100 has conductivity, the substrate 100 can correspond to the gate insulating film (bg) of the transistor in FIG. 5A, for example. In the transistor in FIGS. 15A to 15C, if a conductive film serving as a wiring or the like is provided below the base insulating film 102, the conductive film can correspond to the gate insulating film (bg) of the transistor in FIG. 5A, for example.

Note that a conductive film used for the source electrode 116a and the drain electrode 116b takes oxygen away from part of the oxide semiconductor layer 106b and part of the oxide semiconductor layer 106c or forms a mixed layer depending on its kind, which in some cases results in formation of n-type regions (low-resistance regions) in the oxide semiconductor layer 106b and the oxide semiconductor layer 106c.

In FIG. 15A, the distance between the source electrode 116a and the drain electrode 116b in a region overlapping with the gate electrode 104 is called channel length. Note that in the case where the transistor includes the n-type region, the distance between a source region and a drain region in the region overlapping with the gate electrode 104 may be called channel length.

Note that a channel formation region refers to a region, which overlaps with the gate electrode 104 and is provided between the source electrode 116a and the drain electrode 116b, in the oxide semiconductor layer 106a, the oxide semiconductor layer 106b, and the oxide semiconductor layer 106c (see FIG. 15B). Further, a channel refers to a region through which current mainly flows in the channel formation region.

Note that as illustrated in the top view of FIG. 15A, the oxide semiconductor layer 106b is provided outside the gate electrode 104. However, the oxide semiconductor layer 106b may be provided inside the gate electrode 104. With such a structure, when light irradiation is performed from the gate electrode 104 side, generation of carriers in the oxide semiconductor layer 106b due to light can be suppressed. In other words, the gate electrode 104 functions as a light-blocking film.

The multilayer film including the oxide semiconductor layer 106a, the oxide semiconductor layer 106b, and the oxide semiconductor layer 106c is described below.

The oxide semiconductor layer 106b is an oxide containing indium. An oxide can have a high carrier mobility (electron mobility) by containing indium, for example. In addition, the oxide semiconductor layer 106b preferably includes an element M. The element M is aluminum, gallium, yttrium, or tin, for example. The element M is an element having a high bonding energy with oxygen, for example. The element M is an element that can increase the energy gap of the oxide, for example. In addition, the oxide semiconductor layer 106b preferably contains zinc. When the oxide contains zinc, the oxide is easily to be crystallized, for example. The energy at the top of the valence band of the oxide can be controlled with the atomic ratio of zinc, for example.

Note that the oxide semiconductor layer 106b is not limited to the oxide containing indium. The oxide semiconductor layer 106b may be a Zn—Sn oxide or a Ga—Sn oxide, for example.

The oxide semiconductor layer 106a is an oxide semiconductor layer which includes one or more kinds of elements other than oxygen included in the oxide semiconductor layer 106b. Further, since the oxide semiconductor layer 106a includes one or more kinds of elements other than oxygen included in the oxide semiconductor layer 106b, DOS are less likely to be formed at the interface between the oxide semiconductor layer 106b and the oxide semiconductor layer 106a.

The oxide semiconductor layer 106c is an oxide semiconductor layer which includes one or more kinds of elements other than oxygen included in the oxide semiconductor layer 106b. Further, since the oxide semiconductor layer 106c includes one or more kinds of elements other than oxygen included in the oxide semiconductor layer 106b, DOS are less likely to be formed at the interface between the oxide semiconductor layer 106b and the oxide semiconductor layer 106c.

In the case of using an In-M-Zn oxide as the oxide semiconductor layer 106a, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. In the case of using an In-M-Zn oxide as the oxide semiconductor layer 106b, when summation of In and M is assumed to be 100 atomic %, the proportions of In and M are preferably set to be greater than or equal to 25 atomic % and less than 75 atomic %, respectively, and further preferably greater than or equal to 34 atomic % and less than 66 atomic %, respectively. In the case of using an In-M-Zn oxide as the oxide semiconductor layer 106c, when summation o In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. Note that the oxide semiconductor layer 106c may be an oxide that is a type the same as that of the oxide semiconductor layer 106a.

Figure 28:
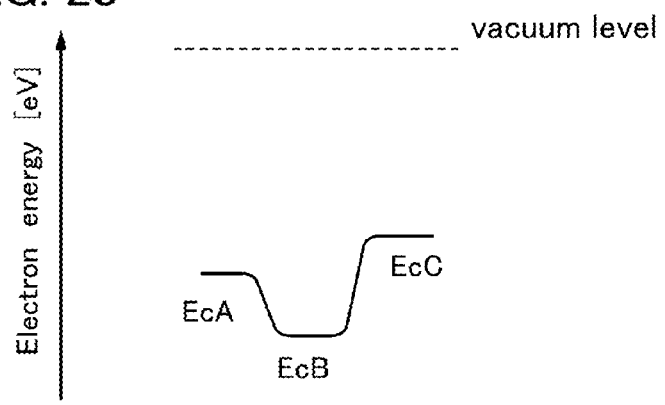
FIG. 28 illustrates a band structure of a multilayer film of one embodiment of the present invention.

Here, in some cases, there is a mixed region of the oxide semiconductor layer 106a and the oxide semiconductor layer 106b between the oxide semiconductor layer 106a and the oxide semiconductor layer 106b. Further, in some cases, there is a mixed region of the oxide semiconductor layer 106b and the oxide semiconductor layer 106c between the oxide semiconductor layer 106b and the oxide semiconductor layer 106c. The mixed region has low DOS. For that reason, the stack where the oxide semiconductor layer 106a, the oxide semiconductor layer 106b, and the oxide semiconductor layer 106c are stacked has a band structure where energy at each interface is changed continuously (continuous junction) (see FIG. 28). Note that the energy at the bottom of the conduction band of the oxide semiconductor layer 106a is EcA, the energy at the bottom of the conduction band of the oxide semiconductor layer 106b is EcB, and the energy at the bottom of the conduction band of the oxide semiconductor layer 106c is EcC.

As the oxide semiconductor layer 106b, an oxide with a wide energy gap is used. For example, the energy gap of the oxide semiconductor layer 106b is set to be greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Further, for example, the energy gap of the oxide semiconductor layer 106c is set to be greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the oxide semiconductor layer 106a, an oxide with a wide energy gap is used. For example, the energy gap of the oxide semiconductor layer 106a is set to be greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the oxide semiconductor layer 106c, an oxide with a wide energy gap is used. For example, the energy gap of the oxide semiconductor layer 106c is set to be greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV. Note that the oxide semiconductor layer 106a and the oxide semiconductor layer 106c have wider energy gaps than the oxide semiconductor layer 106b.

As the oxide semiconductor layer 106b, an oxide having an electron affinity higher than that of the oxide semiconductor layer 106a is used. For example, as the oxide semiconductor layer 106b, an oxide having an electron affinity higher than that of the oxide semiconductor layer 106a by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the bottom of the conduction band.

As the oxide semiconductor layer 106b, an oxide having an electron affinity higher than that of the oxide semiconductor layer 106c is used. For example, as the oxide semiconductor layer 106b, an oxide having an electron affinity higher than that of the oxide semiconductor layer 106c by 0.07 eV or higher and 1.3 eV or lower, preferably 0.1 eV or higher and 0.7 eV or lower, further preferably 0.15 eV or higher and 0.4 eV or lower is used.

At this time, when an electric field is applied to the gate electrode 104, a channel is formed in the oxide semiconductor layer 106b, which is an oxide having higher electron affinity of the oxide semiconductor layer 106a, the oxide semiconductor layer 106b, the oxide semiconductor layer 106c.

Moreover, as described with reference to FIGS. 1A and 1B, FIG. 2, FIG. 3, and FIG. 4, the thickness of the oxide semiconductor layer 106c is preferably as small as possible to improve the on-state current of the transistor. The thickness of the oxide semiconductor layer 106c is set to be less than 10 nm, preferably less than or equal to 5 nm, further preferably less than or equal to 3 nm, for example. Meanwhile, the oxide semiconductor layer 106c has a function of blocking elements other than oxygen (such as silicon) included in the gate insulating film 112 from entering the oxide semiconductor layer 106b where a channel is formed. For this reason, it is preferable that the oxide semiconductor layer 106c have a certain thickness. The thickness of the oxide semiconductor layer 106c is set to be greater than 0.3 nm, preferably greater than or equal to 1 nm, further preferably greater than or equal to 2 nm, for example.

As described above in the model of deterioration of the transistor, preferably, the thickness of the oxide semiconductor layer 106a is large, the thickness of the oxide semiconductor layer 106b is small, and the thickness of the oxide semiconductor layer 106c is small. Specifically, the thickness of the oxide semiconductor layer 106a is set to be greater than or equal to 20 nm, preferably greater than or equal to 30 nm, further preferably greater than or equal to 40 nm, still further greater than or equal to 60 nm. With the oxide semiconductor layer 106a having the thickness greater than or equal to of 20 nm, preferably greater than or equal to 30 nm, further preferably greater than or equal to 40 nm, still further preferably greater than or equal to 60 nm, the distance from the interface between the base insulating film 102 and the oxide semiconductor layer 106a to the oxide semiconductor layer 106b where the channel is formed can be greater than or equal to 20 nm, preferably greater than or equal to 30 nm, further preferably greater than or equal to 40 nm, still further preferably greater than or equal to 60 nm. Note that since the productivity of a semiconductor device might be reduced, the thickness of the oxide semiconductor layer 106a is set to be less than or equal to 200 nm, preferably less than or equal to 120 nm, further preferably less than or equal to 80 nm. The thickness of the oxide semiconductor layer 106b is set to be greater than or equal to 3 nm and less than or equal to 100 nm, preferably greater than or equal to 3 nm and less than or equal to 80 nm, further preferably greater than or equal to 3 nm and less than or equal to 50 nm.

For example, the oxide semiconductor layer 106a may be thicker than the oxide semiconductor layer 106b, and the oxide semiconductor layer 106b may be thicker than the oxide semiconductor layer 106c.

The multilayer film including three layers, the oxide semiconductor layer 106a, the oxide semiconductor layer 106b, and the oxide semiconductor layer 106c has been described above, but one embodiment of the present invention is not limited to the multilayer film including three layers. For example, the oxide semiconductor layer 106b alone may be used. Alternatively, a multilayer film including two layers, the oxide semiconductor layer 106a and the oxide semiconductor layer 106b or a multilayer film including two layers, the oxide semiconductor layer 106b and the oxide semiconductor layer 106c may be employed, for example. Alternatively, a multilayer film having four or more layers including an oxide semiconductor layer between the oxide semiconductor layer 106a and the oxide semiconductor layer 106b may be provided. In this case, the oxide semiconductor layer provided between the oxide semiconductor layer 106a and the oxide semiconductor layer 106b is, for example, an oxide having an electron affinity higher than or equal to than the electron affinity of the oxide semiconductor layer 106a and is lower than or equal to than the electron affinity of the oxide semiconductor layer 106b. Alternatively, a multilayer film having four or more layers including an oxide semiconductor layer between the oxide semiconductor layer 106c and the oxide semiconductor layer 106b may be provided, for example. In that case, the oxide semiconductor layer provided between the oxide semiconductor layer 106c and the oxide semiconductor layer 106b is, for example, an oxide having an electron affinity higher than or equal to than the electron affinity of the oxide semiconductor layer 106c and is lower than or equal to equal to than the electron affinity of the oxide semiconductor layer 106b.

In the case where the oxide semiconductor layer 106a, the oxide semiconductor layer 106b, and the oxide semiconductor layer 106c are formed by a sputtering method, a target containing indium is preferably used in order to prevent an increase in the number of particles. In addition, if an oxide target having a high atomic ratio of the element M is used, the conductivity of the target may be decreased. The element M is aluminum, gallium, yttrium, or tin, for example. In the case where a target containing indium is used, the conductivity of the target can be increased and DC discharge and AC discharge are facilitated; therefore, film formation over a large-sized substrate can be easily performed. Thus, semiconductor devices can be manufactured with high productivity.

In the case where the oxide semiconductor layer 106a is formed by a sputtering method, the atomic ratio of In to M and Zn contained in the target may be 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, 1:9:10, or the like.

In the case where the oxide semiconductor layer 106b is formed by a sputtering method, the atomic ratio of In to M and Zn contained in the target may be 3:1:1, 3:1:2, 3:1:4, 1:1:0.5, 1:1:1, 1:1:2, or the like.

In the case where the oxide semiconductor layer 106c is formed by a sputtering method, the atomic ratio of In to M and Zn contained in the target may be 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, 1:9:10, or the like.

In the cases where the oxide semiconductor layer 106a, the oxide semiconductor layer 106b, and the oxide semiconductor layer 106c are formed by a sputtering method, films having atomic ratios different from the atomic ratios of the targets used may be formed. Especially for zinc, the atomic ratio of zinc in a deposited film is smaller than the atomic ratio of the target in some cases. Specifically, the film in some cases has an atomic ratio of zinc of 40 atomic % to 90 atomic % of the atomic ratio of zinc in the target.

An influence of silicon on an oxide is described below. In order to obtain stable electrical characteristics of a transistor, it is effective to reduce the concentration of impurities in the oxide semiconductor layer 106b so that the oxide semiconductor layer 106b is highly purified to be intrinsic. The carrier density of the oxide semiconductor layer 106b is set to be lower than $1 \times 10^{17}/\text{cm}^3$, lower than $1 \times 10^{15}/\text{cm}^3$, or lower than $1 \times 10^{13}/\text{cm}^3$. In the oxide, a light element, a semimetal element, a metal element, and the like (lower than 1 atomic %) other than main components serve as impurities. For example, hydrogen, lithium, carbon, nitrogen, fluorine, sodium, silicon, chlorine, potassium, calcium, titanium, iron, nickel, copper, germanium, strontium, zirconium, and hafnium might be impurities in the oxide. Accordingly, the concentration of impurities in an adjacent layer is preferably reduced.

For example, as described above, DOS might be formed by silicon contained in the oxide. In addition, when silicon exists on the surface layer of the oxide semiconductor layer 106b, DOS might be formed. For this reason, the concentration of silicon in a region between the oxide semiconductor layer 106b and the oxide semiconductor layer 106a is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$. The concentration of silicon in a region between the oxide semiconductor layer 106b and the oxide semiconductor layer 106c is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$.

In addition, as described above, hydrogen may form DOS in the oxide, so that the carrier density is increased. The concentration of hydrogen in the oxide semiconductor layer 106b measured by secondary ion mass spectrometry (SIMS) is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. In the oxide, nitrogen forms DOS, which increase carrier density in some cases. Further, nitrogen forms DOS in the oxide, which may increase carrier density. The concentration of nitrogen in the oxide semiconductor layer 106*b* measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the oxide semiconductor layer 106*a* in order to reduce the concentration of hydrogen in the oxide semiconductor layer 106*b*. The concentration of hydrogen in the oxide semiconductor layer 106*a* measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the oxide semiconductor layer 106*a* in order to reduce the concentration of nitrogen in the oxide semiconductor layer 106*b*. The concentration of nitrogen in the oxide semiconductor layer 106*a* measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the oxide semiconductor layer 106*c* in order to reduce the concentration of hydrogen in the oxide semiconductor layer 106*b*. The concentration of hydrogen in the oxide semiconductor layer 106*c* measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the oxide semiconductor layer 106*c* in order to reduce the concentration of nitrogen in the oxide semiconductor layer 106*b*. The concentration of nitrogen in the oxide semiconductor layer 106*c* measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

An oxide semiconductor that can be used for the oxide semiconductor layer 106*b* and the like will be described below. An oxide semiconductor may include a non-single-crystal, for example. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM) (hereinafter referred to as a TME image), for example, crystal parts can be found in the CAAC-OS in some cases. In most cases, in the TEM image, crystal parts in the CAAC-OS each fit inside a cube whose one side is 100 nm, for example. In the TEM image, a boundary between an amorphous part and the crystal part and a boundary between the crystal parts in the CAAC-OS are not clearly observed in some cases. Further, in the TEM image, a grain boundary in the CAAC-OS is not clearly observed in some cases. In the CAAC-OS, since a clear grain boundary does not exist, for example, segregation of an impurity is unlikely to occur. In the CAAC-OS, since a clear grain boundary does not exist, for example, an increase in the density of defect states (an increase in DOS) hardly occurs. In the CAAC-OS, since a clear grain boundary does not exist, for example, a reduction in electron mobility hardly occurs.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak appears at 2θ of around 31° in some cases. Further, for example, spots (luminescent spots) are observed in an electron diffraction pattern of the CAAC-OS in some cases. An electron diffraction pattern obtained with an electron beam having a beam diameter of 10 nmφ or smaller, or 5 nmφ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

FIG. 29A is an example of a nanobeam electron diffraction pattern of a sample including a CAAC-OS. Here, the sample is cut in the direction perpendicular to a surface where the CAAC-OS is formed and thinned to have a thickness of about 40 nm. Further, an electron beam with a diameter of 1 nmφ enters from the direction perpendicular to the cut surface of the sample. FIG. 29A shows that spots are observed in the nanobeam electron diffraction pattern of the CAAC-OS. An ion milling method using argon ions is employed for thinning the sample.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS is formed or a normal vector of the surface of the CAAC-OS.

The CAAC-OS could be obtained by reducing the impurity concentration, for example. The impurity means here an element other than the main components of the oxide semiconductor, such as hydrogen, carbon, silicon, or a transition metal element. In particular, an element such as silicon has a higher strength to bond with oxygen than that of a metal element included in the oxide semiconductor. Therefore, when the element takes oxygen away from the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS, distribution of crystal parts is not necessarily uniform. For example, in the formation process of the CAAC-OS, in the case where crystal growth occurs from a surface side of the oxide semiconductor, the proportion of crystal parts in the vicinity of the surface of the oxide semiconductor is higher than that in the vicinity of the surface where the oxide semiconductor is formed in some cases. Further, when an impurity is mixed into the CAAC-OS, the crystal part in a region into which the impurity is mixed becomes amorphous or microcrystalline in some cases.

Further, the CAAC-OS can be formed, for example, by reducing DOS. In an oxide semiconductor, as described above, oxygen vacancies form DOS, for example. The oxygen vacancies form hole traps or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having low DOS. In other words, the CAAC-OS is an oxide semiconductor having few oxygen vacancies.

The state in which impurity concentration is low and DOS is low (the number of oxygen vacancies is small) is referred to as "highly purified intrinsic" or "substantially highly purified intrinsic". A highly-purified intrinsic or substantially highly-purified intrinsic oxide semiconductor has few carrier generation sources, and thus can have a low carrier density in some cases. Thus, in some cases, a transistor using the oxide semiconductor for a channel formation region rarely has a negative threshold voltage (is rarely normally-on). A highly-purified intrinsic or substantially highly-purified intrinsic oxide semiconductor has low DOS and accordingly has a small number of charge traps in some cases. Thus, the transistor using the oxide semiconductor for the channel formation region has a small change in electrical characteristics and high reliability in some cases. Holes trapped by the hole traps in the oxide semiconductor take a long time to be released and may behave like fixed charges in some cases. Thus, the transistor including the oxide semiconductor having many hole traps in the channel formation region has unstable electrical characteristics in some cases.

A transistor including the highly purified intrinsic or substantially highly purified intrinsic CAAC-OS has a small change in the electrical characteristics due to irradiation with visible light or ultraviolet light.

The CAAC-OS can be formed by a sputtering method using a DC power source, for example.

An oxide semiconductor may include polycrystal, for example. Note that an oxide semiconductor including polycrystal is referred to as a polycrystalline oxide semiconductor. A polycrystalline oxide semiconductor includes a plurality of crystal grains. A polycrystalline oxide semiconductor includes, for example, amorphous parts in some cases.

In the TEM image, for example, crystal grains can be found in the polycrystalline oxide semiconductor in some cases. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in the TEM image, for example. Moreover, in the TEM image, for example, a boundary between an amorphous part and a crystal grain and a boundary between crystal grains can be found in the polycrystalline oxide semiconductor in some cases. Also in the TEM image, for example, a grain boundary can be found in the polycrystalline oxide semiconductor in some cases.

The polycrystalline oxide semiconductor may include, for example, a plurality of crystal grains, and the alignment of crystals may be different in the plurality of crystal grains. When a polycrystalline oxide semiconductor is analyzed by, for example, an out-of-plane method with an XRD apparatus, one or plural peaks appear in some cases. For example, in the case of a polycrystalline IGZO film, a peak at $2\theta$ of around $31°$ which shows alignment or plural peaks which show plural kinds of alignment appear in some cases. Further, spots are observed in, for example, a nanobeam electron diffraction pattern of the polycrystalline oxide semiconductor in some cases.

The polycrystalline oxide semiconductor has, for example, high crystallinity and thus has a high electron mobility in some cases. Accordingly, a transistor using the polycrystalline oxide semiconductor for a channel formation region has a high field-effect mobility. Note that in some cases, an impurity is segregated at the grain boundary between the crystals in the polycrystalline oxide semiconductor. Moreover, the grain boundary of the polycrystalline oxide semiconductor becomes a defect. Since the grain boundary of the polycrystalline oxide semiconductor may serve as a carrier generation source or a charge trap in some cases, a transistor using the polycrystalline oxide semiconductor for a channel formation region has, in some cases, a larger change in electrical characteristics and lower reliability than a transistor using a CAAC-OS for a channel formation region.

The polycrystalline oxide semiconductor can be formed by high-temperature heat treatment or laser light treatment.

The oxide semiconductor may include microcrystal, for example. Note that an oxide semiconductor including microcrystal is referred to as a microcrystalline oxide semiconductor.

In the TEM image, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc). An oxide semiconductor including nanocrystal is referred to as an nc-OS (nanocrystalline oxide semiconductor). In the TEM image, for example, a boundary between an amorphous part and the crystal part and a boundary between the crystal parts in the nc-OS is not clearly observed in some cases. In the TEM image TEM of the nc-OS, since a clear grain boundary does not exist, for example, segregation of an impurity is unlikely to occur. In the nc-OS, since a clear grain boundary does not exist, for example, DOS are hardly increased. In the nc-OS, since a clear grain boundary does not exist, for example, electron mobility is hardly reduced.

In the nc-OS, for example, a microscopic region (e.g., a region with a size greater than or equal to 1 nm and less than or equal to 10 nm) has a periodic atomic order occasionally. Further, for example, in the nc-OS, crystal parts are not regularly-arranged. Thus, in some cases, periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS film is analyzed by an out-of-plane method with an XRD apparatus using an X-ray having a beam diameter larger than that of a crystal part, a peak which shows alignment does not appear in some cases. Further, for example, a halo pattern is observed in some cases in an electron diffraction pattern of the nc-OS obtained by using an electron beam having a diameter larger than that of a crystal part (e.g., a beam diameter of 20 nmφ or more, or 50 nmφ or more). For example, spots are observed in some cases in a nanobeam electron diffraction pattern of the nc-OS obtained by using an electron beam having a diameter smaller than or equal to that of a crystal part (e.g., a beam diameter of 10 nmφ or less, or 5 nmφ or less). In a nanobeam electron diffraction pattern of the nc-OS, for example, regions with high luminance in a circular pattern are observed in some cases. In a nanobeam electron diffraction pattern of the nc-OS, for example, a plurality of spots are observed in the region in some cases.

FIG. 29B is an example of a nanobeam electron diffraction pattern of a sample including an nc-OS. Here, the sample is cut in the direction perpendicular to a surface where the nc-OS is formed and the thickness thereof is reduced to about 40 nm. Further, an electron beam with a diameter of 1 nmφ enters from the direction perpendicular to the cut surface of the sample. FIG. 29B shows that regions with high luminance in a circular pattern are observed and a plurality of spots are observed in the region in the nanobeam electron diffraction pattern of the nc-OS. An ion milling method using argon ions is employed for thinning the sample.

FIGS. 29C1 and 29C2 are examples of a nanobeam electron diffraction pattern of a sample including an nc-OS. Here, the sample is cut in the direction perpendicular to a surface where the nc-OS is formed and the thickness thereof is reduced to about 5 nm to 10 nm. Further, an electron beam with a diameter of 1 nmφ enters in the direction perpendicular to the cut surface of the sample, and thereby spots are observed in a measurement position 1 (see FIG. 29C1) and a circular region with high luminance is observed in a measurement position 2 (see FIG. 29C2) depending on the measurement positions. In the position where the circular region with high luminance is observed, there is a possibility that an electron beam passes through a pellet-like crystal and thus a spot of another pellet-like crystal in the depth direction is also observed. Note that the sample is thinned by an ion milling method in which the sample is irradiated with argon ions at a shallow angle (about 3°).

Since the microscopic region in the nc-OS has a periodic atomic order occasionally, DOS in the nc-OS is lower than that in the amorphous oxide semiconductor. Note that since crystal parts in the nc-OS are not regularly-arranged, DOS in the nc-OS is higher than that in the CAAC-OS.

Accordingly, the nc-OS has higher carrier density than the CAAC-OS in some cases. An oxide semiconductor with a high carrier density tends to have a high electron mobility. Therefore, a transistor using the nc-OS for a channel formation region has a high field-effect mobility in some cases. In addition, the nc-OS has high DOS than the CAAC-OS and thus has a larger number of charge traps in some cases. Therefore, a transistor using the nc-OS for a channel formation region has a larger change in electrical characteristics and lower reliability than a transistor using the CAAC-OS for a channel formation region. Note that the nc-OS can be obtained even when the amount of impurity contained therein is relatively large, and thus can be easily obtained than the CAAC-OS and in some cases, is preferably used depending on the application. For example, the nc-OS may be formed by a deposition method such as a sputtering method using an AC power supply. The sputtering method using an AC power supply allows a film to be formed with high uniformity over a large substrate, so that semiconductor devices including a transistor using the nc-OS for a channel formation region can be manufactured with high productivity.

The oxide semiconductor may include an amorphous part, for example. Note that an oxide semiconductor including an amorphous part is referred to as an amorphous oxide semiconductor. An amorphous oxide semiconductor, for example, has disordered atomic arrangement and no crystal part. An amorphous oxide semiconductor, for example, does not have a specific shape as in quartz and regularity in atomic arrangement.

In the TEM image, crystal parts cannot be found clearly in the amorphous oxide semiconductor in some cases.

When an amorphous oxide semiconductor is analyzed by an out-of-plane method with an XRD apparatus, a peak which shows alignment does not appear in some cases. Further, a halo pattern is observed in an electron diffraction pattern of the amorphous oxide semiconductor in some cases. In other cases, a halo pattern is observed instead of a spot in a nanobeam electron diffraction pattern of the amorphous oxide semiconductor.

The amorphous oxide semiconductor can be formed in some cases, for example, by introducing impurities such as hydrogen at a high concentration. Hence, the amorphous oxide semiconductor is, for example, an oxide semiconductor containing impurities at a high concentration.

When an oxide semiconductor contains impurities at a high concentration, DOS of oxygen vacancies or the like are formed in the oxide semiconductor in some cases. This means that an amorphous oxide semiconductor with a high concentration of impurities has high DOS. In addition, since the amorphous oxide semiconductor has low crystallinity, DOS in the amorphous oxide semiconductor is lower than that in the CAAC-OS or the nc-OS.

Thus, the amorphous oxide semiconductor has a much higher carrier density than the nc-OS in some cases. Therefore, a transistor using the amorphous oxide semiconductor for a channel formation region tends to be normally on, and sometimes can be preferably used for a transistor which needs to have such electrical characteristics. The amorphous oxide semiconductor has high DOS and thus has a large number of charge traps in some cases. Therefore, a transistor using the amorphous oxide semiconductor for a channel formation region has larger change in electrical characteristics and lower reliability than a transistor using the CAAC-OS or the nc-OS for a channel formation region in some cases. Note that the amorphous oxide semiconductor can be formed even by a deposition method in which a relatively large amount of impurity is contained, and thus can be easily obtained and in some cases, is preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, semiconductor devices including a transistor using the amorphous oxide semiconductor for a channel formation region can be manufactured with high productivity.

Note that the oxide semiconductor may be a mixed film including two or more of a CAAC-OS, a polycrystalline oxide semiconductor, a microcrystalline oxide semiconductor, and an amorphous oxide semiconductor. The mixed film includes in some cases two or more of an amorphous oxide semiconductor region, a microcrystalline oxide semiconductor region, a polycrystalline oxide semiconductor region, and a CAAC-OS region. The mixed film has in some cases a stacked-layer structure of two or more of an amorphous oxide semiconductor region, a microcrystalline oxide semiconductor region, a polycrystalline oxide semiconductor region, and a CAAC-OS region.

An oxide semiconductor may include a single crystal, for example. Note that an oxide semiconductor including a single crystal is referred to as a single crystal oxide semiconductor.

The single crystal oxide semiconductor has, for example, a low impurity concentration and low DOS (a small number of oxygen vacancies), and thus can have a low carrier density. Therefore, a transistor using the single crystal oxide semiconductor for a channel formation region is unlikely to be normally on. Further, the single crystal oxide semiconductor has low DOS and thus has a small number of charge traps in some cases. Thus, a transistor using the single crystal oxide semiconductor for a channel formation region has a small change in electrical characteristics and high reliability in some cases.

The oxide semiconductor has a high density if including few defects, for example. The oxide semiconductor has a high density if having high crystallinity, for example. The oxide semiconductor has a high density if containing impurities such as hydrogen at a low concentration. For example, the density of a single crystal oxide semiconductor is higher than that of a CAAC-OS in some cases. For example, the density of a CAAC-OS is higher than that of a microcrystalline oxide semiconductor in some cases. For example, the density of a polycrystalline oxide semiconductor is higher than that of a microcrystalline oxide semiconductor in some cases. For example, the density of a microcrystalline oxide semiconductor is higher than that of an amorphous oxide semiconductor.

The DOS in the oxide semiconductor layer 106b is described below. When the DOS in the oxide semiconductor layer 106b is reduced, a transistor including the oxide semiconductor layer 106b can have stable electrical characteristics. The DOS of the oxide semiconductor layer 106b can be measured by a constant photocurrent method (CPM).

Note that in order that the transistor can have stable electrical characteristics, the absorption coefficient due to the DOS in the oxide semiconductor layer 106 measured by CPM may be set to be lower than $1 \times 10^{-3}$ cm$^{-1}$, preferably lower than $3 \times 10^{-4}$ cm$^{-1}$. Further, when the absorption coefficient due to the DOS of the oxide semiconductor layer 106b measured by CPM is set to be lower than $1 \times 10^{-3}$ cm$^{-1}$, preferably lower than $3 \times 10^{-4}$ cm$^{-1}$, the field-effect mobility of the transistor can be increased. In order that the absorption coefficient due to the DOS in the oxide semiconductor layer 106b measured by CPM can be set to be lower than $1 \times 10^{-3}$ cm$^{-1}$, preferably lower than $3 \times 10^{-4}$ cm$^{-1}$, the concentrations of elements forming DOS such as hydrogen, lithium, carbon, nitrogen, fluorine, sodium, silicon, chlorine, potassium, calcium, titanium, iron, nickel, copper, germanium, strontium, zirconium, and hafnium in the oxide are lower than $2 \times 10^{19}$ atoms/cm$^3$, preferably lower than $2 \times 10^{18}$ atoms/cm$^3$, further preferably lower than $2 \times 10^{17}$ atoms/cm$^3$.

The DOS of a sample where the oxide semiconductor layer 106a, the oxide semiconductor layer 106b, and the oxide semiconductor layer 106c are stacked over a substrate is evaluated by CPM.

The oxide semiconductor layer 106a is formed by a sputtering method using an In—Ga—Zn oxide (the atomic ratio of In to Ga and Zn is 1:3:2) target. Note that an argon gas at a flow rate of 30 sccm and an oxygen gas at a flow rate of 15 sccm were used as a deposition gas, the pressure was set to 0.4 Pa, the substrate temperature was set to 200° C., and a DC power of 0.5 kW was applied.

The oxide semiconductor layer 106b is formed by a sputtering method using an In—Ga—Zn oxide (the atomic ratio of In to Ga and Zn is 1:1:1) target. Note that an argon gas at a flow rate of 30 sccm and an oxygen gas at a flow rate of 15 sccm were used as a deposition gas, the pressure was set to 0.4 Pa, the substrate temperature was set to 200° C., and a DC power of 0.5 kW was applied.

The oxide semiconductor layer 106c is formed by a sputtering method using an In—Ga—Zn oxide (the atomic ratio of In to Ga and Zn is 1:3:2) target. Note that an argon gas at a flow rate of 30 sccm and an oxygen gas at a flow rate of 15 sccm were used as a deposition gas, the pressure was set to 0.4 Pa, the substrate temperature was set to 200° C., and a DC power of 0.5 kW was applied.

Here, the thicknesses of the oxide semiconductor layer 106a, the oxide semiconductor layer 106b, and the oxide semiconductor layer 106c are set to 30 nm, 100 nm, and 30 nm, respectively, for increasing the accuracy in the CPM measurement.

In the CPM measurement, the amount of light with which a surface of the sample between terminals is irradiated is adjusted so that a photocurrent value is kept constant in the state where voltage is applied between a first electrode and a second electrode provided in contact with the oxide semiconductor layer 106b, and then an absorption coefficient is derived from the amount of the irradiation light at each wavelength. In the CPM measurement, when the sample has DOS, the absorption coefficient due to the energy which corresponds to the DOS (calculated from the wavelength) is increased. The increase in the absorption coefficient is multiplied by a constant, whereby the DOS of the sample can be obtained.

Figure 30:
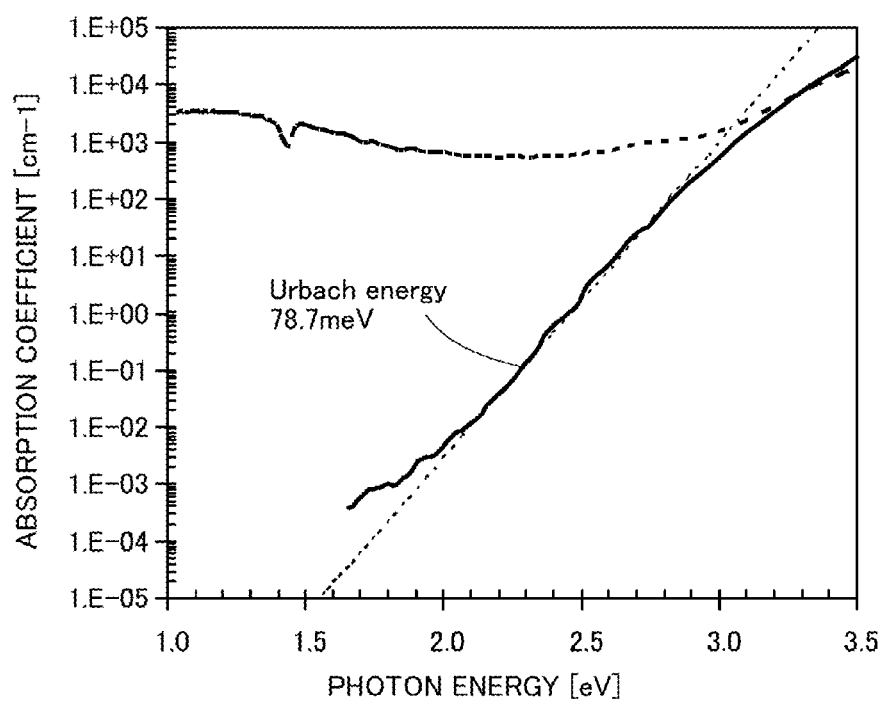
FIG. 30 is a graph showing an absorption coefficient measured by CPM.

FIG. 30 shows results of fitting the absorption coefficient (dotted line) measured using a spectrophotometer and the absorption coefficient (solid line) measured by CPM in the range of energy higher than or equal to the energy gap of the oxide semiconductor layer 106b. Note that the Urbach energy obtained based on the absorption coefficient measured by CPM was 78.7 meV. The integral value of the absorption coefficient is calculated in such a manner that a background (thin dotted line) is subtracted from the absorption coefficient measured by CPM in FIG. 30. As a result, the absorption coefficient due to DOS of this sample is found to be $2.02 \times 10^{-4}$ cm$^{-1}$.

The base insulating film 102 in FIGS. 15A to 15C may be formed to have a single-layer structure or a stacked-layer structure using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The base insulating film 102 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is lower than or equal to $3 \times 10^{17}$ spins/cm$^3$, preferably lower than or equal to $5 \times 10^{16}$ spins/cm$^3$ is used. As the silicon nitride layer, a silicon nitride layer from which a hydrogen gas and an ammonia gas are less likely to be released is used. The amount of released hydrogen gas or ammonia gas may be measured by thermal desorption spectroscopy (TDS). Further, as the silicon nitride layer, a silicon nitride layer which does not transmit or hardly transmits hydrogen, water, and oxygen is used.

The base insulating film 102 may be, for example, a multilayer film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer, a silicon oxide layer containing excess oxygen is used. As the silicon nitride layer, a silicon nitride layer from which a hydrogen gas and an ammonia gas are less likely to be released is used. Further, as the silicon nitride layer, a silicon nitride layer which does not transmit or hardly transmits hydrogen, water, and oxygen is used.

The silicon oxide layer containing excess oxygen means a silicon oxide layer from which oxygen can be released by heat treatment or the like. An insulating film containing excess oxygen means an insulating film from which oxygen is released by heat treatment.

The insulating film containing excess oxygen is capable of reducing oxygen vacancies in the oxide semiconductor layer 106b. Such an oxygen vacancy forms DOS in the oxide semiconductor layer 106b and serves as a hole trap or the like. In addition, hydrogen enters into the site of such an oxygen vacancy and in some cases forms an electron serving as a carrier. Thus, by a reduction in the number of oxygen vacancies in the oxide semiconductor layer 106b, the transistor can have stable electrical characteristics.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis in a temperature range of a film surface, which is 100° C. to 700° C., preferably 100° C. to 500° C. (converted into the number of oxygen atoms).

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to Formula 22 using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having the mass number of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[Formula 22]}$$

Here, $N_{H2}$ is the value obtained by conversion of the number of hydrogen molecules desorbed from the reference sample into densities. In addition, $S_{H2}$ is the integral value of ion intensity in the TDS analysis of the reference sample. Here, the reference value of the reference sample is $N_{H2}/S_{H2}$. Further, $S_{O2}$ is the integral value of ion intensity in the TDS analysis of the measurement sample, and $\alpha$ is a coefficient affecting the ion intensity in the TDS analysis. Refer to Japanese Published Patent Application No. H6-275697 for details of Formula 22. The amount of released oxygen was measured with a thermal desorption spectroscopy apparatus produced by ESCO Ltd., EMD-WA1000S/W using a silicon wafer containing hydrogen atoms at $1\times10^{16}$ atoms/cm$^2$ as the reference sample.

Further, in the TDS analysis, part of oxygen is detected as an oxygen atom. The ratio between oxygen molecules and oxygen atoms can be calculated from the ionization rate of the oxygen molecules. Since the above α includes the ionization rate of the oxygen molecules, the number of the released oxygen atoms can also be estimated through the evaluation of the number of the released oxygen molecules.

Here, $N_{O2}$ is the number of the released oxygen molecules. The amount of released oxygen in terms of oxygen atoms is twice the number of the released oxygen molecules.

Further or alternatively, the film from which oxygen is released by heat treatment may contain a peroxide radical. Specifically, the spin density attributed to the peroxide radical is higher than or equal to $5\times10^{17}$ spins/cm$^3$. Note that the film containing a peroxide radical may have an asymmetric signal with a g factor of approximately 2.01 in ESR.

The insulating film containing excess oxygen may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

The source electrode 116a and the drain electrode 116b may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example. The source electrode 116a and the drain electrode 116b are each preferably a multilayer film including a layer containing copper. The source electrode 116a and the drain electrode 116b are each a multilayer film including a layer containing copper, whereby wiring resistance can be reduced in the case where a wiring is formed in the same layer as the source electrode 116a and the drain electrode 116b. Note that the compositions of the source electrode 116a and the drain electrode 116b are either the same as or different from each other.

In the case where a multilayer film including a layer containing copper is used for the source electrode 116a and the drain electrode 116b, copper enters into the oxide semiconductor layer 106b and thereby the carrier density of the oxide semiconductor layer 106b may be increased. Alternatively, copper forms DOS in the oxide semiconductor layer 106b and the DOS serves as a charge trap in some cases. In this case, when the oxide semiconductor layer 106c can block copper, the increase in off-state current and the shift in the threshold voltage of the transistor due to the entry of copper into the oxide semiconductor layer 106b can be inhibited.

Figure 17A:
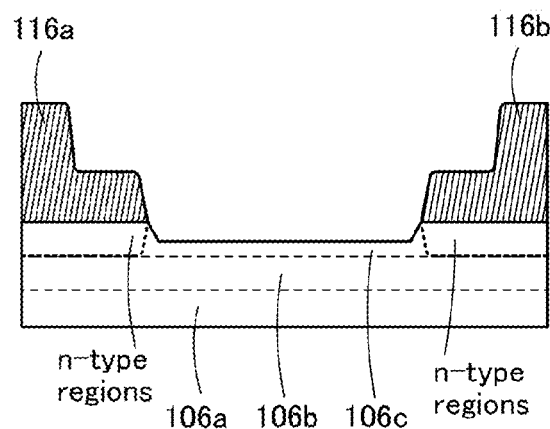
FIGS. 17A to 17C are each a cross-sectional view illustrating an example of a region near a source electrode and a drain electrode of a transistor of one embodiment of the present invention.
Figure 17B:
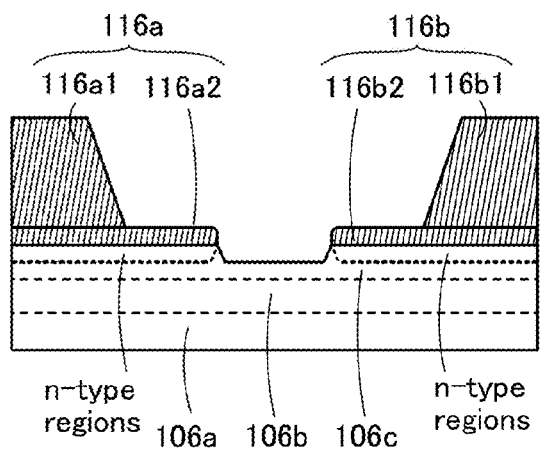
Figure 17C:
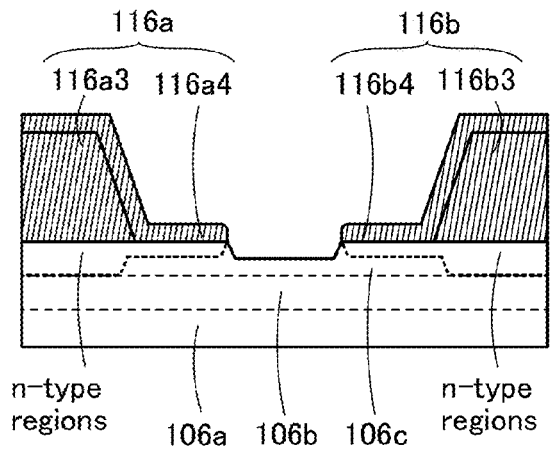

FIGS. 17A to 17C are cross-sectional views of the vicinities of the source electrode 116a and the drain electrode 116b of the transistor. The source electrode 116a and the drain electrode 116b may have any structure illustrated in FIGS. 17A to 17C. In FIGS. 17A to 17C, the top surface of the oxide semiconductor layer 106c is hollowed at the time of the formation of the source electrode 116a and the drain electrode 116b.

FIG. 17A illustrates a structure where steps are formed in the source electrode 116a and the drain electrode 116b. N-type regions are formed in regions represented by broken lines in the oxide semiconductor layer 106c. The n-type regions are formed resulting from generation of oxygen vacancies in the oxide semiconductor layer 106c due to damages when the source electrode 116a and the drain electrode 116b are formed over the oxide semiconductor layer 106c or action of the conductive film serving as the source electrode 116a and the drain electrode 116b. Due to entry of hydrogen into the oxygen vacancies, an electron serving as a carrier is generated. Note that the n-type regions are formed up to the vicinity of the boundary between the oxide semiconductor layer 106c and the oxide semiconductor layer 106b as a non-limiting example illustrated in FIG. 17A. For example, the n-type regions may be formed in the oxide semiconductor layer 106c and the oxide semiconductor layer 106b, or only in the oxide semiconductor layer 106c.

In the structure illustrated in FIG. 17B, a conductive layer 116a2 which is not easily oxidized and a conductive layer 116a1 provided over the conductive layer 116a2 are used as the source electrode 116a, and a conductive layer 116b2 which is not easily oxidized and a conductive layer 116b1 provided over the conductive layer 116b2 are used as the drain electrode 116b. Note that the conductive layer which is not easily oxidized is unlikely to reduce the oxide semiconductor layer 106c. When the source electrode 116a and the drain electrode 116b have a structure illustrated in FIG. 17B, the n-type regions are formed only in the oxide semiconductor layer 106c. Further, diffusion of oxygen vacancies in the channel length direction is small, so that the channel formation region is less likely to have n-type conductivity. Furthermore, owing to the conductive layer 116a1 and the conductive layer 116b1, the conductive layer 116a2 and the conductive layer 116b2 can have low conductivity. Thus, the thicknesses of the conductive layer 116a2 and the conductive layer 116b2 can be small, which leads to easy microfabrication. In other words, the structure illustrated in FIG. 17B is favorable for a miniaturized transistor having a small channel length.

Note that the conductive layer 116a1 and the conductive layer 116a2 may be the same conductive layer. In addition, the conductive layer 116b1 and the conductive layer 116b2 may be the same conductive layer.

In the structure illustrated in FIG. 17C, a conductive layer 116a3 and a conductive layer 116a4 which is not easily oxidized and is provided over the conductive layer 116a3 are used as the source electrode 116a, and a conductive layer 116b3 and a conductive layer 116b4 which is not easily oxidized and is provided over the conductive layer 116b3 are used as the drain electrode 116b. When the source electrode 116a and the drain electrode 116b have a structure illustrated in FIG. 17C, part of the n-type regions formed in the oxide semiconductor layer 106c are formed up to the vicinity of the boundary between the oxide semiconductor layer 106b and the oxide semiconductor layer 106c and part of the n-type regions are formed in only the oxide semiconductor layer 106c. Further, diffusion of oxygen vacancies in the channel length direction is small, so that the channel formation region is less likely to have n-type conductivity. Since the n-type regions are formed so as to reach the oxide semiconductor layer 106b below the conductive layer 116a3 and the conductive layer 116b3, the resistance between the source electrode 116a and the drain electrode 116b is small; as a result, the field-effect mobility of the transistor can be increased. Further, owing to the conductive layer 116a3 and the conductive layer 116b3, the conductive layer 116a4 and the conductive layer 116b4 can have low conductivity. Thus, the thicknesses of the conductive layer 116a4 and the conductive layer 116b4 can be small, which leads to easy microfabrication. In other words, the structure illustrated in FIG. 17C is favorable for a miniaturized transistor having a small channel length.

Note that the conductive layer 116a3 and the conductive layer 116a4 may be the same conductive layer. In addition, the conductive layer 116b3 and the conductive layer 116b4 may be the same conductive layer.

The gate insulating film 112 in FIGS. 15A to 15C may be formed to have a single-layer structure or a stacked-layer structure using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The gate insulating film 112 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon oxide layer, a silicon oxide layer containing excess oxygen is preferably used. As the silicon nitride layer, a silicon nitride layer from which a hydrogen gas and an ammonia gas are less likely to be released is used. The amount of released hydrogen gas or ammonia gas may be measured by TDS.

In the case where at least one of the gate insulating film 112 and the base insulating film 102 includes an insulating film containing excess oxygen, oxygen vacancies in the oxide semiconductor layer 106b are reduced, so that the transistor can have stable electrical characteristics.

The gate electrode 104 may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

The protective insulating film 108 may be formed to have a single-layer structure or a stacked-layer structure using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The protective insulating film 108 includes, for example, a silicon nitride layer. In that case, the silicon nitride layer may be a silicon nitride oxide layer. As the silicon nitride layer, a silicon nitride layer from which a hydrogen gas and an ammonia gas are less likely to be released is preferably used. The amount of released hydrogen gas or ammonia gas may be measured by TDS. Further, as the silicon nitride layer, a silicon nitride layer which does not transmit or hardly transmits hydrogen, water, and oxygen is preferably used.

The protective insulating film 108 includes, for example, an aluminum oxide layer. As the aluminum oxide layer, an aluminum oxide layer from which a hydrogen gas is less likely to be released is preferable. The amount of released hydrogen gas may be measured by TDS. Further, as the aluminum oxide layer, an aluminum oxide layer which does not transmit or hardly transmits hydrogen, water, and oxygen is preferably used.

The protective insulating film 118 may be formed to have a single-layer structure or a stacked-layer structure using an insulating film containing one or more of silicon oxide, silicon oxynitride, germanium oxide, yttrium oxide, zirconium oxide, lanthanum oxide, neodymium oxide, hafnium oxide, and tantalum oxide, for example. Owing to the protective insulating film 118, the protective insulating film 108 is not necessarily provided.

There is no large limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate whose shrinkage due to heat treatment is as less as possible is preferably used. For example, as the substrate 100, it is possible to use a large glass substrate in which the amount of shrinkage by heat treatment for one hour at 400° C., preferably 450° C., further preferably 500° C. is less than or equal to 10 ppm, preferably less than or equal to 5 ppm, further preferably less than or equal to 3 ppm.

Still alternatively, a flexible substrate may be used as the substrate 100. As a method of providing the transistor over a flexible substrate, there is a method in which the transistor is formed over a non-flexible substrate, and then the transistor is separated and transferred to the substrate 100 which is a flexible substrate. In that case, a separation layer is preferably provided between the non-flexible substrate and the transistor.

<Manufacturing Method of Transistor Structure (1)>

An example of a manufacturing method of the transistor structure (1) is described below.

FIGS. 18A to 18D and FIGS. 19A to 19D are cross-sectional views corresponding to FIG. 15B.

First, the substrate 100 is prepared.

Next, the base insulating film 102 is formed. The base insulating film 102 may be formed by a sputtering method, a chemical vapor deposition (CVD) method, a molecular beam epitaxy (MBE) method, an atomic layer deposition (ALD) method, or a pulsed laser deposition (PLD) method.

Alternatively, when a silicon wafer is used as the substrate 100, the base insulating film 102 can be formed by a thermal oxidation method.

Then, in order to planarize the surface of the base insulating film 102, chemical mechanical polishing (CMP) may be performed. By CMP treatment, the average surface roughness (Ra) of the base insulating film 102 is preferably less than or equal to 1 nm, further preferably less than or equal to 0.3 nm, still further preferably less than or equal to 0.1 nm. In some cases, Ra that is less than or equal to 1 nm can increase the crystallinity of the oxide semiconductor layer 106b. Note that the average surface roughness Ra is obtained by expanding arithmetic mean surface roughness that is defined by JIS B 0601: 2001 (ISO4287:1997), into three dimensions for application to a curved surface, and Ra can be expressed as the average value of the absolute values of deviations from a reference surface to a specific surface and is defined by Formula (23).

$$Ra = \frac{1}{S_0} \int_{y_1}^{y_2} \int_{x_1}^{x_2} |f(x, y) - Z_0| dx dy \quad \text{[Formula 23]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. In addition, $S_0$ represents the area of a rectangle which is obtained by projecting the specified surface on the xy plane, and $Z_0$ represents the height of the reference surface (the average height of the specific surface). Further, Ra can be measured using an atomic force microscope (AFM).

Then, oxygen ions may be added into the base insulating film 102 so that an insulating film containing excess oxygen can be formed. The addition of oxygen ions is preferably performed by an ion-implantation method at acceleration voltage of 2 kV to 100 kV and at a dose of $5 \times 10^{14}$ ions/cm$^2$ to $5 \times 10^{16}$ ions/cm$^2$, for example.

Figure 18A:
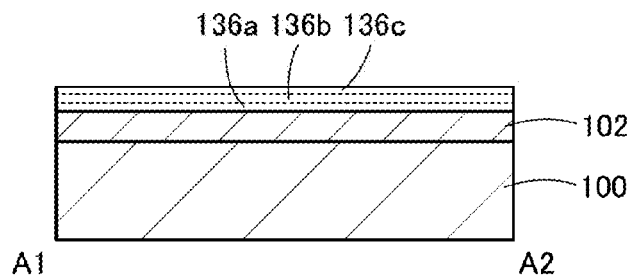
FIGS. 18A to 18D are cross-sectional views illustrating an example of a manufacturing method of a transistor of one embodiment of the present invention.

Next, an oxide semiconductor layer 136a, an oxide semiconductor layer 136b, and an oxide semiconductor layer 136c are formed in this order (see FIG. 18A). The oxide semiconductor layer 136a, the oxide semiconductor layer 136b, and the oxide semiconductor layer 136c can be formed using any of oxides given as examples of the oxide semiconductor layer 106a, the oxide semiconductor layer 106b, and the oxide semiconductor layer 106c, respectively. The oxide semiconductor layer 136b and the oxide semiconductor layer 136c may be formed by a sputtering method, a CVD method, an MBE method, an ALD method, or a PLD method.

First heat treatment is preferably performed after the formation of the oxide semiconductor layer 136c. The first heat treatment may be performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer 136b can be improved, and in addition, impurities such as hydrogen and water can be removed from the oxide semiconductor layer 136b. In addition, by the first heat treatment, the DOS in the oxide semiconductor layer 106b is reduced, so that the oxide semiconductor layer 106b can be highly purified. The description of high purification process can be referred to for a model for reducing DOS.

Figure 18B:
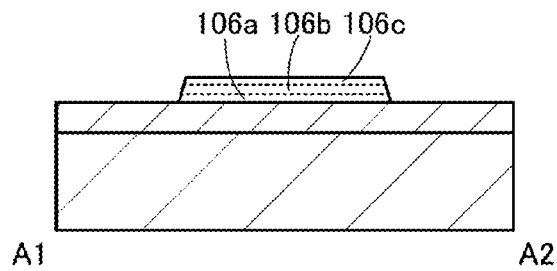
Figure 18C:
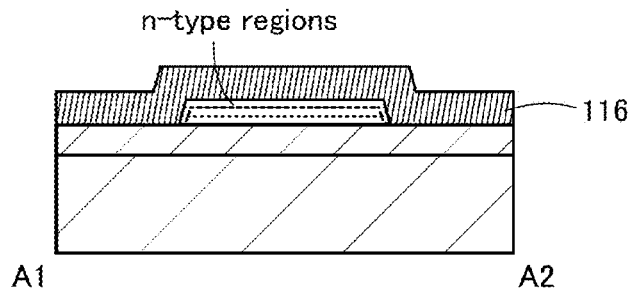

Next, the oxide semiconductor layer 136a, the oxide semiconductor layer 136b, and the oxide semiconductor layer 136c are partly etched to form the oxide semiconductor layer 106a, the oxide semiconductor layer 106b, and the oxide semiconductor layer 106c that have island shapes (see FIG. 18B).

Next, a conductive film 116 is formed. The conductive film 116 may be formed using a conductive film selected from the conductive films given as examples of the source electrode 116a and the drain electrode 116b. The conductive film 116 may be formed by a sputtering method, a CVD method, an MBE method, an ALD method, or a PLD method. At this time, n-type regions are in some cases formed in regions represented by broken lines in the oxide semiconductor layer 106a, the oxide semiconductor layer 106b, and the oxide semiconductor layer 106c (see FIG. 18C). The n-type regions are formed resulting from generation of oxygen vacancies in the oxide semiconductor layer 106c due to damages when the conductive film 116 is formed over the oxide semiconductor layer 106c or action of the conductive film 116. For example, due to entry of hydrogen into the site of oxygen vacancies, an electron serving as a carrier is generated. Note that the n-type regions are formed up to the vicinity of the boundary between the oxide semiconductor layer 106c and the oxide semiconductor layer 106b as a non-limiting example illustrated in FIG. 17A. For example, the n-type regions may be formed in the oxide semiconductor layer 106c and the oxide semiconductor layer 106b, or only in the oxide semiconductor layer 106c.

Figure 18D:
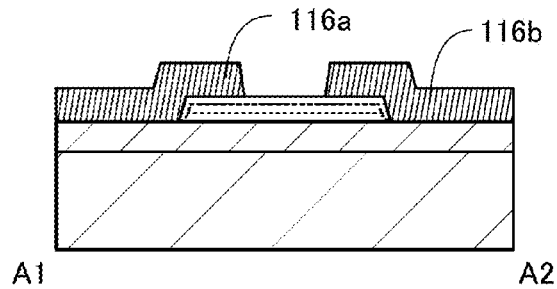

Next, the conductive film 116 is partly etched to form the source electrode 116a and the drain electrode 116b (see FIG. 18D).

Next, second heat treatment is preferably performed. The second heat treatment may be performed under conditions selected from the conditions shown in the first heat treatment. By the second heat treatment, the n-type region where the oxide semiconductor layer 106c is exposed can be turned into an i-type region (see FIG. 19A). Therefore, in the oxide semiconductor layer 106c, the n-type regions can be formed only just under the source electrode 116a and the drain electrode 116b. Due to the n-type regions, the contact resistance between the oxide semiconductor layer 106c, and the source electrode 116a and the drain electrode 116b can be reduced, so that the amount of on-state current of the transistor can be increased. In addition, the second heat treatment can serve also as the first heat treatment.

Figure 19A:
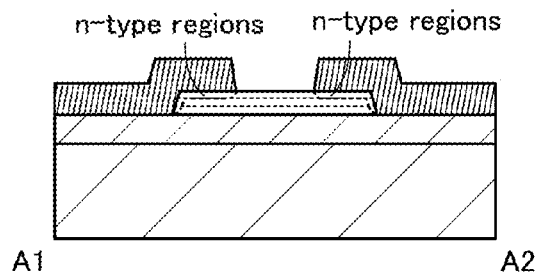
FIGS. 19A to 19D are cross-sectional views illustrating an example of a manufacturing method of a transistor of one embodiment of the present invention.
Figure 19B:
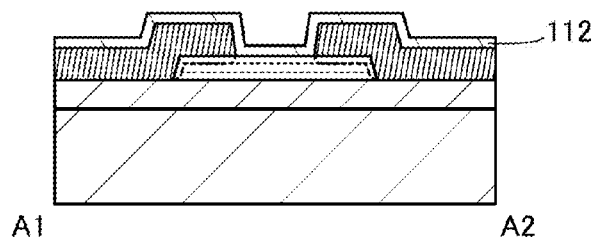

Next, the gate insulating film 112 is formed (see FIG. 19B). The gate insulating film 112 may be formed by a sputtering method, a CVD method, an MBE method, an ALD method, or a PLD method.

Next, a conductive film to be the gate electrode 104 is formed. The conductive film to be the gate electrode 104 may be formed using a conductive film selected from the conductive films given as examples of the gate electrode 104. The conductive film to be the gate electrode 104 may be formed by a sputtering method, a CVD method, an MBE method, an ALD method, or a PLD method.

Figure 19C:
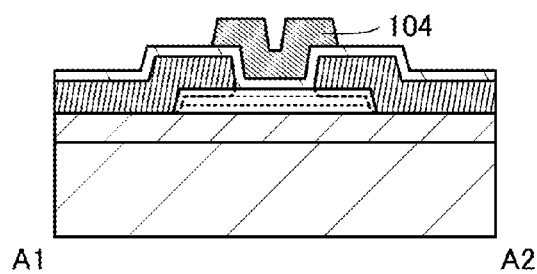

Next, the conductive film to be the gate electrode 104 is partly etched to form the gate electrode 104 (see FIG. 19C).

Next, the protective insulating film 108 is formed. The protective insulating film 108 may be formed by a sputtering method, a CVD method, an MBE method, an ALD method, or a PLD method.

Figure 19D:
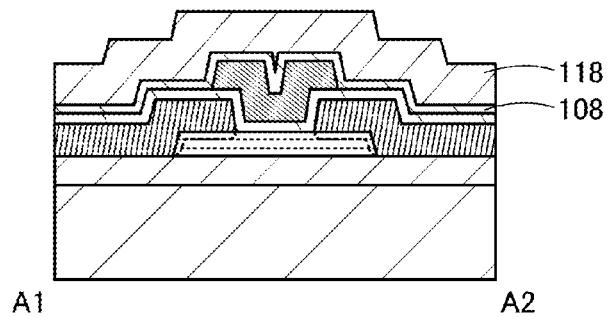

Next, the protective insulating film 118 is formed (see FIG. 19D). The protective insulating film 118 may be formed by a sputtering method, a CVD method, an MBE method, an ALD method, or a PLD method.

Next, third heat treatment is preferably performed. The third heat treatment may be performed under conditions selected from the conditions shown in the first heat treatment or may be performed at a temperature lower than those for the first heat treatment and the second heat treatment.

Through the above steps, the transistor illustrated in FIGS. 15A to 15C can be manufactured.

<Manufacturing Apparatus>

When the concentration of impurities in the oxide semiconductor layer 106b is low and the defect density is low (in other words, the oxide semiconductor layer 106b is a highly purified and intrinsic), the transistor has stable electrical characteristics. Moreover, the oxide semiconductor layer 106b with high crystallinity has electrical characteristics more stable than those of the oxide semiconductor layer 106b with an amorphous structure. A deposition apparatus for depositing the oxide semiconductor layer 106b with a low impurity concentration and high crystallinity is described below. The deposition apparatus described below can be used for formation of components other than transistors. With the use of the deposition apparatus, the impurity concentrations of other components can be reduced.

First, a structure of a deposition apparatus which allows the entry of few impurities at the time of deposition is described with reference to FIGS. 31A and 31B.

Figure 31A:
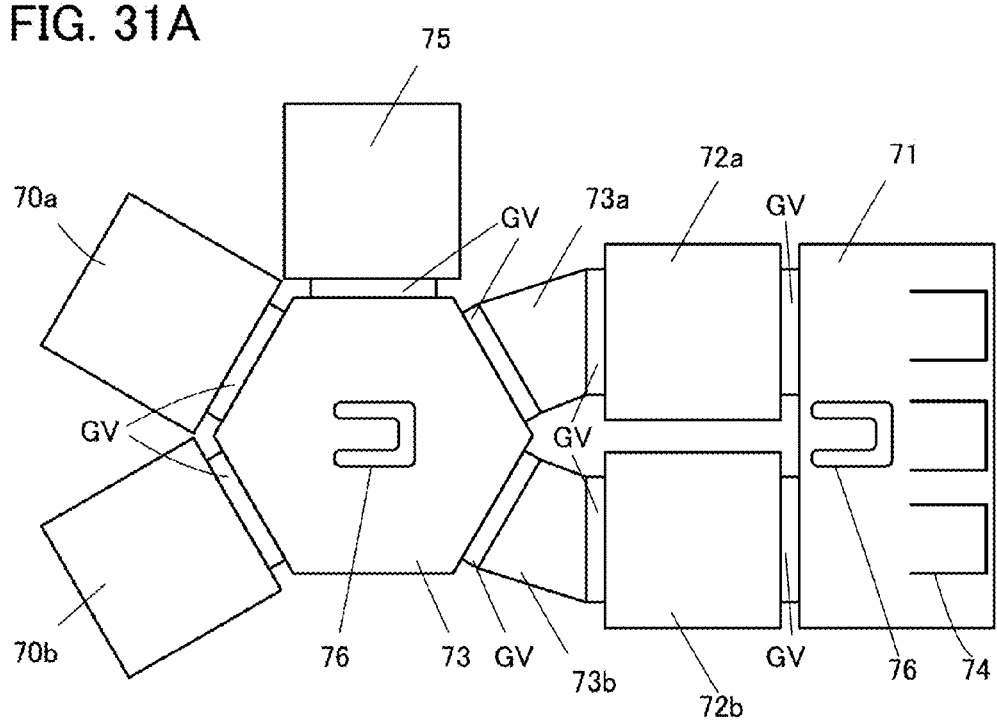
FIGS. 31A and 31B are top views each illustrating an example of a deposition apparatus.

FIG. 31A is a top view of a multi-chamber deposition apparatus. The deposition apparatus includes an atmosphere-side substrate supply chamber 71 provided with three cassette ports 74 for holding substrates, a load lock chamber 72a, an unload lock chamber 72b, a transfer chamber 73, a transfer chamber 73a, a transfer chamber 73b, a substrate heating chamber 75, a deposition chamber 70a, and a deposition chamber 70b. The atmosphere-side substrate supply chamber 71 is connected to the load lock chamber 72a and the unload lock chamber 72b. The load lock chamber 72a and the unload lock chamber 72b are connected to the transfer chamber 73 through the transfer chamber 73a and the transfer chamber 73b, respectively. The substrate heating chamber 75, the deposition chamber 70a, and the deposition chamber 70b are connected only to the transfer chamber 73. Gate valves (GV) are provided for connecting portions between chambers so that each chamber except the atmosphere-side substrate supply chamber 71 can be independently kept under vacuum. Moreover, the atmosphere-side substrate supply chamber 71 and the transfer chamber 73 each include one or more substrate transfer robots 76, with which a substrate can be transferred. Here, it is preferable that the substrate heating chamber 75 also serve as a plasma treatment chamber. With a multi-chamber deposition apparatus, it is possible to transfer a substrate without exposure to the air between treatment and treatment, and adsorption of impurities to a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and can be determined as appropriate depending on the space for placement or the process.

Figure 31B:
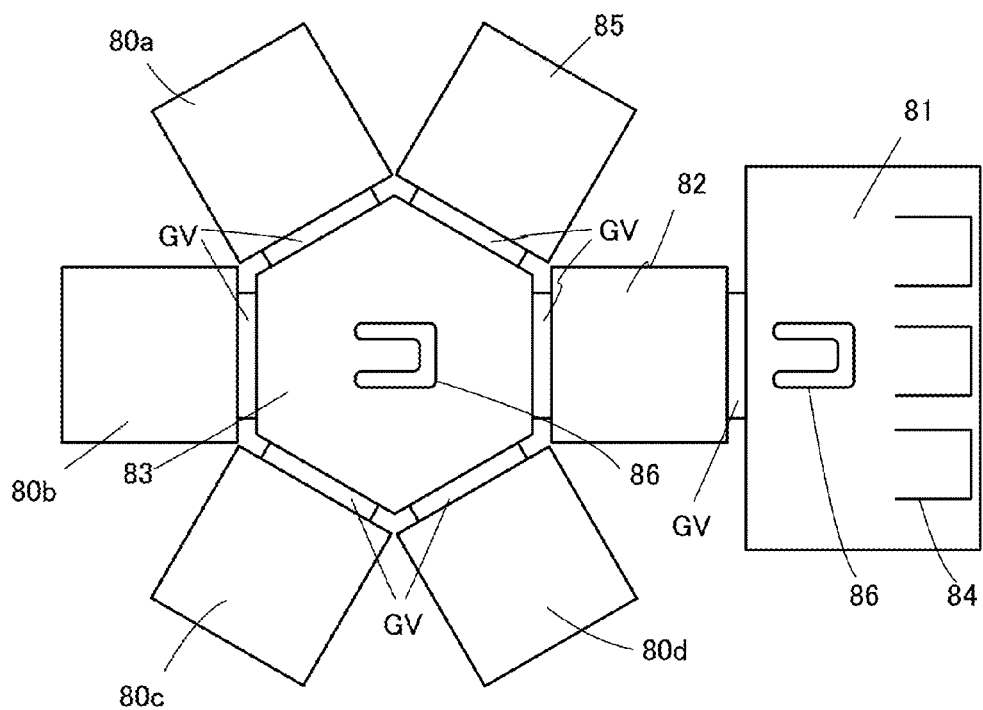

FIG. 31B is a top view of a multi-chamber deposition apparatus having a structure different from that illustrated in FIG. 31A. The deposition apparatus includes an atmosphere-side substrate supply chamber 81 including cassette ports 84, a load/unload lock chamber 82, a transfer chamber 83, a substrate heating chamber 85, substrate transfer robots 86, a deposition chamber 80a, a deposition chamber 80b, a deposition chamber 80c, and a deposition chamber 80d. The atmosphere-side substrate supply chamber 81, the substrate heating chamber 85, the deposition chamber 80a, the deposition chamber 80b, the deposition chamber 80c, and the deposition chamber 80d are connected to one another through the transfer chamber 83.

Here, an example of the deposition chamber (sputtering chamber) illustrated in FIG. 31B is described with reference to FIG. 32A. The deposition chamber 80b includes a target 87, an attachment protection plate 88, and a substrate stage 90, for example. Note that here, a glass substrate 89 is set on the substrate stage 90. Although not illustrated, the substrate stage 90 may include a substrate holding mechanism which holds the glass substrate 89, a rear heater which heats the glass substrate 89 from the back surface, or the like. The attachment protection plate 88 can suppress deposition of a particle which is sputtered from the target 87 on a region where deposition is not needed.

Figure 32A:
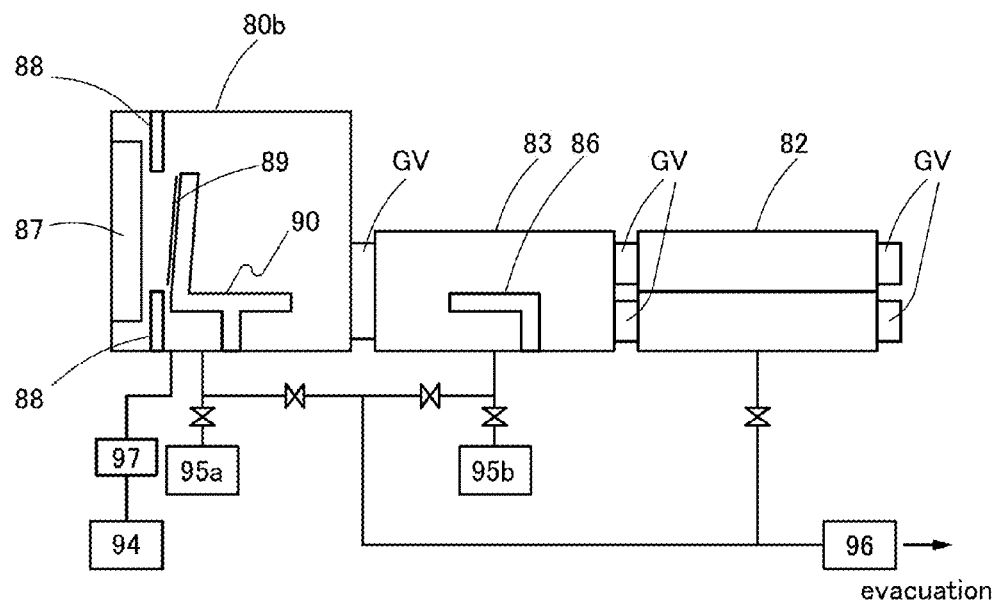
FIGS. 32A and 32B are cross-sectional views each illustrating an example of a deposition chamber.

The deposition chamber 80b illustrated in FIG. 32A is connected to a refiner 94 through a mass flow controller 97. Note that although the refiner 94 and the mass flow controller 97 are provided in accordance with the number of kinds of gases, only one refiner 94 and one mass flow controller 97 are illustrated for simplicity. As a gas introduced to the deposition chamber 80b or the like, a gas whose dew point is lower than or equal to −80° C., preferably lower than or equal to −100° C., more preferably lower than or equal to −120° C. is used. With the use of an oxygen gas, a rare gas (e.g., an argon gas), or the like whose dew point is low, moisture entering a film at the time of deposition can be reduced.

Note that a vacuum pump 96 may be, for example, a pump in which a dry pump and a mechanical booster pump are connected in series. With such a structure, the deposition chamber 80b and the transfer chamber 83 are evacuated from atmospheric pressure to a low vacuum (about 0.1 Pa to 10 Pa) by the vacuum pump 96, and then evacuated from the low vacuum to a high vacuum ($1 \times 10^{-7}$ Pa to $1 \times 10^{-4}$ Pa) by a cryopump 95a or 95b after the valves are switched.

Next, another example of the deposition chamber illustrated in FIG. 31B is described with reference to FIG. 32B.

Figure 32B:
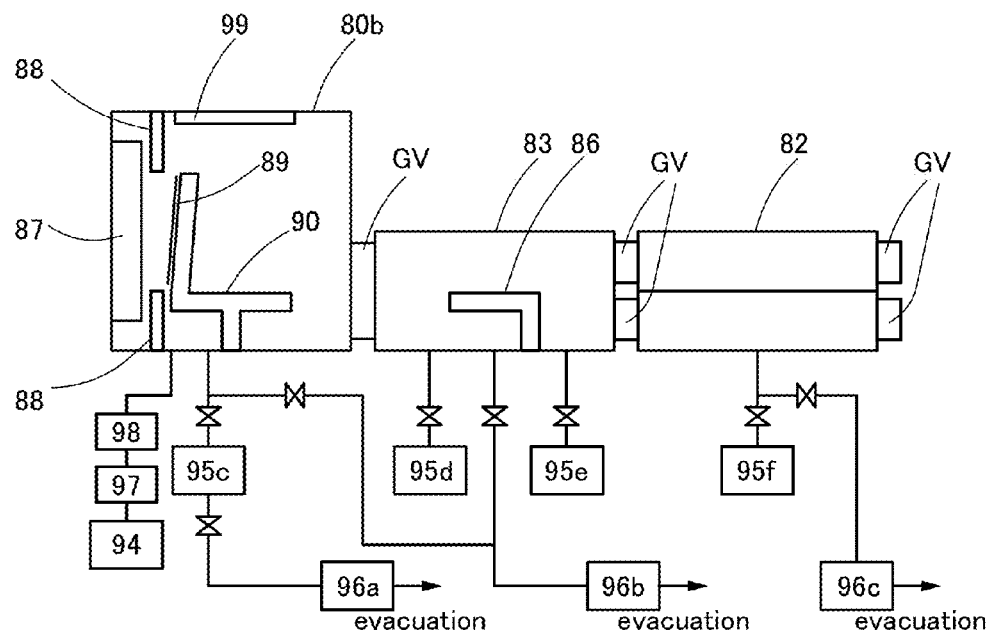

The deposition chamber 80b illustrated in FIG. 32B is connected to the transfer chamber 83 through the gate valve, and the transfer chamber 83 is connected to the load/unload lock chamber 82 through the gate valves.

The deposition chamber 80b in FIG. 32B is connected to the mass flow controller 97 through a gas heating system 98, and the gas heating system 98 is connected to the refiner 94 through the mass flow controller 97. With the gas heating system 98, a gas used in the deposition chamber 80b can be heated to a temperature higher than or equal to 40° C. and lower than or equal to 400° C. or higher than or equal to 50° C. and lower than or equal to 200° C. Note that although the gas heating system 98, the refiner 94, and the mass flow controller 97 are provided in accordance with the number of kinds of gases, only one gas heating system 98, one refiner 94, and one mass flow controller 97 are provided for simplicity.

The deposition chamber 80b in FIG. 32B is connected to a turbo molecular pump 95c and a vacuum pump 96b each through a valve. Note that as an auxiliary pump, a vacuum pump 96a is provided for the turbo molecular pump 95c through a valve. The vacuum pump 96a and the vacuum pump 96b can have structures similar to that of the vacuum pump 96. In addition, the deposition chamber 80b in FIG. 32B is provided with a cryotrap 99.

It is known that the turbo molecular pump 95c is capable of stably evacuating a large-sized molecule (atom), needs low frequency of maintenance, and thus enables high productivity, whereas it has a low capability in evacuating hydrogen and water. Hence, the cryotrap 99 having a high capability in evacuating a molecule (atom) having a relatively high melting point, such as water, is connected to the deposition chamber 80b. The temperature of a refrigerator of the cryotrap 99 is set to be lower than or equal to 100 K, preferably lower than or equal to 80 K. When the cryotrap 99 includes a plurality of refrigerators, the refrigerators preferably have different temperatures, in which case efficient evacuation can be performed. For example, the temperatures of a first-stage refrigerator and a second-stage refrigerator may be set at 100 K or lower and 20 K or lower, respectively.

The transfer chamber 83 in FIG. 32B is connected to the vacuum pump 96b, a cryopump 95d, and a cryopump 95e each through a valve. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that regeneration of a cryopump refers to treatment for discharging molecules (atoms) entrapped in the cryopump. When molecules (or atoms) are entrapped too much in a cryopump, the evacuation capability of the cryopump is lowered; therefore, regeneration is performed regularly.

The load/unload lock chamber 82 in FIG. 32B is connected to a cryopump 95f and a vacuum pump 96c each through a valve. Note that the vacuum pump 96c may have a structure similar to that of the vacuum pump 96.

In the deposition chamber 80b, a target-facing-type sputtering apparatus may be employed. Note that a parallel-plate-type sputtering device or an ion beam sputtering apparatus may be provided in the deposition chamber 80b.

Next, an evacuation example of the substrate heating chamber in FIG. 31B is described with reference to FIG. 33.

Figure 33:
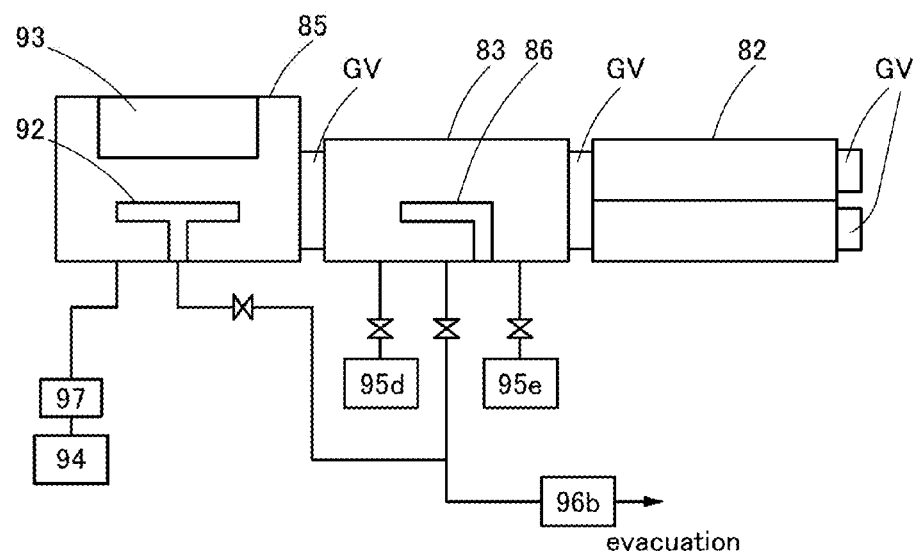
FIG. 33 illustrates an example of a heat treatment chamber.

The substrate heating chamber 85 illustrated in FIG. 33 is connected to the transfer chamber 83 through a gate valve. Note that the transfer chamber 83 is connected to the load/unload lock chamber 82 through a gate valve.

The substrate heating chamber 85 in FIG. 33 is connected to the refiner 94 through the mass flow controller 97. Note that although the refiner 94 and the mass flow controller 97 are provided in accordance with the number of kinds of gases, only one refiner 94 and one mass flow controller 97 are illustrated for simplicity. In addition, the substrate heating chamber 85 is connected to the vacuum pump 96b through a valve.

In addition, the substrate heating chamber 85 includes a substrate stage 92. At least one substrate is set on the substrate stage 92, and a substrate stage on which a plurality of substrates can be set may be used as the substrate stage 92. The substrate heating chamber 85 also includes a heating mechanism 93. The heating mechanism 93 may be the one using a resistance heater for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas. The RTA apparatus enables heat treatment in a short time; thus, the amount of bending of the substrate caused by the heat treatment can be reduced. In particular, in a large glass substrate, bending may cause a reduction in yield of a semiconductor device even in a small amount. Accordingly, the RTA apparatus is preferably used for heat treatment at a high temperature such that a substrate is bent.

Note that the back pressure of each of the deposition chamber 80*b* and the substrate heating chamber 85 is lower than or equal to $1\times10^{-4}$ Pa, preferably lower than or equal to $3\times10^{-5}$ Pa, further preferably lower than or equal to $1\times10^{-5}$ Pa. In each of the deposition chamber 80*b* and the substrate heating chamber 85, the partial pressure of a gas molecule (atom) having a mass-to-charge ratio (m/z) of 18 is lower than or equal to $3\times10^{-5}$ Pa, preferably lower than or equal to $1\times10^{-5}$ Pa, further preferably lower than or equal to $3\times10^{-6}$ Pa. In each of the deposition chamber 80*b* and the substrate heating chamber 85, the partial pressure of a gas molecule (atom) having a mass-to-charge ratio (m/z) of 28 is lower than or equal to $3\times10^{-5}$ Pa, preferably lower than or equal to $1\times10^{-5}$ Pa, further preferably lower than or equal to $3\times10^{-6}$ Pa. Moreover, in each of the deposition chamber 80*b* and the substrate heating chamber 85, the partial pressure of a gas molecule (atom) having a mass-to-charge ratio (m/z) of 44 is lower than or equal to $3\times10^{-5}$ Pa, preferably lower than or equal to $1\times10^{-5}$ Pa, further preferably lower than or equal to $3\times10^{-6}$ Pa.

Further, in each of the deposition chamber 80*b* and the substrate heating chamber 85, the leakage rate is less than or equal to $3\times10^{-6}$ Pa·m$^3$/s, preferably less than or equal to $1\times10^{-6}$ Pa·m$^3$/s. In each of the deposition chamber 80*b* and the substrate heating chamber 85, the leakage rate of a gas molecule (atom) having a mass-to-charge ratio (m/z) of 18 is less than or equal to $1\times10^{-7}$ Pa·m$^3$/s, preferably less than or equal to $3\times10^{-8}$ Pa·m$^3$/s. In each of the deposition chamber 80*b* and the substrate heating chamber 85, the leakage rate of a gas molecule (atom) having a mass-to-charge ratio (m/z) of 28 is less than or equal to $1\times10^{-5}$ Pa·m$^3$/s, preferably less than or equal to $1\times10^{-6}$ Pa·m$^3$/s. Moreover, in each of the deposition chamber 80*b* and the substrate heating chamber 85, the leakage rate of a gas molecule (atom) having a mass-to-charge ratio (m/z) of 44 is less than or equal to $3\times10^{-6}$ Pa·m$^3$/s, preferably less than or equal to $1\times10^{-6}$ Pa·m$^3$/s.

Note that the total pressure and the partial pressure in the vacuum chambers such as the deposition chamber, the substrate heating chamber, and the transfer chamber can be measured using a mass analyzer. For example, Qulee CGM-051, a quadrupole mass analyzer (also referred to as Q-mass) manufactured by ULVAC, Inc. may be used. Note that a leakage rate can be derived from the total pressure and partial pressure measured using the mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be lower than or equal to the above value.

When an adsorbate is present in the deposition chamber, the adsorbate does not affect the pressure in the deposition chamber because it is adsorbed onto an inner wall or the like; however, the adsorbate causes gas to be released when the inside of the deposition chamber is evacuated. Therefore, it is important that the adsorbate present in the deposition chamber be desorbed as much as possible with the use of a pump having high evacuation capability. Note that the deposition chamber may be baked to promote desorption of the adsorbate.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbate in the deposition chamber, and the impurities present in the deposition chamber can be reduced.

The rate of desorption of the adsorbate can be further increased also by dummy deposition. Here, the dummy deposition refers to deposition on a dummy substrate by a sputtering method or the like, in which a film is formed on the dummy substrate and the inner wall of the deposition chamber so that impurities in the deposition chamber and an adsorbate on the inner wall of the deposition chamber are confined in the film. As the dummy substrate, a substrate which releases a smaller amount of gas is preferably used, and for example, a substrate similar to the substrate 100 described later may be used. By performing dummy deposition, the concentration of impurities in a film to be formed later can be reduced. Note that the dummy deposition may be performed at the same time as the baking of the deposition chamber.

The oxide semiconductor layer 106*b* is formed with the use of the above deposition apparatus, so that the entry of impurities into the oxide semiconductor layer 106*b* can be suppressed. Further, a film in contact with the oxide semiconductor layer 106*b* is formed with the use of the above deposition apparatus, so that the entry of impurities into the oxide semiconductor layer 106*b* from the film in contact with the oxide semiconductor layer 106*b* can be suppressed.

Next, a method for successively depositing the oxide semiconductor layer 106*a*, the oxide semiconductor layer 106*b*, and the oxide semiconductor layer 106*c* using the above deposition apparatus is described.

First, the oxide semiconductor layer 106*a* is formed. As the heating temperature at the time of deposition increases, the concentration of impurities in the oxide semiconductor layer 106*a* decreases. Further, a substrate temperature at the time of deposition is higher than or equal to 150° C. and lower than or equal to 500° C., preferably higher than or equal to 170° C. and lower than or equal to 450° C., for example. The oxide semiconductor layer 106*a* is formed after the following steps: a substrate is transferred to the deposition chamber; a deposition gas is flown; and the deposition pressure is kept for longer than or equal to 10 seconds and shorter than or equal to 1000 seconds, preferably longer than or equal to 15 seconds and shorter than or equal to 720 seconds to be stabilized. The substrate is held for the above period of time in order to stabilize the pressure, whereby the amount of impurities entering the oxide semiconductor layer 106*a* at the time of the deposition can be reduced.

Then, the substrate is put into another deposition chamber, so that the oxide semiconductor layer 106*b* is formed. As the heating temperature at the time of deposition increases, the concentration of impurities in the oxide semiconductor layer 106*b* decreases. Further, a substrate temperature at the time of deposition is higher than or equal to 150° C. and lower than or equal to 500° C., preferably higher than or equal to 170° C. and lower than or equal to 450° C., for example. The oxide semiconductor layer 106*b* is formed after the following steps:

a substrate is transferred to the deposition chamber; a deposition gas is flown; and the deposition pressure is kept for longer than or equal to 10 seconds and shorter than or equal to 1000 seconds, preferably longer than or equal to 15 seconds and shorter than or equal to 720 seconds to be stabilized. The substrate is held for the above period of time in order to stabilize the pressure, whereby the amount of impurities entering the oxide semiconductor layer 106b at the time of the deposition can be reduced.

Next, the substrate is put into another deposition chamber, so that the oxide semiconductor layer 106c is formed. As the heating temperature at the time of deposition increases, the concentration of impurities in the oxide semiconductor layer 106c decreases. Further, a substrate temperature at the time of deposition is higher than or equal to 150° C. and lower than or equal to 500° C., preferably higher than or equal to 170° C. and lower than or equal to 450° C., for example. The oxide semiconductor layer 106c is formed after the following steps: a substrate is transferred to the deposition chamber; a deposition gas is flown; and the deposition pressure is kept for longer than or equal to 10 seconds and shorter than or equal to 1000 seconds, preferably longer than or equal to 15 seconds and shorter than or equal to 720 seconds to be stabilized. The substrate is held for the above period of time in order to stabilize the pressure, whereby the amount of impurities entering the oxide semiconductor layer 106c at the time of the deposition can be reduced.

Note that in the case where the oxide semiconductor layer 106a, the oxide semiconductor layer 106b, and the oxide semiconductor layer 106c are formed over a plurality of substrates, it is preferable that a rare gas, an oxygen gas, or the like be continuously supplied in a small amount even in a period during which the formation is not performed. In that case, the pressure of the deposition chamber can be kept high; thus, counter flow of impurities from the vacuum pump or the like can be reduced. Release of impurities from a pipe, another member, or the like can be suppressed. Accordingly, entry of impurities into the oxide semiconductor layer 106a, the oxide semiconductor layer 106b, and the oxide semiconductor layer 106c can be reduced. For example, the flow rate of argon is greater than or equal to 1 sccm and less than or equal to 500 sccm, preferably greater than or equal to 2 sccm and less than or equal to 200 sccm, further preferably greater than or equal to 5 sccm and less than or equal to 100 sccm.

Next, heat treatment is performed. The heat treatment is performed in an inert atmosphere or an oxidizing atmosphere. The heat treatment may be performed under a reduced pressure. The heat treatment can decrease the impurity concentration of the oxide semiconductor layer 106a, the oxide semiconductor layer 106b, and the oxide semiconductor layer 106c.

The heat treatment is preferably performed in such a manner that heat treatment is performed in an inert atmosphere, and then the atmosphere is switched to an oxidation atmosphere with the temperature maintained, and heat treatment is further performed. When the heat treatment is performed in an inert atmosphere, the concentration of impurities in the oxide semiconductor layer 106a, the oxide semiconductor layer 106b, and the oxide semiconductor layer 106c can be reduced; however, oxygen vacancies are caused at the same time in some cases. By the heat treatment in an oxidation atmosphere, the caused oxygen vacancies can be reduced.

The concentration of hydrogen in each of the oxide semiconductor layer 106a, the oxide semiconductor layer 106b, and the oxide semiconductor layer 106c that are obtained in this manner, which is measured by SIMS, is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

The concentration of carbon in each of the oxide semiconductor layer 106a, the oxide semiconductor layer 106b, and the oxide semiconductor layer 106c measured by SIMS is set to be lower than $5\times10^{19}$ atoms/cm$^3$, preferably lower than or equal to $5\times10^{18}$ atoms/cm$^3$, further preferably lower than or equal to $2\times10^{18}$ atoms/cm$^3$, still further preferably lower than or equal to $5\times10^{17}$ atoms/cm$^3$.

The oxide semiconductor layer 106a, the oxide semiconductor layer 106b, and the oxide semiconductor layer 106c are formed as described above, whereby the crystallinity of the oxide semiconductor layer 106b can be improved, and the concentrations of impurities in the oxide semiconductor layer 106a, the oxide semiconductor layer 106b, and the oxide semiconductor layer 106c and at the interface between the oxide semiconductor layer 106a and the oxide semiconductor layer 106b and the interface between the oxide semiconductor layer 106b and the oxide semiconductor layer 106c can be reduced.

<Transistor Structure (2)>

Next, an example of a top-gate and top-contact transistor having a structure different from that of the transistor structure (1) is described.

Figure 20A:
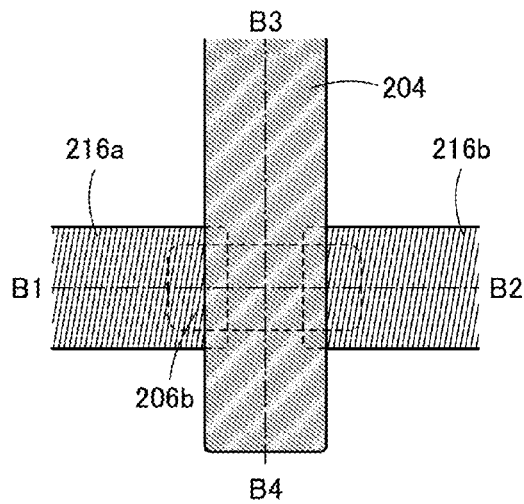
FIGS. 20A to 20C are a top view and cross-sectional views illustrating an example of a transistor of one embodiment of the present invention.
Figure 20C:
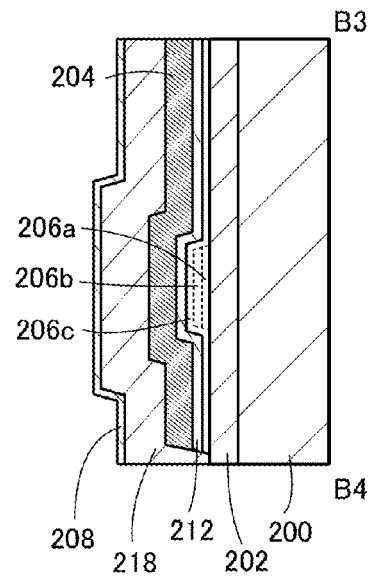
Figure 20B:
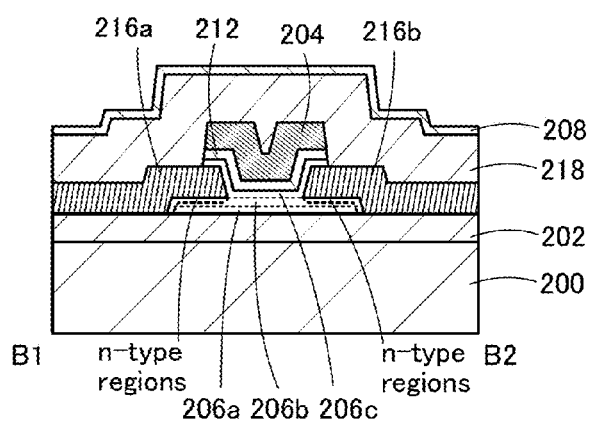

FIGS. 20A to 20C are a top view and cross-sectional views of the transistor. FIG. 20A is a top view of the transistor. FIG. 20B is the cross-sectional view taken along dashed-dotted line B1-B2 in FIG. 20A. FIG. 20C is the cross-sectional view taken along dashed-dotted line B3-B4 in FIG. 20A.

The transistor illustrated in FIG. 20B includes a base insulating film 202 over a substrate 200, an oxide semiconductor layer 206a over the base insulating film 202, an oxide semiconductor layer 206b over the oxide semiconductor layer 206a, a source electrode 216a and a drain electrode 216b in contact with the oxide semiconductor layer 206b, an oxide semiconductor layer 206c over the oxide semiconductor layer 206b and the source electrode 216a and the drain electrode 216b, a gate insulating film 212 over the oxide semiconductor layer 206c, and a gate electrode 204 over the gate insulating film 212. Preferably, a protective insulating film 218 is formed over the gate insulating film 212 and the gate electrode 204, and a protective insulating film 208 is formed over the protective insulating film 218. Note that the transistor does not necessarily include the base insulating film 202.

Figure 21A:
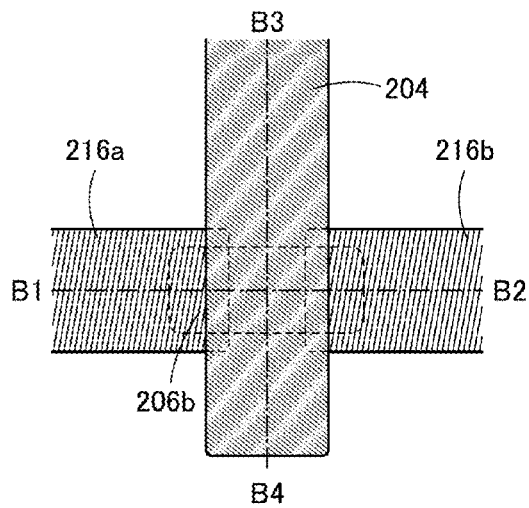
FIGS. 21A to 21C are a top view and cross-sectional views illustrating an example of a transistor of one embodiment of the present invention.
Figure 21C:
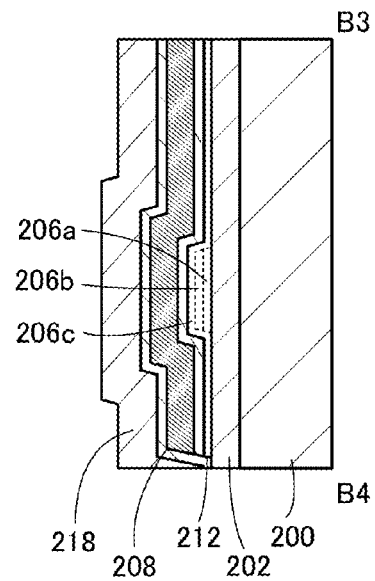
Figure 21B:
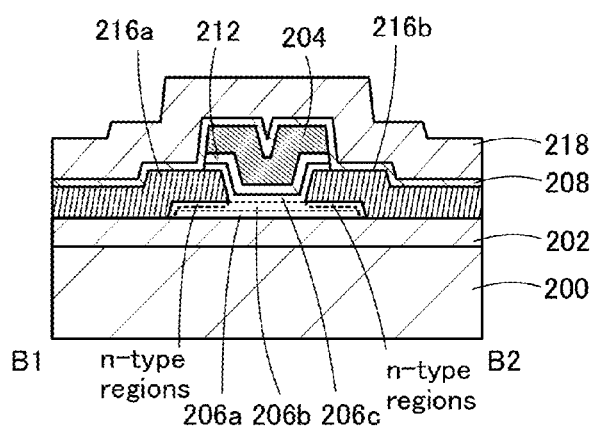

Note that the transistor illustrated in FIG. 20B may have a structure in which the stacking order of the protective insulating film 208 and the protective insulating film 218 is reversed (see FIGS. 21A to 21C). In the transistor illustrated in FIGS. 21A to 21C, in some cases, outward diffusion of excess oxygen released from the base insulating film 202 is less likely to occur than in the transistor illustrated in FIGS. 20A to 20C. Thus, there is a possibility that oxygen vacancies in the oxide semiconductor layer 206a, the oxide semiconductor layer 206b, and the oxide semiconductor layer 206c can be reduced (DOS can be reduced) more than those in the transistor illustrated in FIGS. 20A to 20C.

The oxide semiconductor layer 206a of the transistor in FIGS. 20A to 20C corresponds to the oxide semiconductor layer (S1) in FIGS. 1A and 1B, for example. The oxide semiconductor layer 206b of the transistor in FIGS. 20A to 20C corresponds to the oxide semiconductor layer (S2) in FIGS. 1A and 1B, for example. The oxide semiconductor layer 206c of the transistor in FIGS. 20A to 20C corresponds to the oxide semiconductor layer (S3) in FIGS. 1A and 1B, for example.

The base insulating film 202 of the transistor in FIGS. 20A to 20C corresponds to the gate insulating film (bg) of the transistor in FIG. 5A, for example. In addition, the transistor in FIGS. 20A to 20C may include the gate electrode (bg) of the transistor in FIG. 5A, for example. The transistor in FIGS. 20A to 20C may include a back gate electrode that is opposite to the gate electrode 204 and is in contact with the bottom surface of the base insulating film 202, for example. In addition, in the transistor in FIGS. 20A to 20C, if the substrate 200 has conductivity, the substrate 200 can correspond to the gate insulating film (bg) of the transistor in FIG. 5A, for example. In the transistor in FIGS. 20A to 20C, if a conductive film serving as a wiring or the like is provided below the base insulating film 202, the conductive film can correspond to the gate insulating film (bg) of the transistor in FIG. 5A, for example.

In the example illustrated in FIGS. 20A to 20C, the gate electrode 204, the gate insulating film 212, and the oxide semiconductor layer 206c have substantially the same top shapes (shapes in the top view illustrated), but the present invention is not limited to the example. For example, the oxide semiconductor layer 206c and/or the gate insulating film 212 may be provided outside the gate electrode 204.

Note that a conductive film used for the source electrode 216a and the drain electrode 216b takes oxygen away from part of the oxide semiconductor layer 206b or forms a mixed layer depending on its kind, which in some cases results in formation of n-type regions in the oxide semiconductor layer 206b.

Note that as illustrated in the top view of FIG. 20A, the oxide semiconductor layer 206b is provided outside the gate electrode 204. However, the oxide semiconductor layer 206b may be provided inside the gate electrode 204. With such a structure, when light irradiation is performed from the gate electrode 204 side, generation of carriers in the oxide semiconductor layer 206b due to light can be suppressed. In other words, the gate electrode 204 functions as a light-blocking film.

The positions of the protective insulating film 218 and the protective insulating film 208 may be reversed. For example, the protective insulating film 218 may be provided over the protective insulating film 208.

For the oxide semiconductor layer 206a, the oxide semiconductor layer 206b, and the oxide semiconductor layer 206c, the description of the oxide semiconductor layer 106a, that of the oxide semiconductor layer 106b, and that of the oxide semiconductor layer 106c are referred to, respectively. For the base insulating film 202, the description of the base insulating film 102 is referred to. For the source electrode 216a and the drain electrode 216b, the description of the source electrode 116a and the drain electrode 116b is referred to. For the gate insulating film 212, the description of the gate insulating film 112 is referred to. For the gate electrode 204, the description of the gate electrode 104 is referred to. For the protective insulating film 218, the description of the protective insulating film 118 is referred to. For the protective insulating film 208, the description of the protective insulating film 108 is referred to. For the substrate 200, the description of the substrate 100 is referred to.

<Manufacturing Method of Transistor Structure (2)>

An example of a manufacturing method of the transistor structure (2) is described below.

FIGS. 22A to 22D and FIGS. 23A to 23D are cross-sectional views corresponding to FIG. 20B.

First, the substrate 200 is prepared.

Next, the base insulating film 202 is formed. For the formation method of the base insulating film 202, the description of the base insulating film 102 is referred to.

Figure 22A:
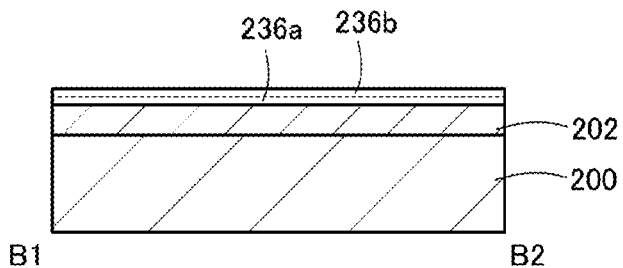
FIGS. 22A to 22D are cross-sectional views illustrating an example of a manufacturing method of a transistor of one embodiment of the present invention.

Next, the oxide semiconductor layer 236a and the oxide semiconductor layer 236b are formed in this order (see FIG. 22A). For the formation method of the oxide semiconductor layer 236a and the oxide semiconductor layer 236b, the description of the oxide semiconductor layer 136a and the oxide semiconductor layer 136b is referred to.

Next, first heat treatment is preferably performed. For the first heat treatment, the description of the manufacturing method of the transistor structure (1) is referred to.

Figure 22B:
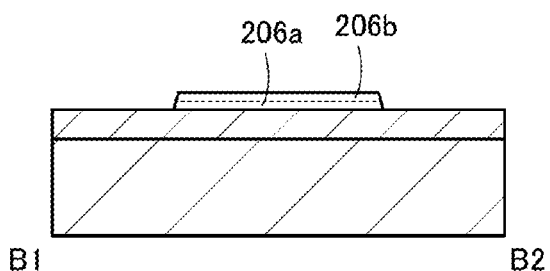

Then, the oxide semiconductor layer 236a and the oxide semiconductor layer 236b are partly etched to form the oxide semiconductor layer 206a and the oxide semiconductor layer 206b that have island shapes (see FIG. 22B).

Figure 22C:
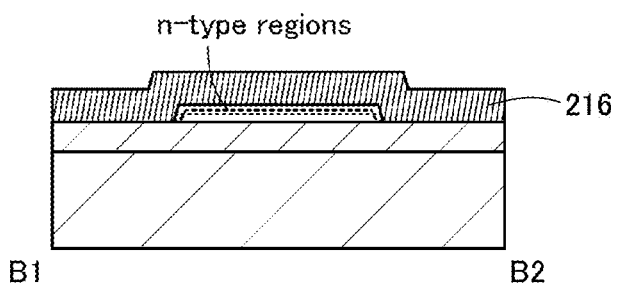
Figure 22D:
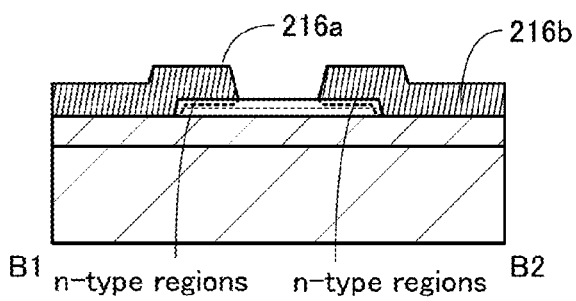

Next, a conductive film 216 is formed (see FIG. 22C). For the formation method of the conductive film 216, the description of the conductive film 116 is referred to.

Next, the conductive film 216 is partly etched to form the source electrode 216a and the drain electrode 216b.

Next, second heat treatment is preferably performed. For the second heat treatment, the description of the manufacturing method of the transistor structure (1) is referred to. By the second heat treatment, the n-type region where the oxide semiconductor layer 206b is exposed can be turned into an i-type region (see FIG. 22D).

Figure 23A:
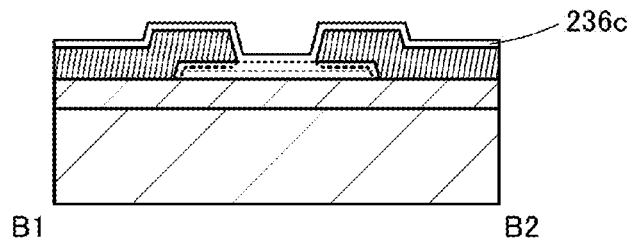
FIGS. 23A to 23D are cross-sectional views illustrating an example of a manufacturing method of a transistor of one embodiment of the present invention.

Then, an oxide semiconductor layer 236c is formed (see FIG. 23A). For the formation method of the oxide semiconductor layer 236c, the description of the oxide semiconductor layer 136c is referred to.

Next, an insulating film 242 is formed. For the formation method of the insulating film 242, the description of the gate insulating film 112 is referred to.

The insulating film 242 can be formed by a plasma CVD method, for example. By the CVD method, a denser insulating film having a lower density of defects can be provided, as a substrate temperature gets higher. Because the insulating film 242 after being processed serves as the gate insulating film 212, a transistor can have more stable electrical characteristics, as the insulating film 242 gets denser and density of defects thereof gets lower. On the other hand, when the base insulating film 202 contains excess oxygen, a transistor can have stable electrical characteristics. However, by raising the substrate temperature when the base insulating film 202 is exposed, oxygen is released from the base insulating film 202, so that excess oxygen is reduced. Here, because the base insulating film 202 is covered with the oxide semiconductor layer 236c at the time of formation of the insulating film 242, oxygen can be prevented from being released from the base insulating film 202. Therefore, the insulating film 242 can be dense and have a low density of defects, without reducing excess oxygen contained in the base insulating film 202. For this reason, the reliability of the transistor can be improved.

Figure 23B:
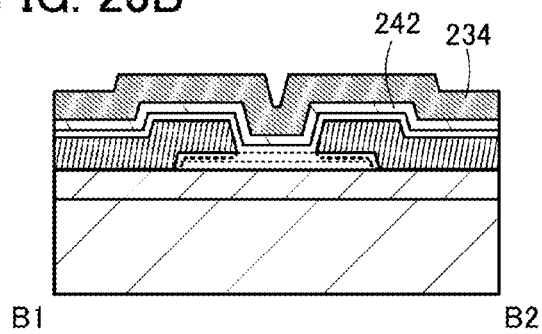

Next, a conductive film 234 is formed (see FIG. 23B). For the formation method of the conductive film 234, the description of the conductive film to be the gate electrode 104 is referred to.

Figure 23C:
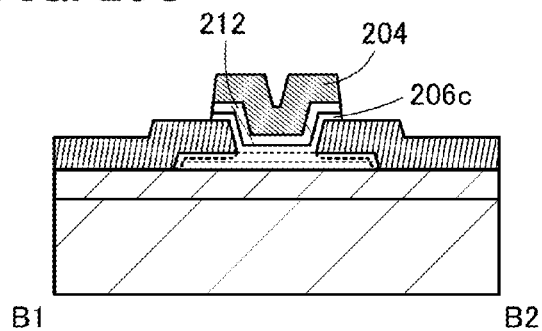

Then, the oxide semiconductor layer 236c, the insulating film 242, and the conductive film 234 are partly etched to form the oxide semiconductor layer 206c, the gate insulating film 212, and the gate electrode 204 (see FIG. 23C).

Next, the protective insulating film 218 is formed. For the formation method of the protective insulating film 218, the description of the protective insulating film 118 is referred to.

Figure 23D:
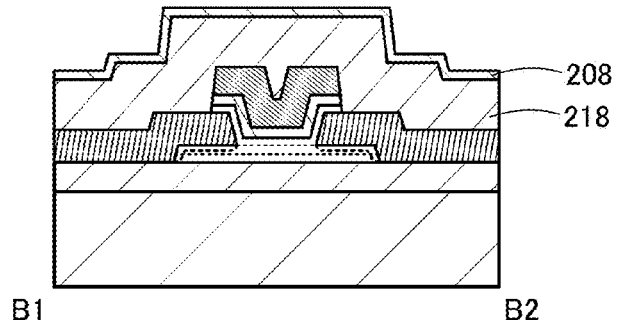

Next, the protective insulating film 208 is formed (see FIG. 23D). For the formation method of the protective insulating film 208, the description of the protective insulating film 108 is referred to.

Next, third heat treatment is preferably performed. For the third heat treatment, the description of the manufacturing method of the transistor structure (1) is referred to.

Through the above steps, the transistor illustrated in FIGS. 20A to 20C can be manufactured.

<Transistor Structure (3)>

Next, an example of a bottom-gate top-contact transistor is described.

Figure 24A:
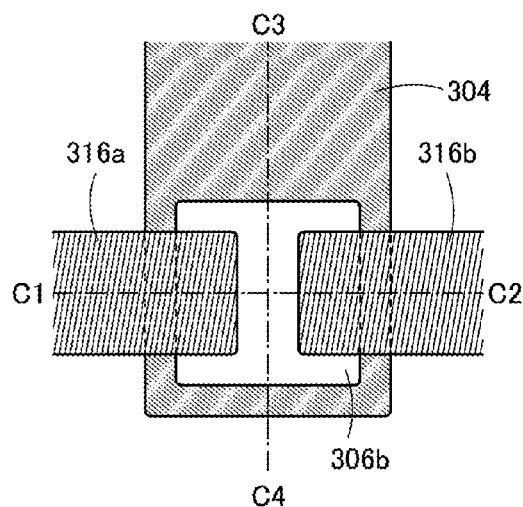
FIGS. 24A to 24D are a top view and cross-sectional views illustrating an example of a transistor of one embodiment of the present invention.
Figure 24B:
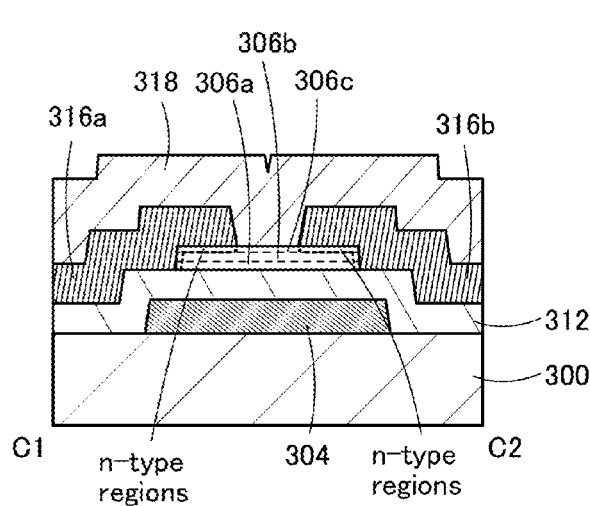
Figure 24C:
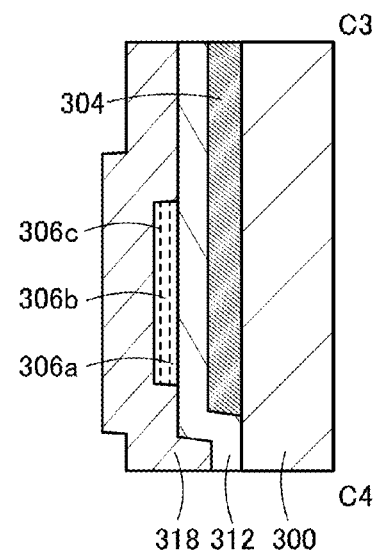

FIGS. 24A to 24D are a top view and cross-sectional views of the transistor. FIG. 24A is a top view of the transistor. FIG. 24B is the cross-sectional view taken along dashed-dotted line C1-C2 in FIG. 24A. FIG. 24C is the cross-sectional view taken along dashed-dotted line C3-C4 in FIG. 24A.

The transistor illustrated in FIG. 24B includes a gate electrode 304 over a substrate 300, a gate insulating film 312 over the gate electrode 304, an oxide semiconductor layer 306a over the gate insulating film 312, an oxide semiconductor layer 306b over the oxide semiconductor layer 306a, an oxide semiconductor layer 306c over the oxide semiconductor layer 306b, and a source electrode 316a and a drain electrode 316b in contact with the oxide semiconductor layer 306c. A protective insulating film 318 is preferably provided over the oxide semiconductor layer 306c, and the source electrode 316a and the drain electrode 316b.

The protective insulating film 318 of the transistor in FIGS. 24A to 24D corresponds to the gate insulating film (bg) of the transistor in FIG. 5A, for example. In addition, the transistor in FIGS. 24A to 24D may include the gate electrode (bg) of the transistor in FIG. 5A, for example. The transistor in FIGS. 24A to 24D may include a back gate electrode that is opposite to the gate electrode 304 and is in contact with the top surface of the protective insulating film 318, for example. In the transistor in FIGS. 24A to 24D, if a conductive film serving as a wiring or the like is provided over the protective insulating film 318, the conductive film can correspond to the gate insulating film (bg) of the transistor in FIG. 5A, for example.

Note that a conductive film used for the source electrode 316a and the drain electrode 316b takes oxygen away from part of the oxide semiconductor layer 306b and part of the oxide semiconductor layer 306c or forms a mixed layer depending on its kind, which in some cases results in formation of n-type regions (low-resistance regions) in the oxide semiconductor layer 306b and the oxide semiconductor layer 306c.

Note that as illustrated in FIG. 24A, the gate electrode 304 is provided such that the edge of the oxide semiconductor layer 306b is located on the inner side of the edge of the gate electrode 304 in the top view. With such a structure, when light irradiation is performed from the gate electrode 304 side, generation of carriers in the oxide semiconductor layer 306b due to light can be suppressed. In other words, the gate electrode 304 functions as a light-blocking film. Note that the oxide semiconductor layer 306b may be provided outside the gate electrode 304.

For the oxide semiconductor layer 306a, the oxide semiconductor layer 306b, and the oxide semiconductor layer 306c, the description of the oxide semiconductor layer 106c, that of the oxide semiconductor layer 106b, and that of the oxide semiconductor layer 106a are referred to, respectively. In other words, the bottom-gate and top-contact transistor has a reverse stacked-layer structure of the top-gate and top-contact transistor.

The protective insulating film 318 may be formed to have a single-layer structure or a stacked-layer structure using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The protective insulating film 318 may be, for example, a multilayer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon nitride layer, a silicon nitride layer from which a hydrogen gas and an ammonia gas are less likely to be released is used. The amount of released hydrogen gas or ammonia gas may be measured by TDS. Further, as the silicon nitride layer, a silicon nitride layer which does not transmit or hardly transmits hydrogen, water, and oxygen is used.

Figure 24D:
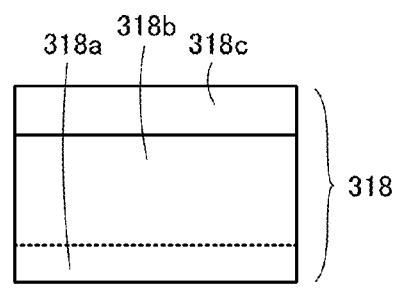

Alternatively, the protective insulating film 318 may be, for example, a multilayer film including a first silicon oxide layer 318a as a first layer, a second silicon oxide layer 318b as a second layer, and a silicon nitride layer 318c as a third layer (see FIG. 24D). In that case, the first silicon oxide layer 318a and/or the second silicon oxide layer 318b may be a silicon oxynitride layer. In addition, the silicon nitride layer may be a silicon nitride oxide layer. As the first silicon oxide layer 318a, a silicon oxide layer whose defect density is low is preferably used. Specifically, a silicon oxide layer whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide layer 318b, a silicon oxide layer containing excess oxygen is used. As the silicon nitride layer 318c, a silicon nitride layer from which a hydrogen gas and an ammonia gas are less likely to be released is used. Further, as the silicon nitride layer 318c, a silicon nitride layer which does not transmit or hardly transmits hydrogen, water, and oxygen is used.

The silicon oxide layer containing excess oxygen means a silicon oxide layer from which oxygen can be released by heat treatment or the like. An insulating film containing excess oxygen means an insulating film from which oxygen is released by heat treatment.

The insulating film containing excess oxygen is capable of reducing oxygen vacancies in the oxide semiconductor layer 306b. Such an oxygen vacancy forms DOS in the oxide semiconductor layer 306b and serves as a hole trap or the like. Thus, by a reduction in the number of oxygen vacancies in the oxide semiconductor layer 306b, the transistor can have stable electrical characteristics.

For the source electrode 316a and the drain electrode 316b, the description of the source electrode 116a and the drain electrode 116b is referred to. For the gate insulating film 312, the description of the gate insulating film 112 is referred to. For the gate electrode 304, the description of the gate electrode 104 is referred to. For the substrate 300, the description of the substrate 100 is referred to.

<Manufacturing Method of Transistor Structure (3)>

An example of a manufacturing method of the transistor structure (3) is described below.

FIGS. 25A to 25D are cross-sectional views corresponding to FIG. 24B.

First, the substrate 300 is prepared.

Next, a conductive film to be the gate electrode 304 is formed. For the formation method of the conductive film to be the gate electrode 304, the description of the conductive film to be the gate electrode 104 is referred to.

Next, the conductive film to be the gate electrode 304 is partly etched to form the gate electrode 304.

Next, the gate insulating film 312 is formed. For the formation method of the gate insulating film 312, the description of the gate insulating film 112 is referred to.

The gate insulating film 312 can be formed by a plasma CVD method, for example. By the CVD method, a denser insulating film having a lower density of defects can be provided, as a substrate temperature gets higher. A transistor can have more stable electrical characteristics, as the gate insulating film 312 gets denser and density of defects thereof gets lower.

Figure 25A:
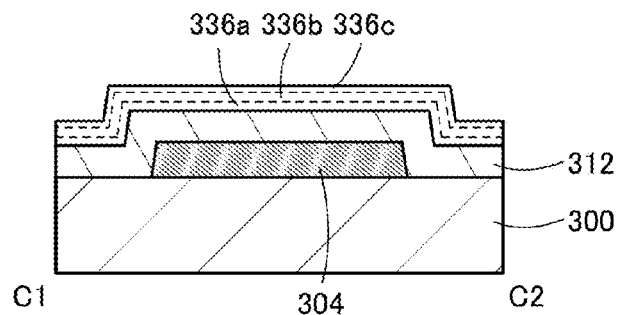
FIGS. 25A to 25D are cross-sectional views illustrating an example of a manufacturing method of a transistor of one embodiment of the present invention.

Next, an oxide semiconductor layer 336a, an oxide semiconductor layer 336b, and an oxide semiconductor layer 336c are formed in this order (see FIG. 25A). For the oxide semiconductor layer 336a, the oxide semiconductor layer 336b, and the oxide semiconductor layer 336c, the description of the oxide semiconductor layer 136c, that of the oxide semiconductor layer 136b, and that of the oxide semiconductor layer 136a are referred to, respectively.

Next, first heat treatment is preferably performed. For the first heat treatment, the description of the manufacturing method of the transistor structure (1) is referred to.

Figure 25B:
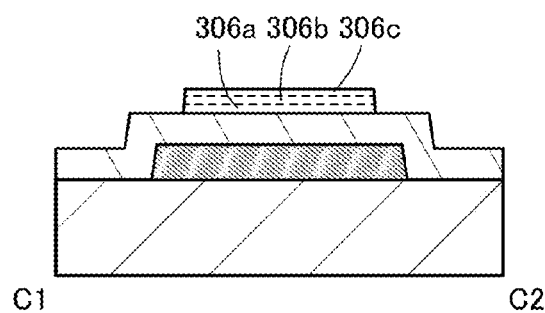
Figure 25C:
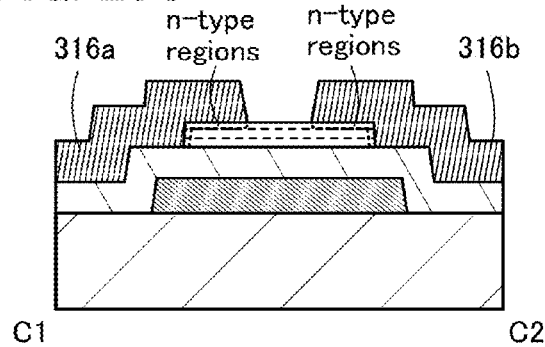

Next, the oxide semiconductor layer 336a, the oxide semiconductor layer 336b, and the oxide semiconductor layer 336c are partly etched to form the oxide semiconductor layer 306a, the oxide semiconductor layer 306b, and the oxide semiconductor layer 306c that have island shapes (see FIG. 25B).

Then, a conductive film to be the source electrode 316a and the drain electrode 316b is formed. For the formation method of the conductive film to be the source electrode 316a and the drain electrode 316b, the description of the conductive film 116 is referred to. At this time, n-type regions are in some cases formed in regions represented by broken lines in the oxide semiconductor layer 306c. The n-type regions are formed resulting from generation of oxygen vacancies in the oxide semiconductor layer 306c due to damages when the conductive film is formed over the oxide semiconductor layer 306c or action of the conductive film. For example, due to entry of hydrogen into the site of oxygen vacancies, an electron serving as a carrier is generated. Note that the n-type regions are formed up to the vicinity of the boundary between the oxide semiconductor layer 306c and the oxide semiconductor layer 306b as a non-limiting example. For example, the n-type regions may be formed in the oxide semiconductor layer 306c and the oxide semiconductor layer 306b, or only in the oxide semiconductor layer 306c.

Next, the conductive film to be the source electrode 316a and the drain electrode 316b is partly etched to form the source electrode 316a and the drain electrode 316b.

Next, second heat treatment is preferably performed. For the second heat treatment, the description of the manufacturing method of the transistor structure (1) is referred to. By the second heat treatment, the n-type region where the oxide semiconductor layer 306c and/or the oxide semiconductor layer 306b is exposed can be turned into an i-type region (see FIG. 25C).

Figure 25D:
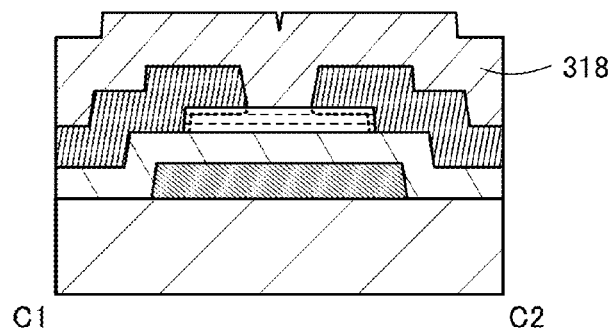

Next, the protective insulating film 318 is formed (see FIG. 25D).

Here, the case where the protective insulating film 318 has a three-layer structure as illustrated in FIG. 24D is described. First, the first silicon oxide layer 318a is formed, and then the second silicon oxide layer 318b is formed. Next, treatment for adding oxygen ions into the second silicon oxide layer 318b may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, the silicon nitride layer 318c is formed, so that the protective insulating film 318 is formed.

The first silicon oxide layer 318a is preferably formed by a plasma CVD method which is one type of CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon and an oxidizing gas are used; and the pressure is set to be higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

By setting the flow rate of the oxidizing gas to 100 times or more the flow rate of the deposition gas containing silicon, the hydrogen content of the first silicon oxide layer 318a can be reduced and dangling bonds can be reduced.

In the above manner, the first silicon oxide layer 318a with a low defect density is formed. That is, the spin density of the first silicon oxide layer 318a, which is attributed to a signal with a g factor of 2.001 in ESR, can be lower than or equal to $3\times10^{17}$ spins/cm$^3$ or lower than or equal to $5\times10^{16}$ spins/cm$^3$.

The second silicon oxide layer 318b is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode under the following conditions: the substrate temperature is set to be higher than or equal to 160° C. and lower than or equal to 350° C., preferably higher than or equal to 180° C. and lower than or equal to 260° C.; a deposition gas containing silicon and an oxidizing gas are used; and the pressure is set to be higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the second silicon oxide layer 318b containing excess oxygen can be formed.

The silicon nitride layer 318c is preferably formed by a plasma CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is set to be higher than or equal to 20 Pa and lower than or equal to 250 Pa, preferably higher than or equal to 40 Pa and lower than or equal to 200 Pa.

Note that the flow rate of the nitrogen gas is 5 to 50 times, preferably 10 to 50 times as high as that of the ammonia gas. The use of the ammonia gas facilitates decomposition of the deposition gas containing silicon and the nitrogen gas. This is because an ammonia gas is dissociated by plasma energy or heat energy, and energy generated by the dissociation contributes to decomposition of a molecular bond of the deposition gas containing silicon and a molecular bond of the nitrogen gas.

Through the above method, the silicon nitride layer 318c from which the hydrogen gas and the ammonia gas are less likely to be released can be formed. The silicon nitride layer 318c has a low hydrogen content, and thus is dense and does not transmit or hardly transmits hydrogen, water, and oxygen.

In the above manner, the protective insulating film 318 may be formed.

Next, third heat treatment is preferably performed. For the third heat treatment, the description of the manufacturing method of the transistor structure (1) is referred to.

Through the above steps, the transistor illustrated in FIGS. 24A to 24D can be manufactured.

<Transistor Structure (4)>

Next, an example of a bottom-gate and top-contact transistor having a structure different from that of the transistor structure (3) is described.

Figure 26A:
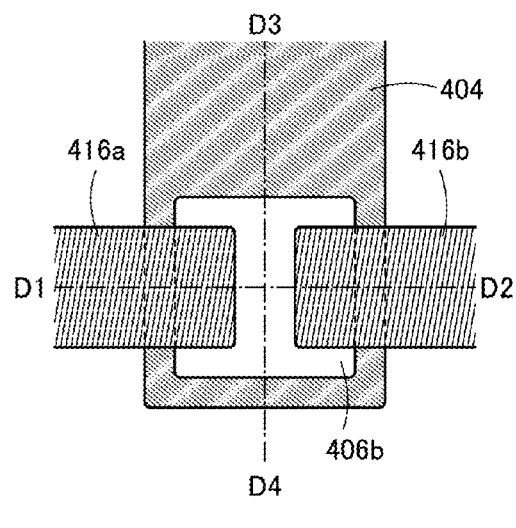
FIGS. 26A to 26C are a top view and cross-sectional views illustrating an example of a transistor of one embodiment of the present invention.
Figure 26C:
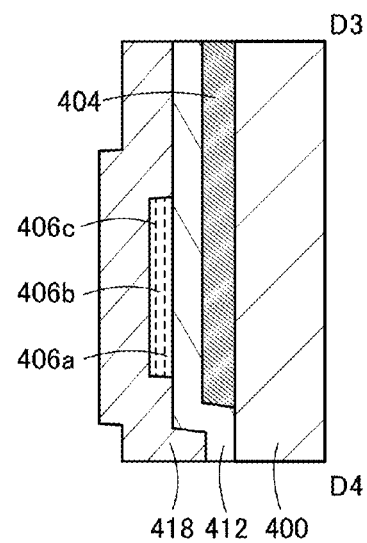
Figure 26B:
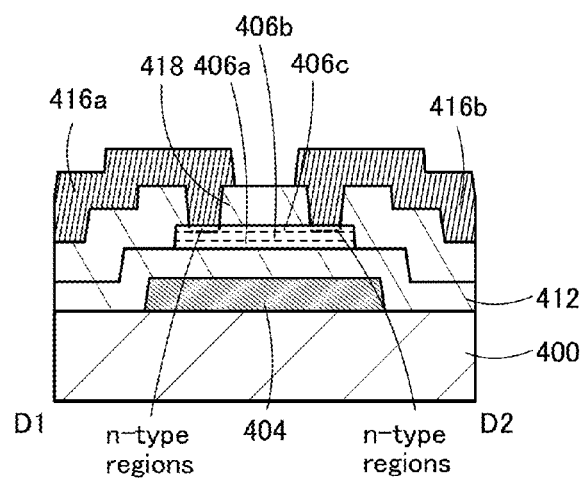

FIGS. 26A to 26C are a top view and cross-sectional views of the transistor.

FIG. 26A is a top view of the transistor. FIG. 26B is the cross-sectional view taken along dashed-dotted line D1-D2 in FIG. 26A. FIG. 26C is the cross-sectional view taken along dashed-dotted line D3-D4 in FIG. 26A.

The transistor illustrated in FIG. 26B includes a gate electrode 404 over a substrate 400, a gate insulating film 412 over the gate electrode 404, an oxide semiconductor layer 406a over the gate insulating film 412, an oxide semiconductor layer 406b over the oxide semiconductor layer 406a, an oxide semiconductor layer 406c over the oxide semiconductor layer 406b, a protective insulating film 418 over the gate insulating film 412 and the oxide semiconductor layer 406c, and a source electrode 416a and a drain electrode 416b in contact with the oxide semiconductor layer 406c through openings provided in the protective insulating film 418.

The protective insulating film 418 of the transistor in FIGS. 26A to 26C corresponds to the gate insulating film (bg) of the transistor in FIG. 5A, for example. In addition, the transistor in FIGS. 26A to 26C may include the gate electrode (bg) of the transistor in FIG. 5A, for example. The transistor in FIGS. 26A to 26C may include a back gate insulating film over the protective insulating film 418, and the source electrode 416a and the drain electrode 416b, and a back gate electrode that is opposite to the gate electrode 404 and is in contact with the top surface of the back gate insulating film, for example.

Note that a conductive film used for the source electrode 416a and the drain electrode 416b takes oxygen away from part of the oxide semiconductor layer 406b and part of the oxide semiconductor layer 406c or forms a mixed layer depending on its kind, which in some cases results in formation of n-type regions (low-resistance regions) in the oxide semiconductor layer 406b and the oxide semiconductor layer 406c.

Note that as illustrated in FIG. 26A, the gate electrode 404 is provided such that the edge of the oxide semiconductor layer 406b is located on the inner side of the edge of the gate electrode 404 in the top view. With such a structure, when light irradiation is performed from the gate electrode 404 side, generation of carriers in the oxide semiconductor layer 406b due to light can be suppressed. In other words, the gate electrode 404 functions as a light-blocking film. Note that the oxide semiconductor layer 406b may be provided outside the gate electrode 404.

For the oxide semiconductor layer 406a, the oxide semiconductor layer 406b, and the oxide semiconductor layer 406c, the description of the oxide semiconductor layer 106c, that of the oxide semiconductor layer 106b, and that of the oxide semiconductor layer 106a are referred to, respectively. In other words, the bottom-gate and top-contact transistor has a reverse stacked-layer structure of the top-gate and top-contact transistor.

For the protective insulating film 418, the description of the protective insulating film 318 is referred to.

The protective insulating film 418 preferably includes an insulating film containing excess oxygen. The insulating film containing excess oxygen is capable of reducing oxygen vacancies in the oxide semiconductor layer 406b. Such an oxygen vacancy forms DOS in the oxide semiconductor layer 406b and serves as a charge trap or the like. Thus, by a reduction in the number of oxygen vacancies in the oxide semiconductor layer 406b, the transistor can have stable electrical characteristics.

For the source electrode 416a and the drain electrode 416b, the description of the source electrode 116a and the drain electrode 116b is referred to. For the gate insulating film 412, the description of the gate insulating film 112 is referred to. For the gate electrode 404, the description of the gate electrode 104 is referred to. For the substrate 400, the description of the substrate 100 is referred to.

<Manufacturing Method of Transistor Structure (4)>

An example of a manufacturing method of the transistor structure (4) is described below.

FIGS. 27A to 27D are cross-sectional views corresponding to FIG. 26B.

First, the substrate 400 is prepared.

Next, a conductive film to be the gate electrode 404 is formed. For the formation method of the conductive film to be the gate electrode 404, the description of the conductive film to be the gate electrode 104 is referred to.

Next, the conductive film to be the gate electrode 404 is partly etched to form the gate electrode 404.

Next, the gate insulating film 412 is formed. For the formation method of the gate insulating film 412, the description of the gate insulating film 112 is referred to.

The gate insulating film 412 can be formed by a plasma CVD method, for example. By the CVD method, a denser insulating film having a lower density of defects can be provided, as a substrate temperature gets higher. A transistor can have more stable electrical characteristics, as the gate insulating film 412 gets denser and density of defects thereof gets lower.

Figure 27A:
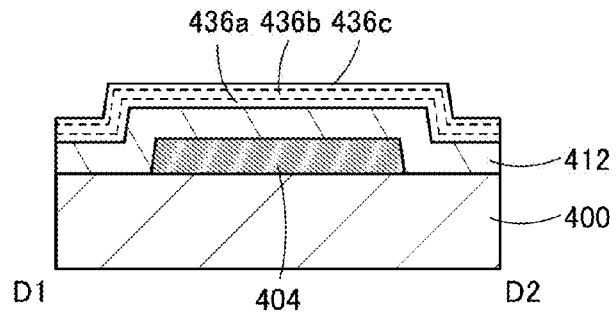
FIGS. 27A to 27D are cross-sectional views illustrating an example of a manufacturing method of a transistor of one embodiment of the present invention.

Next, an oxide semiconductor layer 436a, an oxide semiconductor layer 436b, and an oxide semiconductor layer 436c are formed in this order (see FIG. 27A). For the oxide semiconductor layer 436a, the oxide semiconductor layer 436b, and the oxide semiconductor layer 436c, the description of the oxide semiconductor layer 136c, that of the oxide semiconductor layer 136b, and that of the oxide semiconductor layer 136a are referred to, respectively.

Next, first heat treatment is preferably performed. For the first heat treatment, the description of the manufacturing method of the transistor structure (1) is referred to.

Figure 27B:
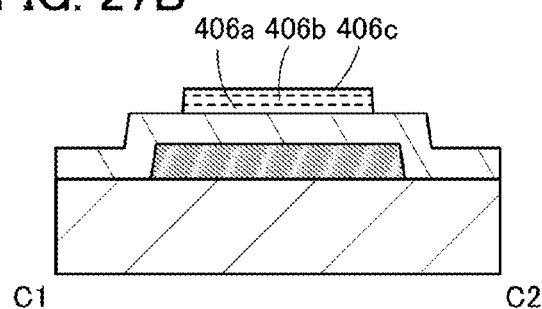

Next, the oxide semiconductor layer 436a, the oxide semiconductor layer 436b, and the oxide semiconductor layer 436c are partly etched to form the oxide semiconductor layer 406a, the oxide semiconductor layer 406b, and the oxide semiconductor layer 406c that have island shapes (see FIG. 27B).

Next, an insulating film to be the protective insulating film 418 is formed. For the insulating film to be the protective insulating film 418, the description of the protective insulating film 318 is referred to.

Next, second heat treatment is preferably performed. For the second heat treatment, the description of the manufacturing method of the transistor structure (1) is referred to.

Figure 27C:
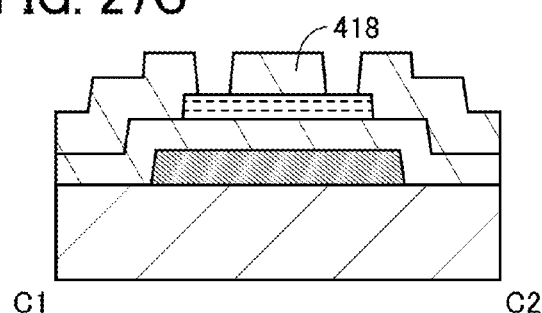

Then, the insulating film to be the protective insulating film 418 is partly etched to form the protective insulating film 418 (FIG. 27C).

Then, a conductive film to be the source electrode 416a and the drain electrode 416b is formed. For the formation method of the conductive film to be the source electrode 416a and the drain electrode 416b, the description of the conductive film 116 is referred to. At this time, n-type regions are in some cases formed in regions represented by broken lines in the oxide semiconductor layer 406c. The n-type regions are formed resulting from generation of oxygen vacancies in the oxide semiconductor layer 406c due to damages when the conductive film is formed over the oxide semiconductor layer 406c or action of the conductive film. For example, due to entry of hydrogen into the site of oxygen vacancies, an electron serving as a carrier is generated. Note that the n-type regions are formed up to the vicinity of the boundary between the oxide semiconductor layer 406c and the oxide semiconductor layer 406b as a non-limiting example. For example, the n-type regions may be formed in the oxide semiconductor layer 406c and the oxide semiconductor layer 406b, or only in the oxide semiconductor layer 406c.

Figure 27D:
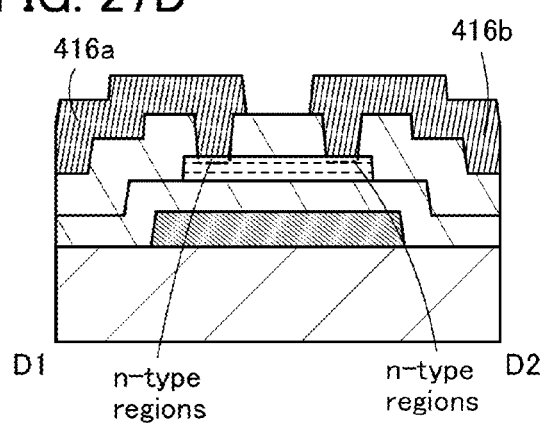

Next, the conductive film to be the source electrode 416a and the drain electrode 416b is partly etched to form the source electrode 416a and the drain electrode 416b (see FIG. 27D).

Next, third heat treatment is preferably performed. For the third heat treatment, the description of the manufacturing method of the transistor structure (1) is referred to.

Through the above steps, the transistor illustrated in FIGS. 26A to 26C can be manufactured.

<Application Product>

Application products using the above transistor are described below.

<Microcomputer>

The transistor described above can be applied to microcomputers which are mounted on variety of electronic appliances.

A structure and operation of a fire alarm that is an example of the electronic appliance using a microcomputer are described with reference to FIG. 34 and FIGS. 35A and 35B.

A fire alarm in this specification refers to any device which raises an alarm over fire occurrence instantly, and for example, a residential fire alarm, an automatic fire alarm system, and a fire detector used for the automatic fire alarm system are included in its category.

Figure 34:
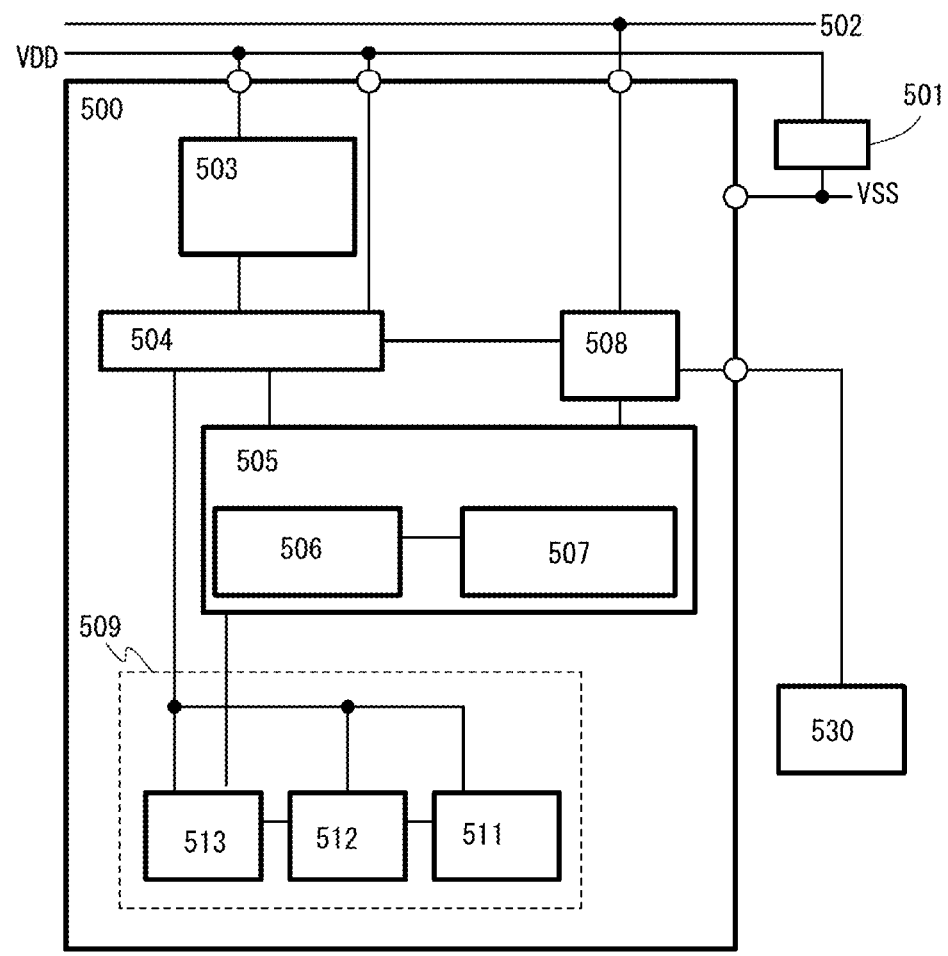
FIG. 34 is a block diagram illustrating an example of a semiconductor device of one embodiment of the present invention.

An alarm device illustrated in FIG. 34 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a CPU (central processing unit) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I$^2$C bus can be used, for example. A light-emitting element 530 electrically connected to the power gate 504 through the interface 508 is provided in the alarm device.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby a reduction in power consumption of the alarm device can be achieved compared with that of the case where power is continuously supplied to the above structures.

In the case where a transistor is used as the power gate 504, it is preferable to use a transistor which has an extremely low off-state current and is used for the nonvolatile memory portion 507, for example, the above transistor which includes a multilayer film including an oxide semiconductor layer. With the use of such a transistor, a leakage current can be reduced when supply of power is stopped by the power gate 504, so that a reduction in power consumption of the alarm device can be achieved.

A direct-current power source 501 may be provided in the alarm device so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery is provided in a housing. Note that the alarm device does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 35A:
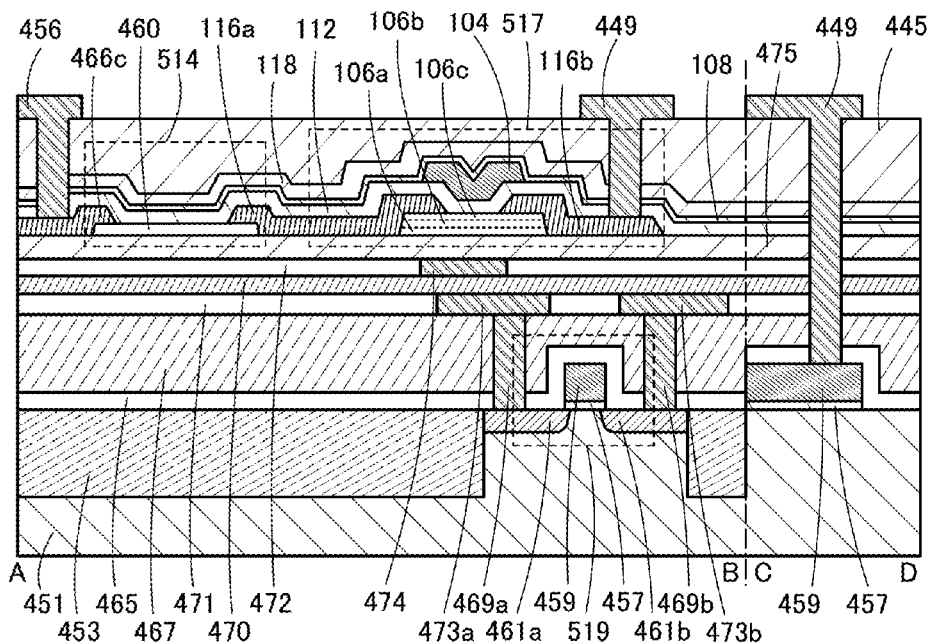
FIGS. 35A and 35B are a cross-sectional view and a circuit diagram illustrating an example of a semiconductor device of one embodiment of the present invention.

FIG. 35A illustrates part of the cross section of the alarm device. In the cross-sectional view of FIG. 35A, the cross section taken along A-B in the channel length direction and the cross section taken along C-D perpendicular to the channel length direction are illustrated. In the alarm device, element isolation regions 453 are formed in a p-type semiconductor substrate 451, and a transistor 519 including a gate insulating film 457, a gate electrode 459, n-type impurity regions 461a and 461b, an insulating film 465, and an insulating film 467 is formed. Here, the transistor 519 is formed using a semiconductor such as single crystal silicon, so that the transistor 519 can operate at high speed. Accordingly, a volatile memory portion of a CPU that can achieve high-speed access can be formed.

In addition, contact plugs 469a and 469b are formed in openings which are formed by partly etching the insulating films 465 and 467, and an insulating film 471 having groove portions is formed over the insulating film 467 and the contact plugs 469a and 469b. Wirings 473a and 473b are formed in the groove portions of the insulating film 471. An insulating film 470 is formed over the insulating film 471 and the wirings 473a and 473b by a sputtering method, a CVD method, or the like, and an insulating film 472 having a groove portion is formed over the insulating film 470. An electrode 474 is formed in the groove portion of the insulating film 472. The electrode 474 functions as a back gate electrode of a transistor 517. The electrode 474 can control the threshold voltage of the transistor 517.

Moreover, an insulating film 475 is formed over the insulating film 472 and the electrode 474 by a sputtering method, a CVD method, or the like.

The transistor 517 and a photoelectric conversion element 514 are provided over the insulating film 475. The transistor 517 includes the oxide semiconductor layer 106a, the oxide semiconductor layer 106b, and the oxide semiconductor layer 106c; the source electrode 116a and the drain electrode 116b; the gate insulating film 112; the gate electrode 104; the protective insulating film 108; and the protective insulating film 118. Moreover, an insulating film 445 cover the photoelectric conversion element 514 and the transistor 517, and a wiring 449 is formed over the insulating film 445 so as to be in contact with the drain electrode 116b. The wiring 449 electrically connects the drain electrode 116b of the transistor 517 to the gate electrode 459 of the transistor 519.

Figure 35B:
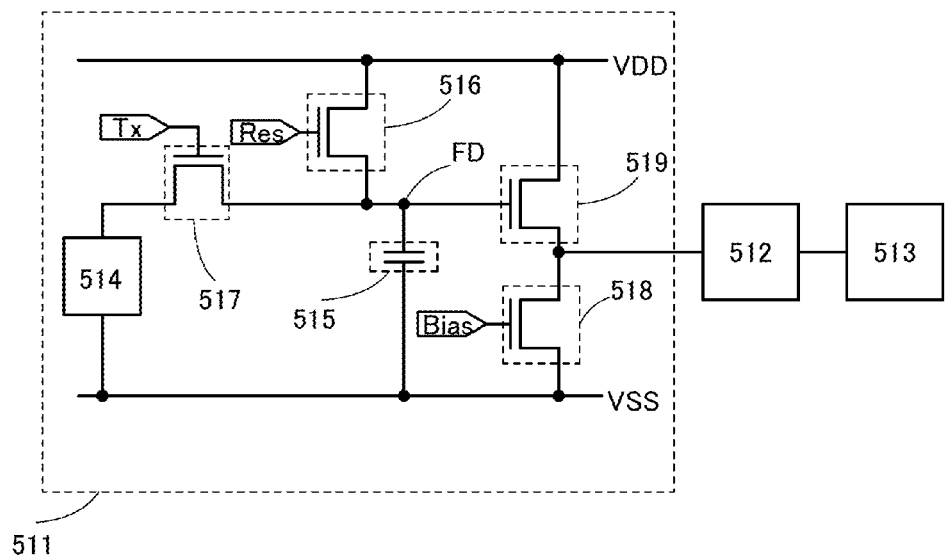

FIG. 35B is a circuit diagram of a detection portion. The detection portion includes the optical sensor 511, the amplifier 512, and the AD converter 513. The optical sensor 511 includes the photoelectric conversion element 514, a capacitor 515, a transistor 516, the transistor 517, a transistor 518, and the transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the transistor 517. The gate electrode of the transistor 517 is supplied with an electric charge accumulation control signal Tx, and the other of the source electrode and the drain electrode thereof is electrically connected to one of a pair of electrodes of the capacitor 515, one of a source electrode and a drain electrode of the transistor 516, and the gate electrode of the transistor 519 (hereinafter the node is referred to as a node FD in some cases). The other of the pair of electrodes of the capacitor 515 is electrically connected to the low potential power supply line VSS. A gate electrode of the transistor 516 is supplied with a reset signal Res, and the other of the source electrode and the drain electrode thereof is electrically connected to the high potential power supply line VDD. One of a source electrode and a drain electrode of the transistor 519 is electrically connected to one of a source electrode and a drain electrode of the transistor 518 and the amplifier 512. The other of the source electrode and the drain electrode of the transistor 519 is electrically connected to the high potential power supply line VDD. A gate electrode of the transistor 518 is supplied with a bias signal Bias, and the other of the source electrode and the drain electrode thereof is electrically connected to the low potential power supply line VSS.

Note that the capacitor 515 is not necessarily provided. For example, in the case where parasitic capacitance of the transistor 519 or the like is sufficiently large, a structure without the capacitor may be employed.

Further, as each of the transistor 516 and the transistor 517, the transistor having an extremely low off-state current is preferably used. As the transistor having an extremely low off-state current, the above transistor is preferably used. With such a structure, the potential of the node FD can be held for a long time.

In the structure in FIG. 35A, the photoelectric conversion element 514 is electrically connected to the transistor 517 and is provided over the insulating film 475.

The photoelectric conversion element 514 includes a semiconductor film 460 provided over the insulating film 475, and the source electrode 116a and an electrode 466c which are in contact with a top surface of the semiconductor film 460. The source electrode 116a is an electrode functioning as the source electrode or the drain electrode of the transistor 517 and electrically connects the photoelectric conversion element 514 to the transistor 517.

Over the semiconductor film 460, the source electrode 116a, and the electrode 466c, the gate insulating film 112, the protective insulating film 108, the protective insulating film 118, and the insulating film 445 are provided. Further, a wiring 456 is provided over the insulating film 445 and is in contact with the electrode 466c through an opening provided in the gate insulating film 112, the protective insulating film 108, the protective insulating film 118, and the insulating film 445.

The electrode 466c can be formed in steps similar to those of the source electrode 116a and the drain electrode 116b, and the wiring 456 can be formed in steps similar to those of the wiring 449.

As the semiconductor film 460, a semiconductor film which can perform photoelectric conversion is provided, and for example, silicon or germanium can be used. In the case of using silicon, the semiconductor film 460 functions as an optical sensor which senses visible light. Further, there is a difference, between silicon and germanium, in wavelengths of electromagnetic waves that can be absorbed. When the semiconductor film 460 includes germanium, a sensor which mainly senses an infrared ray can be obtained.

In the above manner, the sensor portion 509 including the optical sensor 511 can be incorporated into the microcomputer 500, so that the number of components can be reduced and the size of the housing of the alarm device can be reduced.

In the fire alarm including the above-described IC chip, the CPU 505 in which a plurality of circuits including any of the above transistors are combined and mounted on one IC chip is used.

<CPU>

Figure 36A:
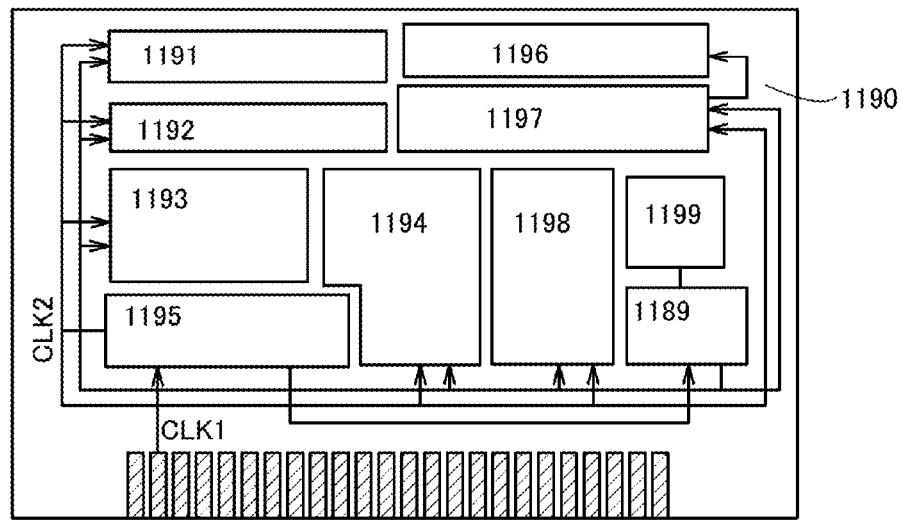
FIGS. 36A to 36C are block diagrams illustrating an example of a CPU of one embodiment of the present invention.
Figure 36B:
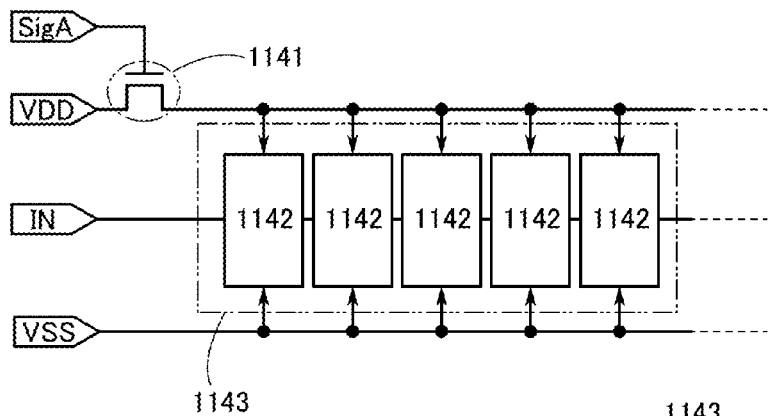
Figure 36C:
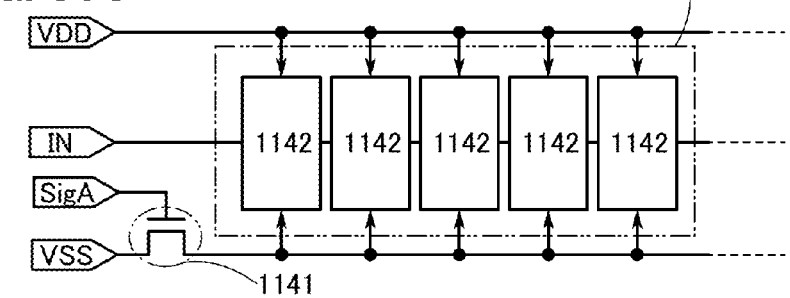

FIGS. 36A to 36C are block diagrams illustrating a specific configuration of a CPU at least partly including any of the above transistors.

The CPU illustrated in FIG. 36A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 36A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 36A, a memory cell is provided in the register 1196. As the memory cell of the register 1196, any of the above transistors can be used.

In the CPU illustrated in FIG. 36A, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 36B or FIG. 36C. Circuits illustrated in FIGS. 36B and 36C are described below.

FIGS. 36B and 36C each illustrate a memory device in which any of the above transistors is used as a switching element which controls supply of a power supply potential to a memory cell.

The memory device illustrated in FIG. 36B includes a switching element 1141 and a memory cell group 1143 including a plurality of memory cells 1142. Specifically, as each of the memory cells 1142, any of the above transistors can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 36B, any of the above transistors is used as the switching element 1141, and the switching of the transistor is controlled by a signal SigA supplied to a gate electrode layer thereof.

Note that FIG. 36B illustrates the configuration in which the switching element 1141 includes only one transistor; however, one of embodiment of the present invention is not particularly limited to such configuration and the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 36B, the switching element 1141 may control the supply of the low-level power supply potential VSS.

In FIG. 36C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be retained even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, any of the above transistors can also be applied to an LSI such as a digital signal processor (DSP), a custom LSI, or a field programmable gate array (FPGA).

<Display Device>

In this section, a display device including any of the above transistors is described.

As a display element provided in the display device, a liquid crystal element (also referred to as a liquid crystal display element), a light-emitting element (also referred to as a light-emitting display element), or the like can be used. The light-emitting element includes, in its category, an element whose luminance is controlled by current or voltage, specifically an inorganic electroluminescent (EL) element, an organic EL element, and the like. Furthermore, a display medium whose contrast is changed by an electric effect, such as electronic ink or an electrophoretic element, can be used as the display element. A display device including an EL element and a display device including a liquid crystal element are described below as examples of the display device.

The display device described below includes in its category a panel in which a display element is sealed, and a module in which an IC such as a controller or the like is mounted on the panel.

The display device described below also refers to an image display device, a display device, or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

<EL Display Device>

First, a display device including an EL element (also referred to as an EL display device) is described.

Figure 37A:
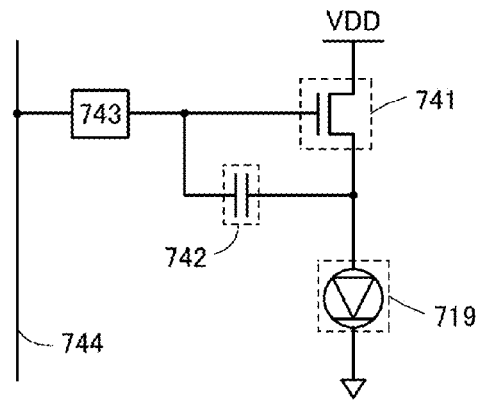
FIGS. 37A to 37C are a circuit diagram, a top view, and a cross-sectional view illustrating an example of an EL display device of one embodiment of the present invention.

FIG. 37A is an example of the circuit diagram of a pixel of an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function of the circuit is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device shown in FIG. 37A includes a switching element 743, a transistor 741, a capacitor 742, and a light-emitting element 719.

Note that FIG. 37A and the like each illustrate a circuit configuration example; thus, a transistor can be additionally provided. In each node in FIG. 37A, it is also possible not to provide an additional transistor, switch, passive element, or the like. For example, it is possible not to increase the number of transistors directly connected to the node A, the node B, the node C, the node D, the node E, the node F, and/or the node G Accordingly, for example, the following structure can be used: only the transistor 741 is directly connected to the node C and the other transistors are not directly connected to the node C.

A gate of the transistor 741 is electrically connected to one terminal of the switching element 743 and one terminal of the capacitor 742. A source of the transistor 741 is electrically connected to the other terminal of the capacitor 742 and one terminal of the light-emitting element 719. A power supply potential VDD is supplied to a drain of the transistor 741. The other terminal of the switching element 743 is electrically connected to a signal line 744. A constant potential is supplied to the other terminal of the light-emitting element 719. The constant potential is a ground potential GND or a potential lower than the ground potential GND.

The above transistor using the multilayer film including the oxide semiconductor layer is used as the transistor 741. The transistor has stable electrical characteristics. Accordingly, an EL display device having high display quality can be provided.

It is preferable to use a transistor as the switching element 743. When the transistor is used as the switching element, the area of a pixel can be reduced, so that the EL display device can have high resolution. Alternatively, the above transistor using the multilayer film including the oxide semiconductor layer may be used as the switching element 743; accordingly, the switching element 743 can be formed by the same process as the transistor 741, which leads to an improvement in the productivity of the EL display device.

Figure 37B:
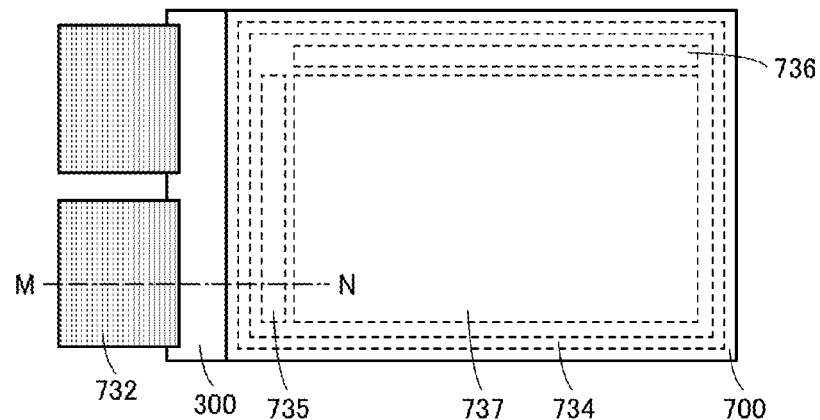

FIG. 37B is a top view of the EL display device. The EL display device includes a substrate 300, a substrate 700, a seal material 734, a driver circuit 735, a driver circuit 736, a pixel 737, and an FPC 732. The seal material 734 is provided between the substrate 300 and the substrate 700 so as to surround the pixel 737, the driver circuit 735, and the driver circuit 736. The driver circuit 735 and/or the driver circuit 736 may be provided outside the seal material 734.

Figure 37C:
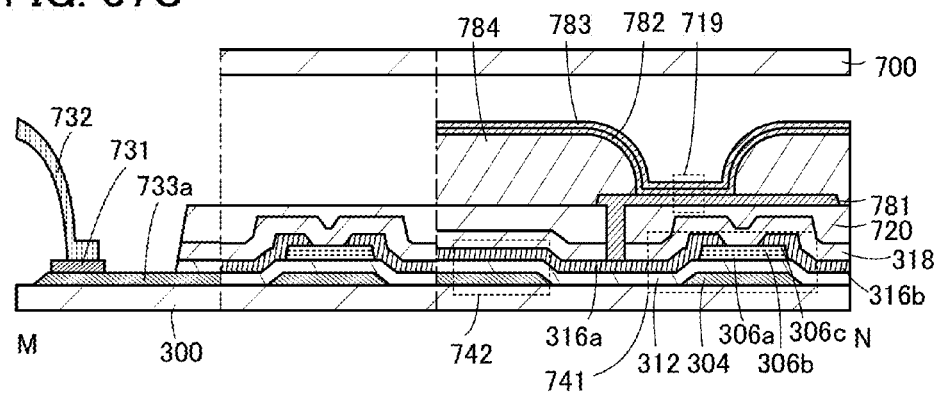

FIG. 37C is a cross-sectional view of the EL display device taken along dashed-dotted line M-N in FIG. 37B. The FPC 732 is connected to a wiring 733a through a terminal 731. The wiring 733a is formed in the same layer as the gate electrode 304.

FIG. 37C illustrates the example in which the transistor 741 and the capacitor 742 are provided in the same plane. With such a structure, the capacitor 742 can be formed in the same planes as the gate electrode, the gate insulating film, and the source (drain) electrode of the transistor 741. Such provision of the transistor 741 and the capacitor 742 in the same plane leads to shortening of the manufacturing process of the EL display device and an improvement of the productivity.

FIG. 37C illustrates the example in which a transistor having a structure similar to that of the transistor illustrated in FIGS. 24A to 24D is applied to the transistor 741.

The transistor illustrated in FIGS. 24A to 24D is a transistor with a small shift in threshold voltage. Accordingly, the transistor is preferred for EL display devices where gray scales are varied even with the small shift of the threshold voltage.

An insulating film 720 is provided over the transistor 741 and the capacitor 742. Here, an opening reaching the source electrode 316a of the transistor 741 is provided in the insulating film 720 and the protective insulating film 318.

An electrode 781 is provided over the insulating film 720. The electrode 781 is in contact with the source electrode 316a of the transistor 741 though the opening provided in the insulating film 720 and the protective insulating film 318.

Over the electrode 781, a bank 784 having an opening reaching the electrode 781 is provided. Over the bank 784, a light-emitting layer 782 in contact with the electrode 781 through the opening provided in the bank 784 is provided. An electrode 783 is provided over the light-emitting layer 782. A region where the electrode 781, the light-emitting layer 782, and the electrode 783 overlap with one another serves as the light-emitting element 719.

<Liquid Crystal Display Device>

Next, a display device including a liquid crystal element (also referred to as a liquid crystal display device) is described.

Figure 38A:
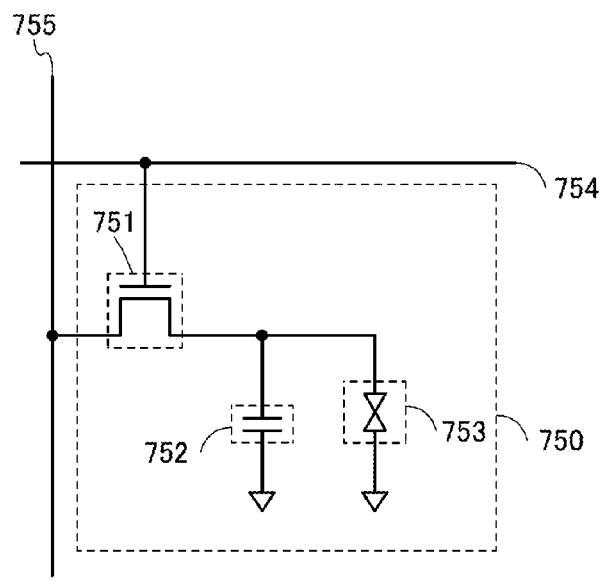
FIGS. 38A and 38B are a circuit diagram and a cross-sectional view illustrating an example of a liquid crystal display device of one embodiment of the present invention.

FIG. 38A is a circuit diagram illustrating a configuration example of the pixel of a liquid crystal display device. A pixel 750 shown in FIG. 38A includes a transistor 751, a capacitor 752, and an element (hereinafter also referred to as liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the wiring electrically connected to the other electrode of the liquid crystal element 753.

Figure 38B:
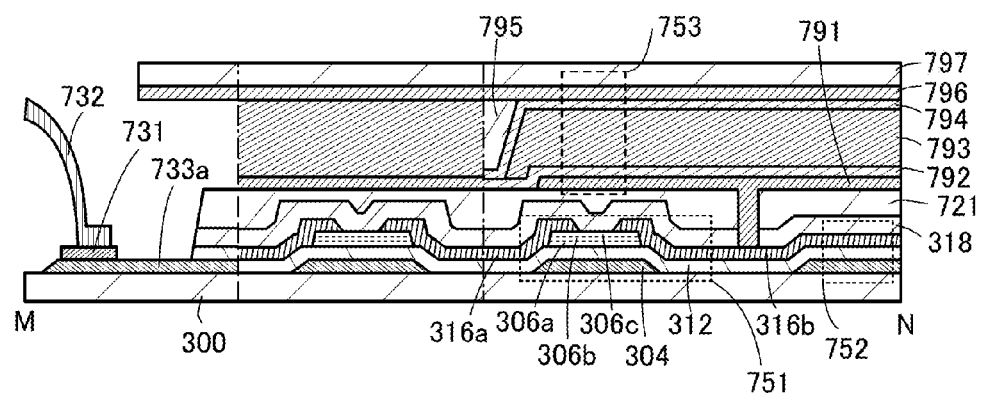

The top view of the liquid crystal display device is similar to that of the EL display device. A cross-sectional view of the liquid crystal display device taken along dashed-dotted line M-N in FIG. 37B is illustrated in FIG. 38B. In FIG. 38B, the FPC 732 is connected to the wiring 733a through the terminal 731. The wiring 733a is formed in the same layer as the gate electrode 304.

FIG. 38B illustrates the example in which the transistor 751 and the capacitor 752 are provided in the same plane. With such a structure, the capacitor 752 can be formed in the same planes as the gate electrode, the gate insulating film, and the source (drain) electrode of the transistor 751. Such provision of the transistor 751 and the capacitor 752 in the same plane leads to shortening of the manufacturing process of the liquid crystal display device and an improvement of the productivity.

Any of the above transistors can be applied to the transistor 751. FIG. 38B illustrates the example in which a transistor having a structure similar to that of the transistor illustrated in FIGS. 24A to 24D is applied to the transistor 751.

The off-state current of the transistor 751 can be made extremely small. Therefore, charge stored in the capacitor 752 is unlikely to leak, so that the voltage applied to the liquid crystal element 753 can be maintained for a long period. Accordingly, the transistor 751 can be kept off during a period in which moving images with few motions or a still image are/is displayed, whereby power for the operation of the transistor 751 can be saved in that period; accordingly a liquid crystal display device with low power consumption can be provided.

An insulating film 721 is provided over the transistor 751 and the capacitor 752. Here, an opening reaching the drain electrode 316b of the transistor 751 is provided in the insulating film 721 and the protective insulating film 318.

An electrode 791 is provided over the insulating film 721. The electrode 791 is in contact with the drain electrode 316b of the transistor 751 though the opening provided in the insulating film 721 and the protective insulating film 318.

An insulating film 792 which functions as an alignment film is provided over the electrode 791. A liquid crystal layer 793 is provided over the insulating film 792. An insulating film 794 which functions as an alignment film is provided over the liquid crystal layer 793. A spacer 795 is provided over the insulating film 794. An electrode 796 is provided over the spacer 795 and the insulating film 794. A substrate 797 is provided over the electrode 796.

<Installation Example>

Figure 39A:
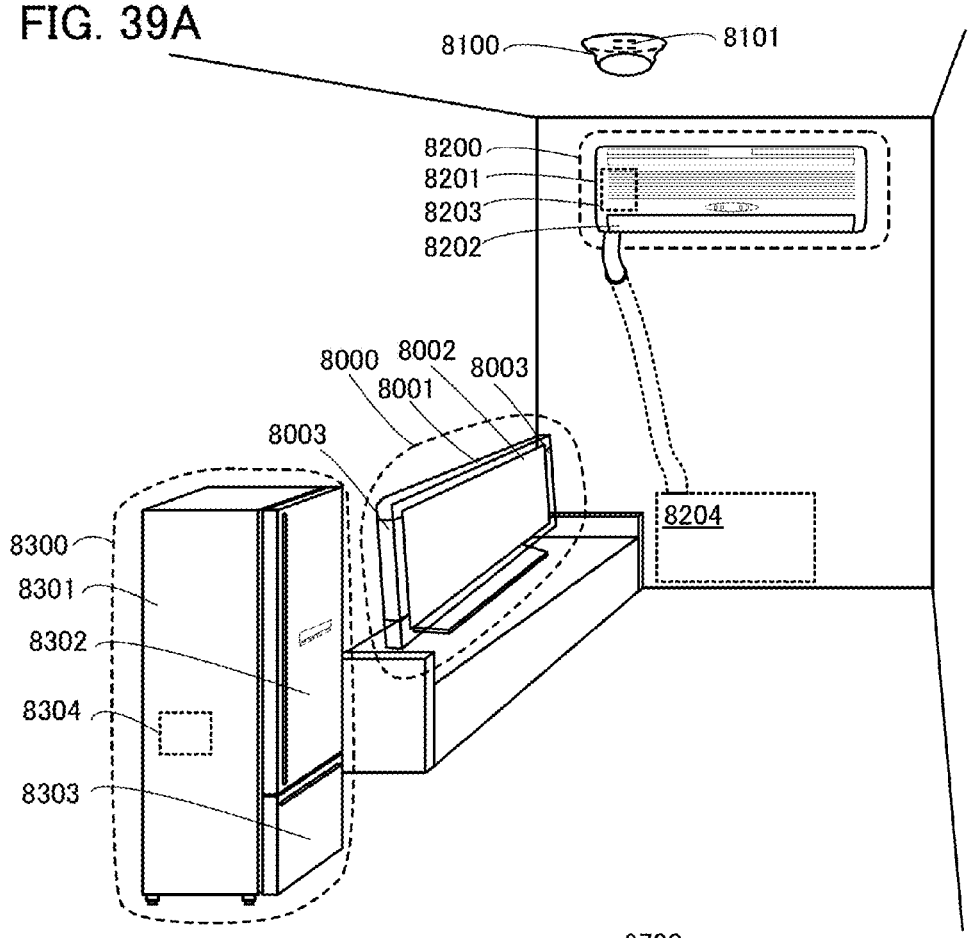
FIGS. 39A to 39C each illustrate an example of an electronic appliance of one embodiment of the present invention.

In a television set 8000 in FIG. 39A, a display portion 8002 is incorporated in a housing 8001. The display portion 8002 displays an image and a speaker portion 8003 can output sound. The above display device can be used for the display portion 8002.

The television set 8000 may be provided with a receiver, a modem, and the like. With the receiver, the television set 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a memory or a CPU for performing information communication. The above memory or CPU can be used for the television set 8000.

In FIG. 39A, an alarm device 8100 is a residential fire alarm, which includes a sensor portion and a microcomputer 8101. Note that the microcomputer 8101 includes a CPU in which any of the above transistors is used.

In FIG. 39A, an air conditioner which includes an indoor unit 8200 and an outdoor unit 8204 includes the CPU in which any of the above transistors is used. Specifically, the indoor unit 8200 includes a housing 8201, an air outlet 8202, a CPU 8203, and the like. Although the CPU 8203 is provided in the indoor unit 8200 in FIG. 39A, the CPU 8203 may be provided in the outdoor unit 8204. Alternatively, the CPU 8203 may be provided in both the indoor unit 8200 and the outdoor unit 8204. When the air conditioner includes the CPU in which the above transistor is used, a reduction in power consumption of the air conditioner can be achieved.

In FIG. 39A, an electric refrigerator-freezer 8300 includes the CPU in which the above transistor is used. Specifically, the electric refrigerator-freezer 8300 includes a housing 8301, a door for a refrigerator 8302, a door for a freezer 8303, a CPU 8304, and the like. In FIG. 39A, the CPU 8304 is provided in the housing 8301. When the electric refrigerator-freezer 8300 includes the CPU 8304 in which the above transistor is used, a reduction in power consumption of the electric refrigerator-freezer 8300 can be achieved.

Figure 39B:
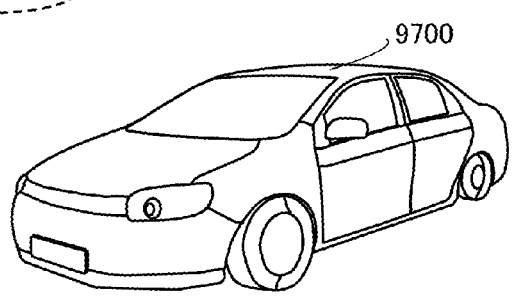
Figure 39C:
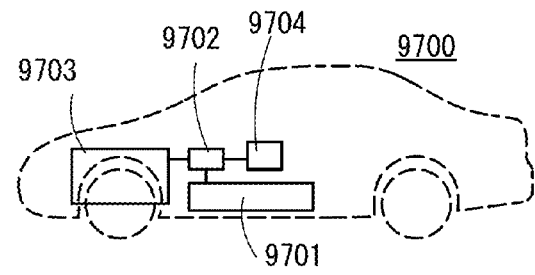

FIGS. 39B and 39C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the electric vehicle 9700 includes the CPU in which the above transistor is used, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part of this embodiment can be freely combined with, applied to, or replaced with another part of this embodiment.

Example 1

In this example, an example in which a transistor including a multilayer film was fabricated and the electrical characteristics thereof were measured will be described.

The transistor has the structure of the transistor illustrated in FIGS. 20A to 20C. Therefore, for the structure of the transistor and the fabricating method thereof, FIGS. 20A to 20C, FIGS. 22A to 22D, and FIGS. 23A to 23D are referred to.

In each sample, a silicon wafer was used as the substrate 200. As the base insulating film 202, a multilayer film in which a 100-nm-thick silicon oxide film and a 300-nm-thick silicon oxynitride film containing excess oxygen were stacked was used. As the source electrode 216a and the drain electrode 216b, a 100-nm-thick tungsten film was used. As the gate insulating film 212, a 20-nm-thick silicon oxynitride film was used. As the gate electrode 204, a multilayer film in which a 30-nm-thick tantalum nitride film and a 135-nm-thick tungsten film were stacked was used. As the protective insulating film 218, a 300-nm-thick silicon oxynitride film was used. As the protective insulating film 208, a 50-nm-thick silicon nitride film was used.

As the oxide semiconductor layer 206a, a 20-nm-thick In—Ga—Zn oxide film was used. The oxide semiconductor layer 206a was formed by a sputtering method under the following conditions: a target containing In, Ga, and Zn in an atomic ratio of 1:3:2 was used; a direct-current (DC) power of 0.5 kW was supplied; an argon gas at a flow rate of 30 sccm and an oxygen gas at a flow rate of 15 sccm were used as a deposition gas; the pressure was 0.4 Pa; the substrate temperature was 200° C.

As the oxide semiconductor layer 206b, a 15-nm-thick In—Ga—Zn oxide film was used. The oxide semiconductor layer 206b was formed by a sputtering method under the following conditions: a target containing In, Ga, and Zn in an atomic ratio of 1:1:1 was used; a direct-current (DC) power of 0.5 kW was supplied; an argon gas at a flow rate of 30 sccm and an oxygen gas at a flow rate of 15 sccm were used as a deposition gas; the pressure was 0.4 Pa; the substrate temperature was 300° C.

As the oxide semiconductor layer 206c, a 5-nm-thick, 10-nm-thick, 15-nm-thick, or 20-nm-thick In—Ga—Zn oxide film was used. The oxide semiconductor layer 206c was formed by a sputtering method under the following conditions: a target containing In, Ga, and Zn in an atomic ratio of 1:3:2 was used; a direct-current (DC) power of 0.5 kW was supplied; an argon gas at a flow rate of 30 sccm and an oxygen gas at a flow rate of 15 sccm were used as a deposition gas; the pressure was 0.4 Pa; the substrate temperature was 200° C.

Here, the transistor in which the thickness of the oxide semiconductor layer 206c was 5 nm was referred to as a sample 1. The transistor in which the thickness of the oxide semiconductor layer 206c was 10 nm was referred to as a sample 2. The transistor in which the thickness of the oxide semiconductor layer 206c was 15 nm was referred to as a sample 3. The transistor in which the thickness of the oxide semiconductor layer 206c was 20 nm was referred to as a sample 4. For comparison, a transistor in which neither the oxide semiconductor layer 206a nor the oxide semiconductor layer 206c is provided, and which was referred to as a sample 5 was prepared.

The gate voltage (Vg) versus drain current (Id) characteristics (hereinafter Vg-Id characteristics) of the above example samples and a comparative sample were measured. The measurement of the Vg-Id characteristics was performed by measuring drain current (Id) when the drain voltage (Vd) was set to 0.1 V or 3 V and the gate voltage (Vg) was swept in the range of −3 V to +3 V. Note that the field-effect mobility ($\mu_{FE}$) of the transistors with a drain voltage (Vd) of 0.1 V is represented by the right axis of each of FIG. 40, FIG. 41, FIG. 42, FIG. 43, and FIG. 44.

FIG. 40, FIG. 41, FIG. 42, FIG. 43, and FIG. 44 show overlapped 25 points of the electrical characteristics (the Vg-Id characteristics and the field-effect mobility with respect to Vg) in the sample 1, the sample 2, the sample 3, the sample 4, and the sample 5, respectively. Note that in each of FIG. 40, FIG. 41, FIG. 42, FIG. 43, and FIG. 44, the top graph shows electrical characteristics of a transistor with a channel length (L) of 0.44 μm and a channel width (W) of 1 μm and the bottom graph shows electrical characteristics of a transistor with a channel length (L) of 1.09 μm and a channel width (W) of 1 μm.

Figure 40:
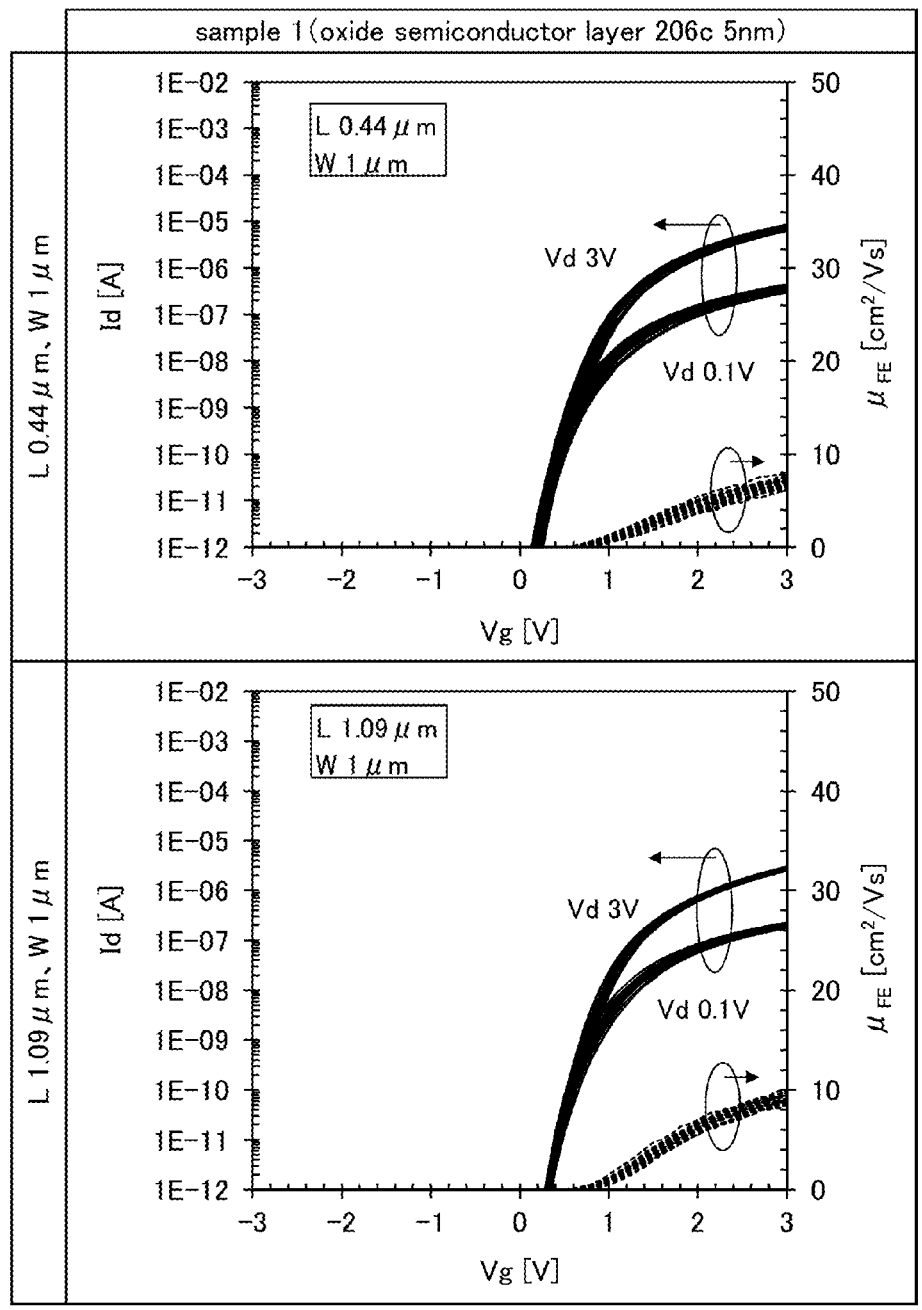
FIG. 40 shows electrical characteristics of transistors.

FIG. 40 shows that the sample 1 has electrical characteristics of the transistors, which are normally off with a small shift of threshold voltage.

Figure 41:
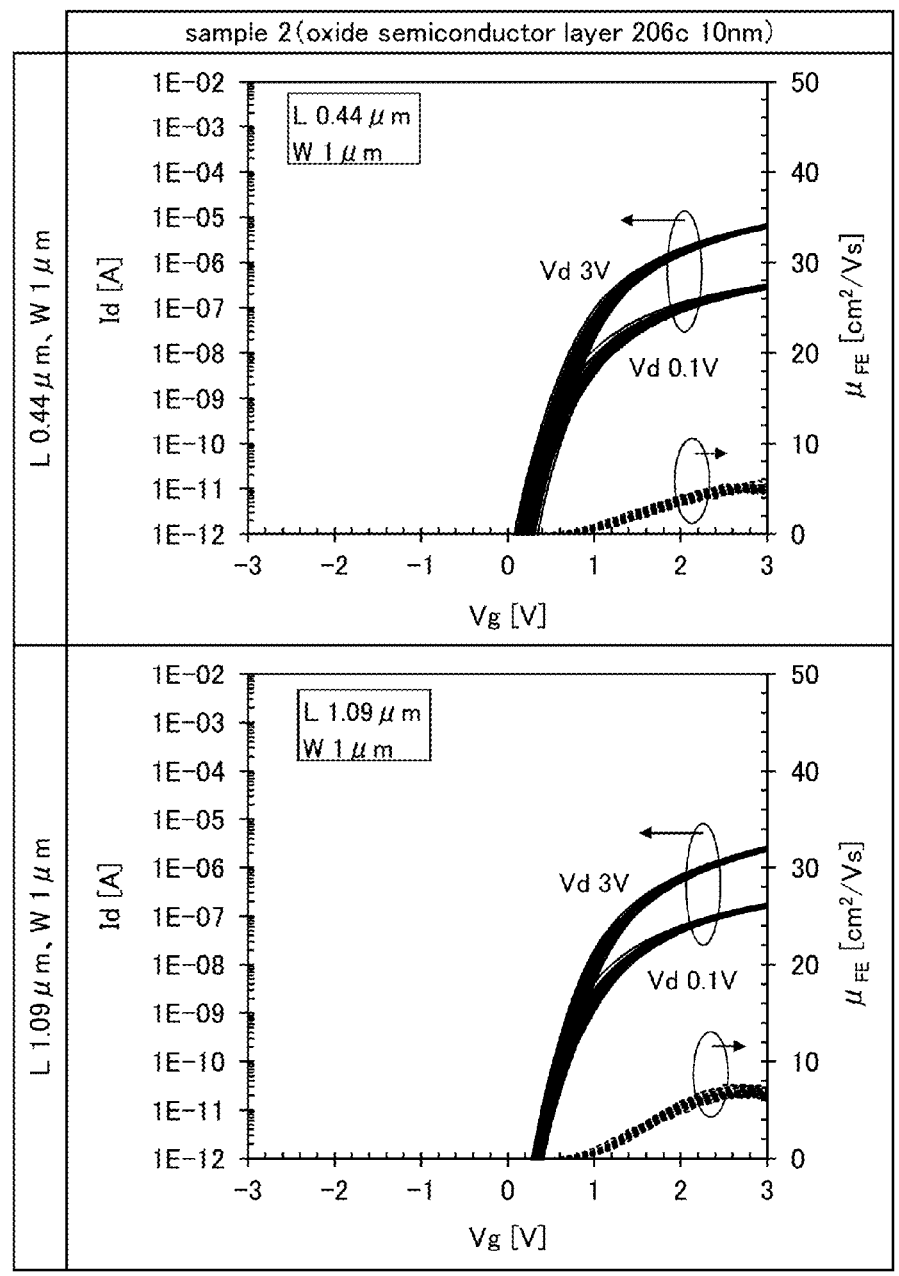
FIG. 41 shows electrical characteristics of transistors.

FIG. 41 shows that the sample 2 has the electrical characteristics of the transistors, which are normally off with a small shift in the threshold voltage.

Figure 42:
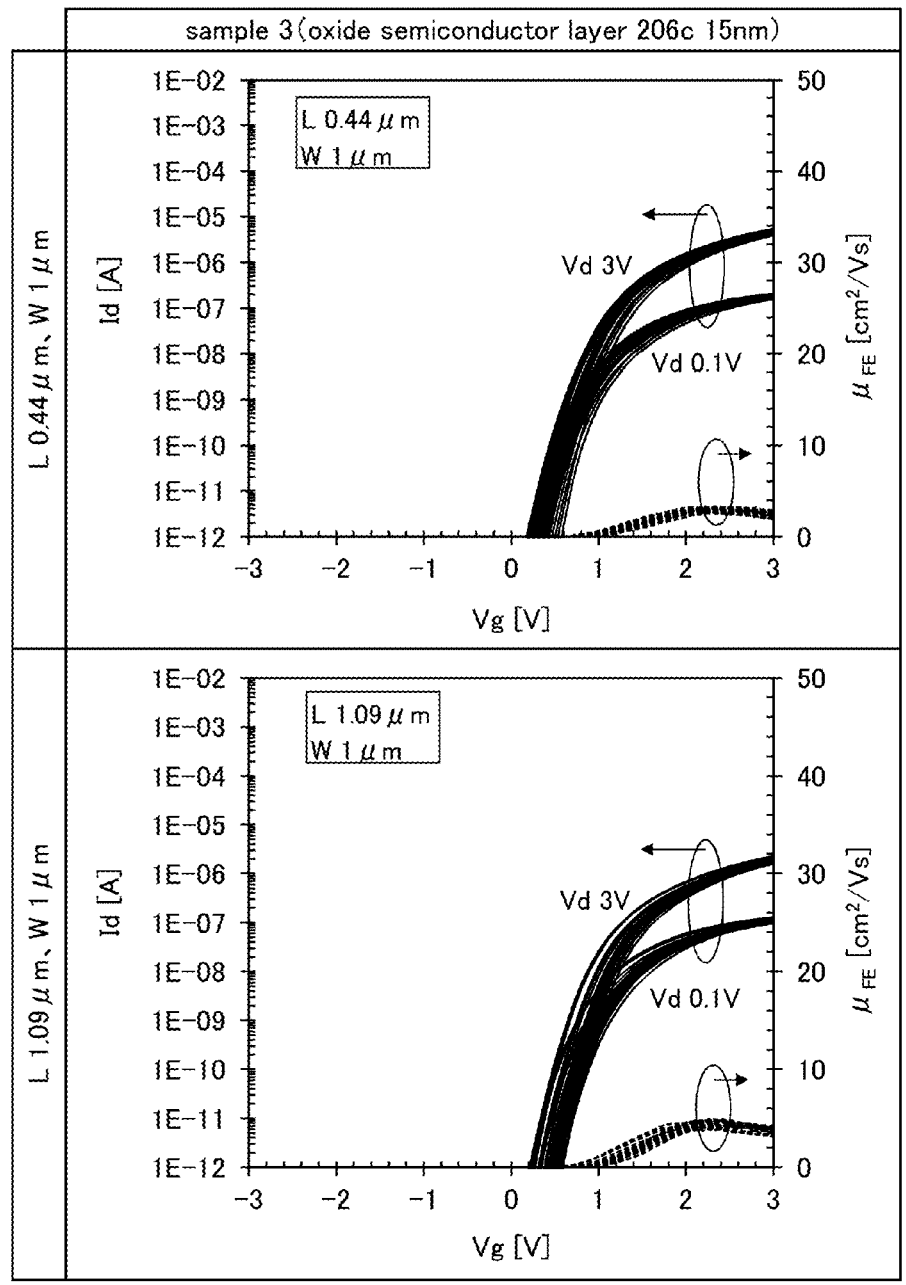
FIG. 42 shows electrical characteristics of transistors.

FIG. 42 shows that the sample 3 has the electrical characteristics of the transistors, which are normally off with a small shift in the threshold voltage.

Figure 43:
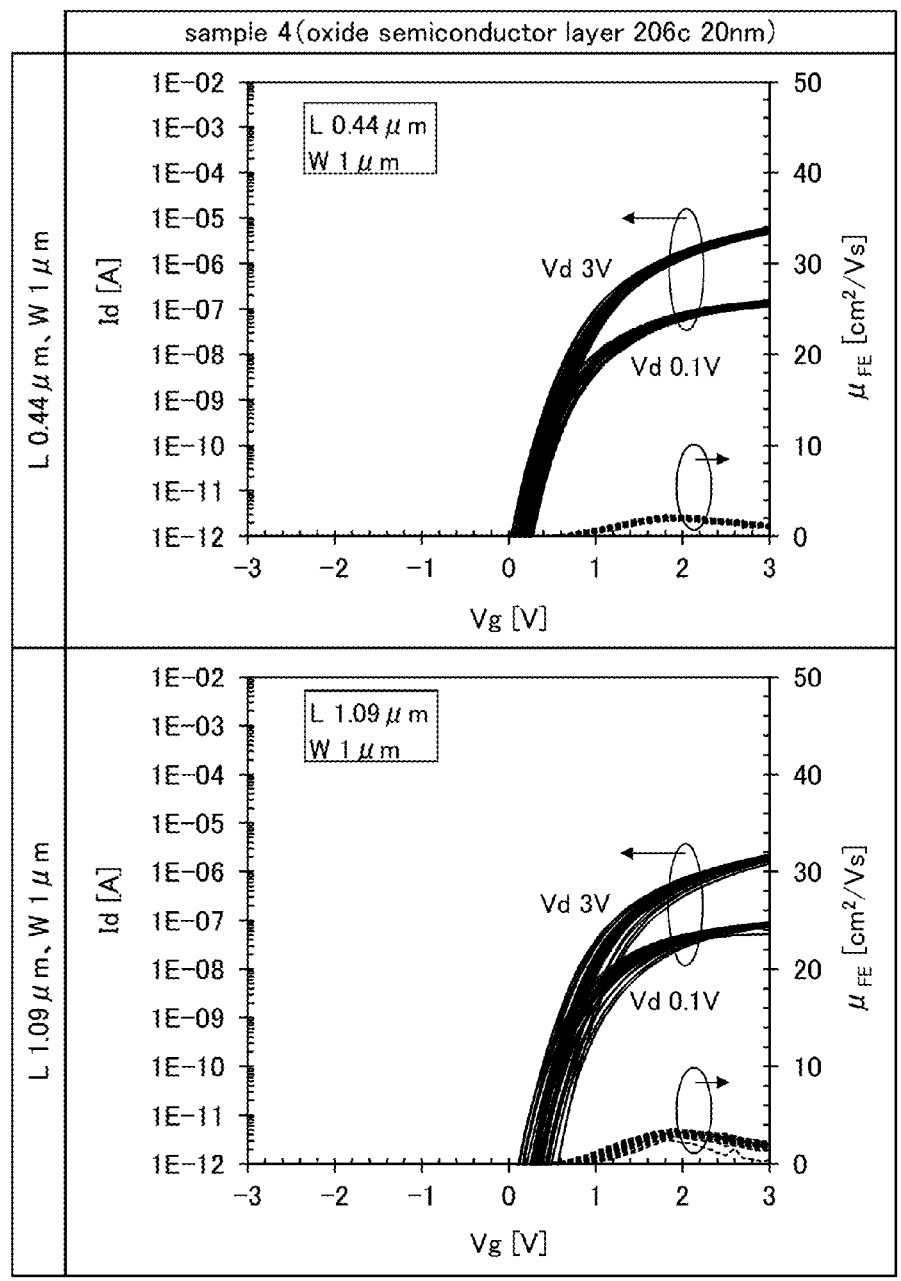
FIG. 43 shows electrical characteristics of transistors.

FIG. 43 shows that the sample 4 has the electrical characteristics of the transistors, which are normally off with a small shift in the threshold voltage.

Figure 44:
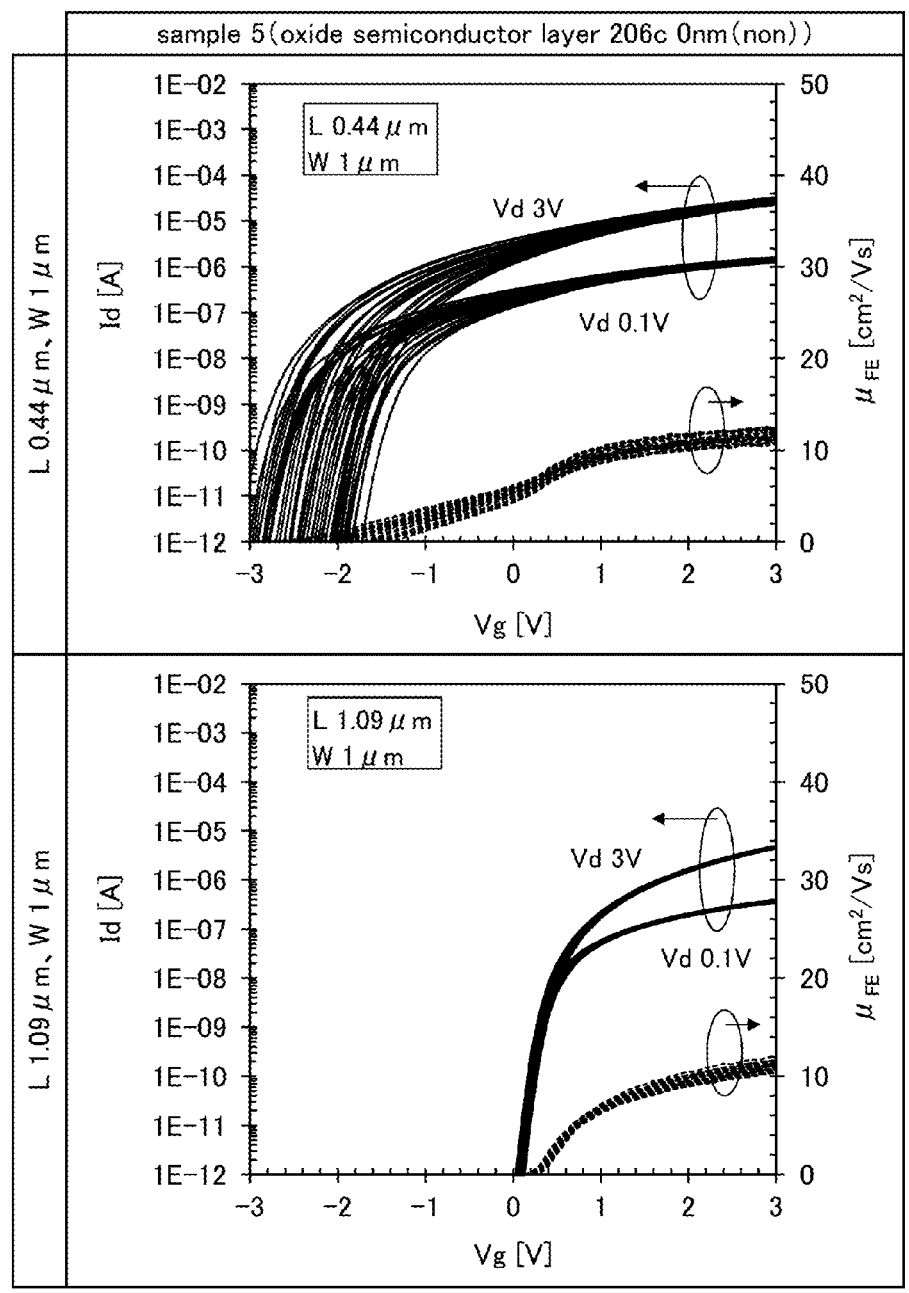
FIG. 44 shows electrical characteristics of transistors.

FIG. 44 shows that although, in the sample 5, the electrical characteristics of the transistors with a channel length (L) of 0.44 μm and a channel width (W) of 1 μm are normally on with a large shift in the threshold voltage, the electrical characteristics of the transistors with a channel length (L) of 1.09 μm and a channel width (W) of 1 μm are normally off with a small shift in the threshold voltage.

According to FIG. 40, FIG. 41, FIG. 42, FIG. 43, and FIG. 44, the electrical characteristics of the transistors with small channel lengths were not favorable in the sample 5. On the other hand, the electrical characteristics of the transistors with small channel lengths were also favorable in the samples 1 to 4. Electrical characteristics of the samples are more favorable in the descending order of the sample 1, the sample 2, the sample 3, and the sample 4, from most favorable to least favorable. Therefore, it can be said that the electrical characteristics of the samples are more favorable in the order where the thicknesses of the oxide semiconductor layers 206c are smaller.

Figure 45:
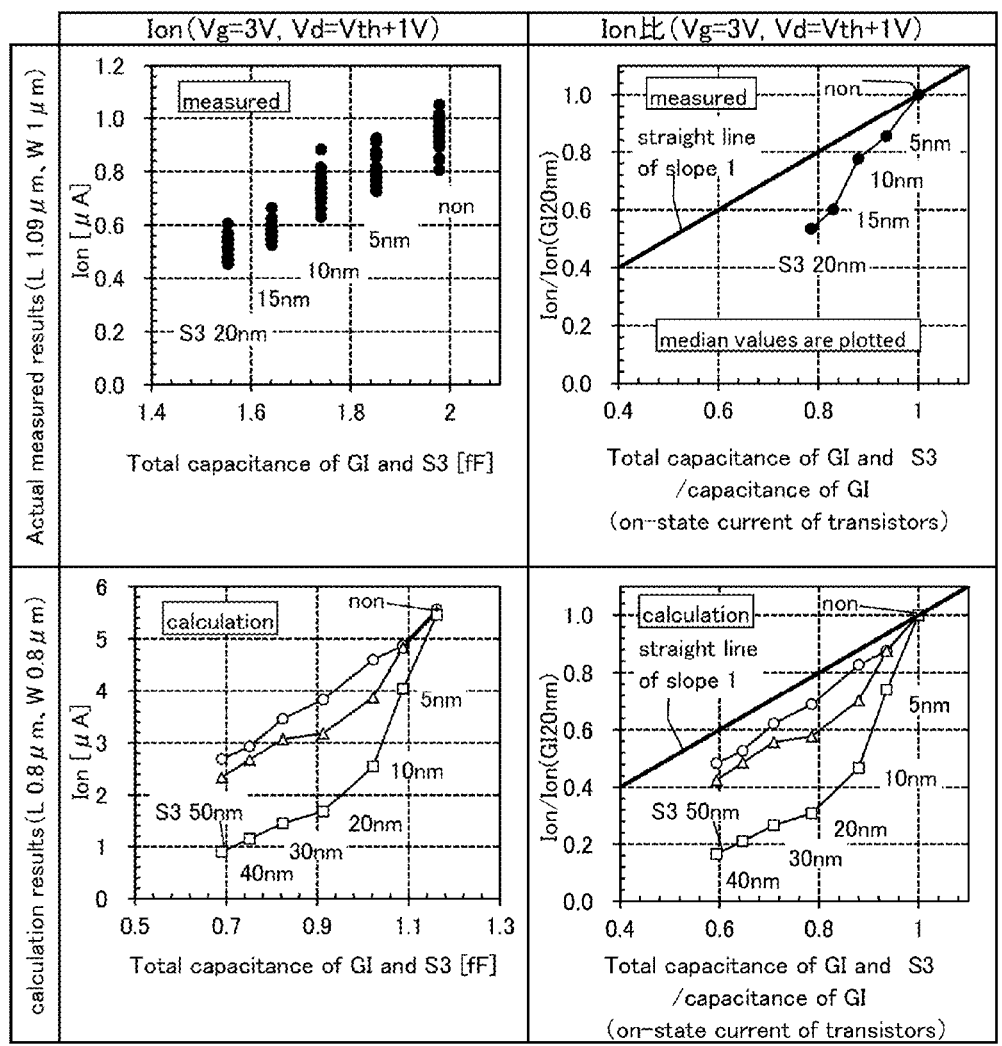
FIG. 45 is graphs comparing actual measured results and calculation results of electrical characteristics of transistors.
Figure 46:
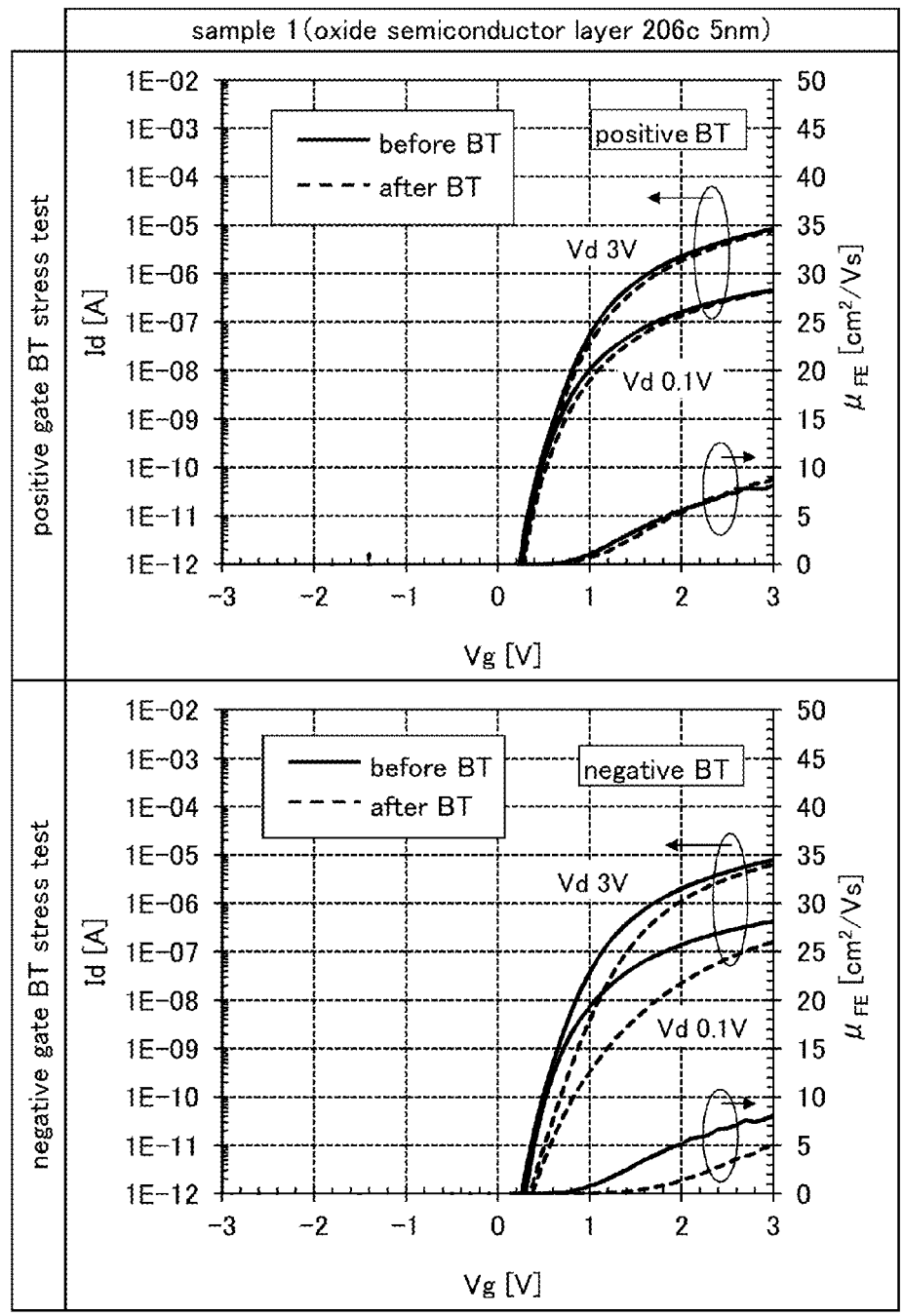
FIG. 46 is graphs showing electrical characteristics of transistors measured between before and after gate BT stress tests.
Figure 47:
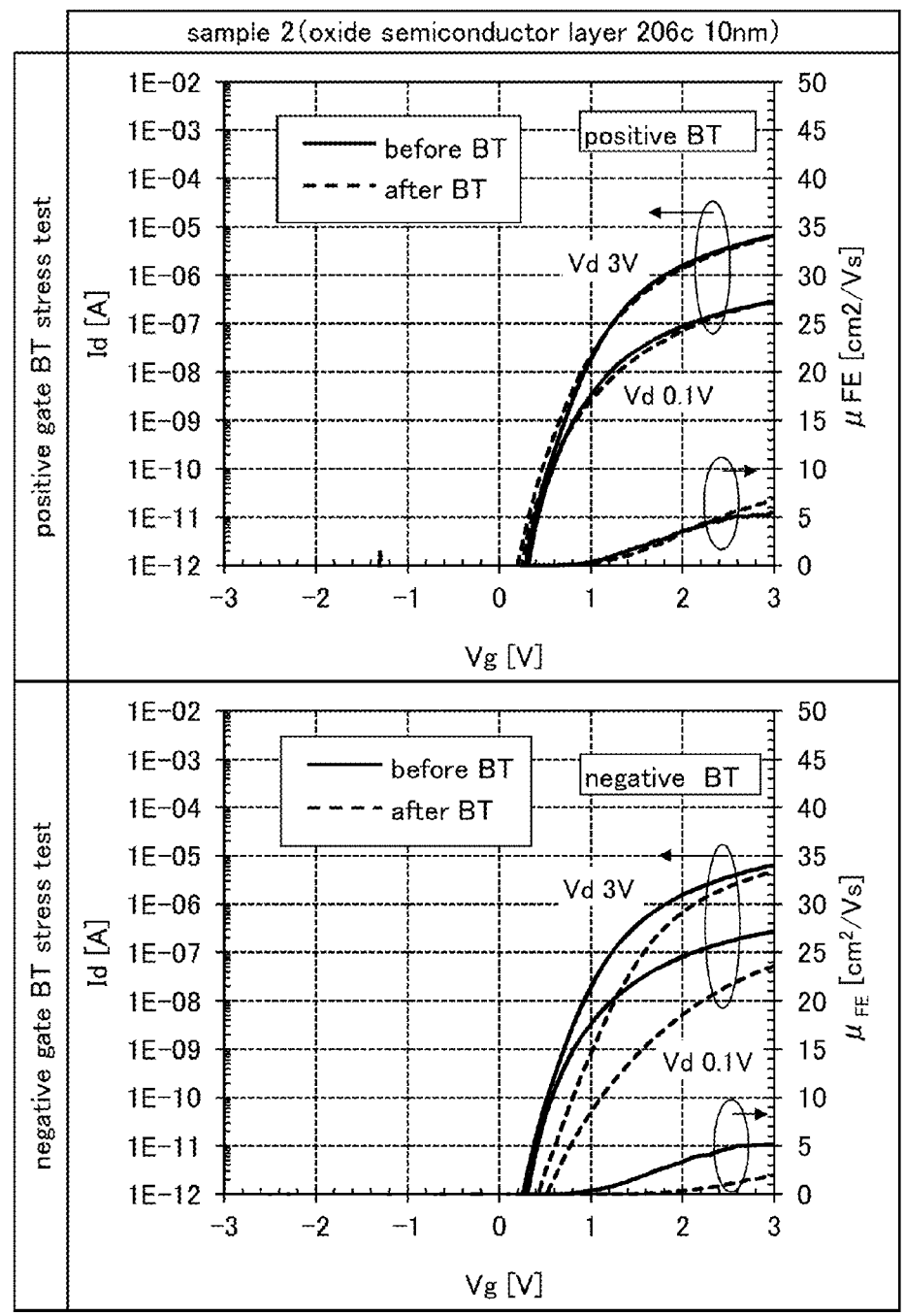
FIG. 47 is graphs showing electrical characteristics of transistors measured between before and after gate BT stress tests.
Figure 48:
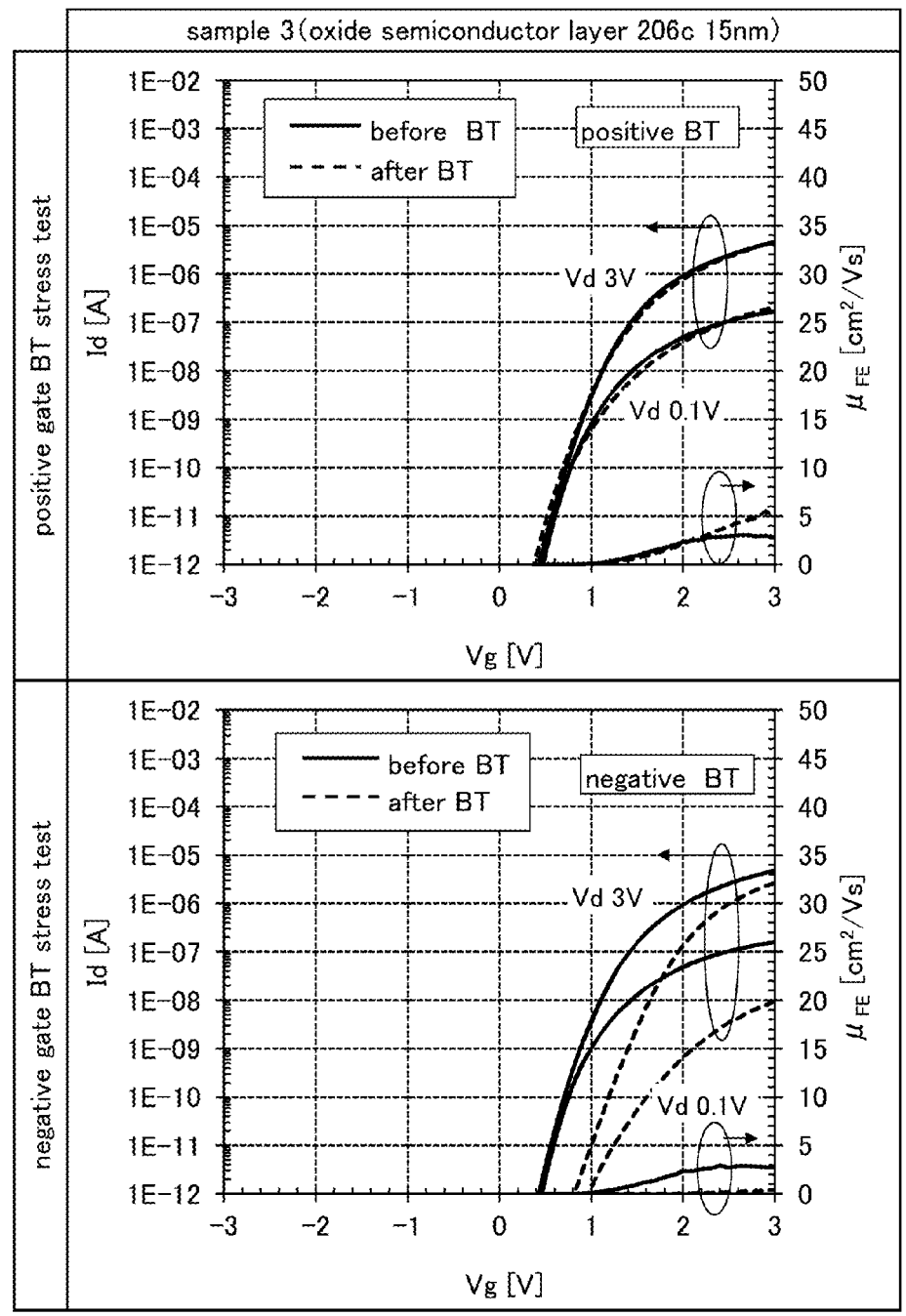
FIG. 48 is graphs showing electrical characteristics of transistors measured between before and after gate BT stress tests.
Figure 49:
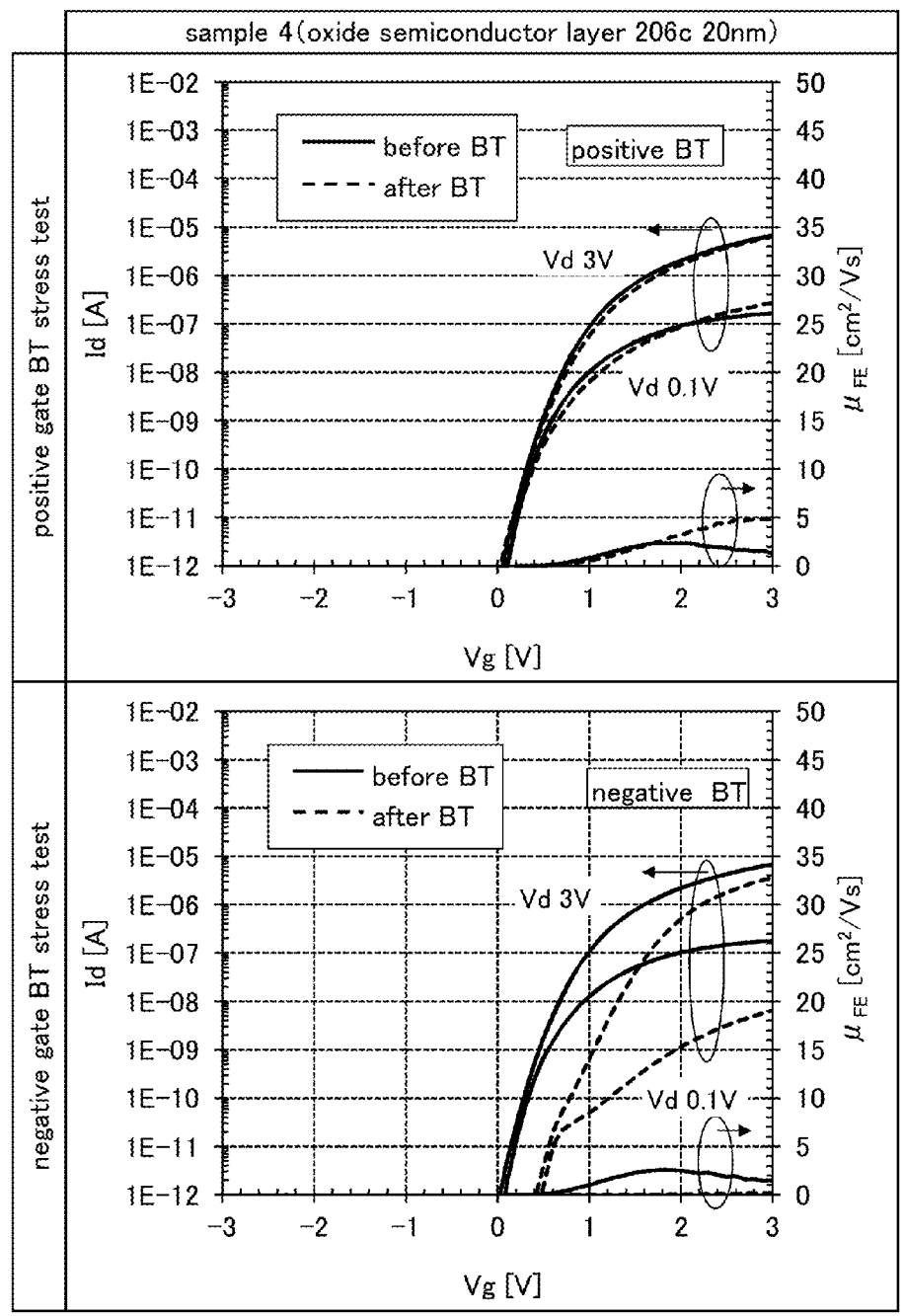
FIG. 49 is graphs showing electrical characteristics of transistors measured between before and after gate BT stress tests.
Figure 50:
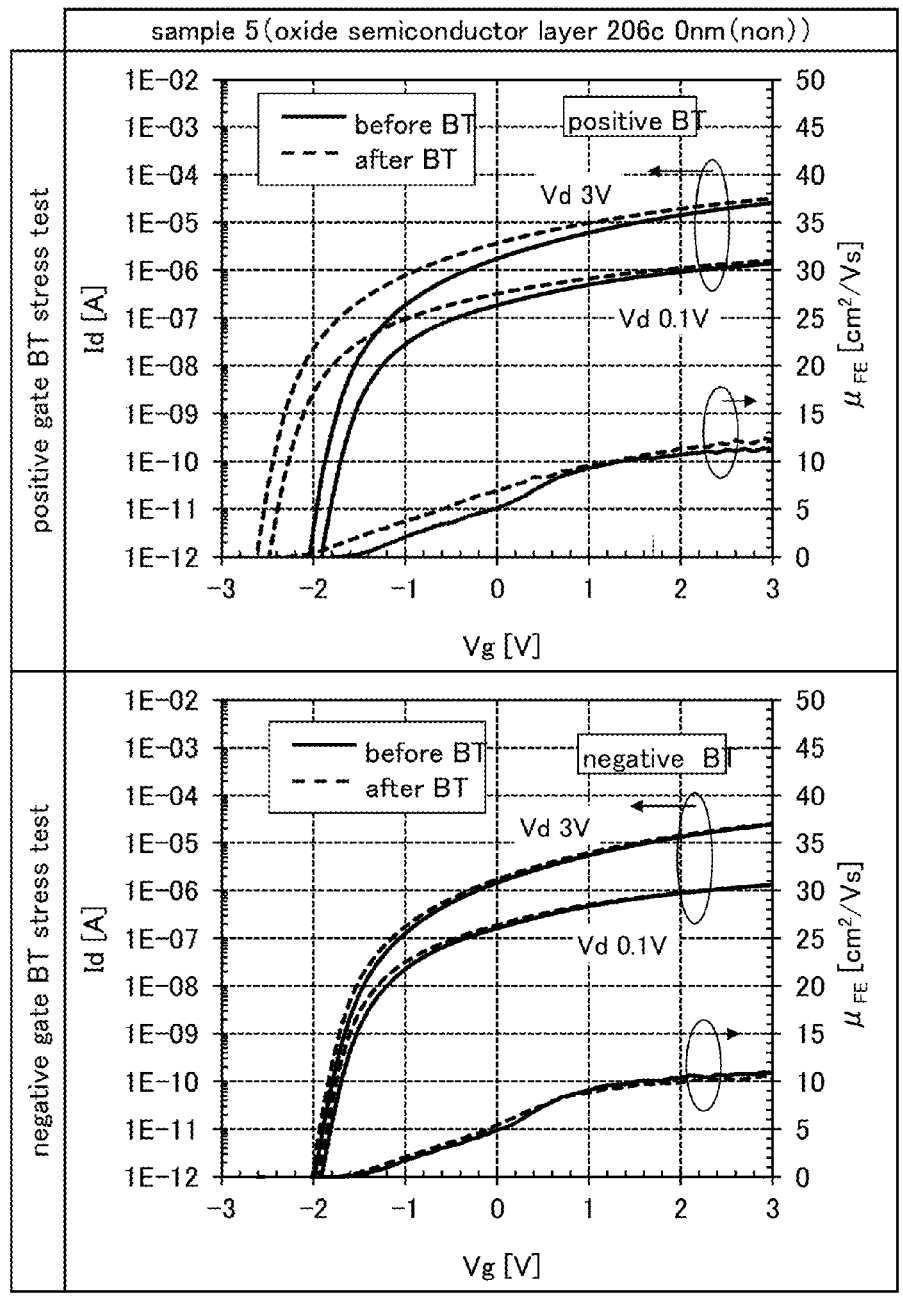
FIG. 50 is graphs showing electrical characteristics of transistors measured between before and after gate BT stress tests.

FIG. 45 shows comparison between the calculation results shown in the above embodiment (see FIG. 3) and actual measured results in this example. In FIG. 45, the top graphs show the actual measured results and the bottom graphs show the calculation results.

Left graphs of FIG. 45 are graphs plotting data, where the horizontal axis represents total capacitance of the oxide semiconductor layer 206c (oxide semiconductor layer (S3)) and the gate insulating film 212 (gate insulating film (GI)), and the vertical axis represents an on-state current of transistors. Right graphs of FIG. 45 are graphs plotting data, where the horizontal axis represents a value obtained by dividing the total capacitance of the oxide semiconductor layer 206c (oxide semiconductor layer (S3)) and the gate insulating film 212 (gate insulating film (GI)) divided by the capacitance of the gate insulating film 212 (gate insulating film (GI)) (such value corresponds to normalized capacitance), and the vertical axis represents values obtained by dividing the on-state currents of the transistors by the on-state currents in the case without the oxide semiconductor layer 206c (oxide semiconductor layer (S3)) (0 nm) (such a value corresponds to a normalized on-state current or an Ion ratio).

However, a difference in threshold voltage among the samples is large; therefore, the on-state current corresponds to a drain current when the gate voltage is 3 V and the drain voltage Vd is the threshold voltage Vth of the transistor plus 1 V (in FIG. 3, the on-state current corresponds to a drain current when the gate voltage is 3 V and the drain voltage Vd is 3 V).

Note that as to the actual measured results in FIG. 45, the oxide semiconductor layer 206c is expressed as an oxide semiconductor layer (S3) and the gate insulating film 212 is expressed as a gate insulating film (GI) for easy understanding.

The actual measured results are those of the transistor with a channel length (L) of 1.09 μm and a channel width (W) of 1 μm, and the calculation results are those of the transistor with a channel length (L) and a channel width (W) each of 0.8 μm.

In the actual measured result in the upper left graph of FIG. 45, 25 points of on-state current are plotted for every total capacitance corresponding to each thickness of the oxide semiconductor layer 206c according to FIG. 40, FIG. 41, FIG. 42, FIG. 43, and FIG. 44. In the upper right graph, the median values of the obtained on-state current were plotted.

According to the right graphs of FIG. 45, the actual measured result and the calculation result were compared in the plotted points of the normalized on-state current with respect to the normalized capacitance. From the comparison, it was found that a tendency almost the same as that of the actual measured result reappears in the calculation result (in particular, the calculation result in the case where the well depth is 0.3 eV).

That is, there is a possibility that the model showing a decrease in an on-state current, which is described in the above embodiment, can be applied also to the transistors described in this example. Specifically, first, electrons are induced to the oxide semiconductor layer 206c by an electric field of the gate electrode 204. Next, the electric field of the gate electrode 204 is blocked with the oxide semiconductor layer 206c. Then, the electric field applied to the oxide semiconductor layer 206b is weakened. Thus, the possibility of a decrease in the on-state current of the transistor was shown.

Example 2

In this example, reliability of each of the samples 1 to 5 fabricated in Example 1 was evaluated. The reliability was evaluated by gate BT stress tests.

A measurement method in a positive gate BT stress test (positive BT) is described. To measure electrical characteristics in the initial state (a state before stress application) of a target transistor of the positive gate BT stress test, a change in drain current Id, that is, Vg-Id characteristics were measured under the following conditions: the substrate temperature was 40° C., the drain voltage Vd was 0.1 V or 3 V, and the gate voltage was swept from −3 V to +3 V.

Next, the substrate temperature was increased to 150° C., and then, the drain voltage Vd of the transistor was set to 0 V. After that, a gate voltage of 3.3 V was applied so that the intensity of the electric field applied to the gate insulating film 212 was 1.65 MV/cm. The gate voltage was kept being applied for 3600 seconds.

Note that a gate voltage of −3.3 V was applied in a negative gate BT stress test (negative BT).

FIG. 46, FIG. 47, FIG. 48, FIG. 49, and FIG. 50 show the electrical characteristics (the Vg-Id characteristics and the field-effect mobility with respect to Vg) before and after gate BT stress tests in the sample 1, the sample 2, the sample 3, the sample 4, and the sample 5, respectively. In each graph of FIG. 46, FIG. 47, FIG. 48, FIG. 49, and FIG. 50, solid lines represent the electrical characteristics before the gate BT stress test (before BT), and dotted lines represent the electrical characteristics after the gate BT stress test (after BT). Moreover, in each graph of FIG. 46, FIG. 47, FIG. 48, FIG. 49, and FIG. 50, the top graph shows the electrical characteristics before and after a positive gate BT stress test, and the bottom graph shows the electrical characteristics before and after a negative gate BT stress test.

Table 2 shows shifts in threshold voltage ($\Delta$Vth) and a shift value ($\Delta$Shift) between before and after the gate BT stress tests obtained in FIG. 46, FIG. 47, FIG. 48, FIG. 49, and FIG. 50. Note that the threshold voltage (Vth) refers to a gate voltage when a channel is formed (voltage between a source and a gate). In a curve where the horizontal axis represents the gate voltage (Vg) and the vertical axis represents the square root of drain current (Id) and where data are plotted (Vg-√Id characteristics), the threshold voltage (Vth) was defined as a gate voltage (Vg) at a point of intersection of an extrapolated tangent line having the highest inclination with the square root of drain current (Id) of 0 (Id=0 A). In a curve where the horizontal axis represents the gate voltage (Vg) and the vertical axis represents the logarithm of the drain current (Id) and where data are plotted (Vg-Id characteristics), the shift value (Shift) is defined as a gate voltage (Vg) at a point of intersection of an extrapolated tangent line having the highest inclination with a drain current (Id) of $1 \times 10^{-12}$ A.

TABLE 2

| | | Sample 1 | Sample 2 | Sample 3 | Sample 4 | Sample 5 |
|---|---|---|---|---|---|---|
| positive BT | $\Delta$Vth | 0.14 | 0.08 | 0.14 | 0.15 | −0.59 |
| | $\Delta$Shift | 0.02 | −0.08 | −0.06 | −0.03 | −0.57 |

TABLE 2-continued

|  |  | Sample 1 | Sample 2 | Sample 3 | Sample 4 | Sample 5 |
|---|---|---|---|---|---|---|
| negative BT | ΔVth | 0.27 | 0.33 | 0.51 | 0.66 | −0.14 |
|  | ΔShift | 0.10 | 0.17 | 0.39 | 0.41 | −0.02 |

According to FIG. 46, FIG. 47, FIG. 48, FIG. 49, FIG. 50, and Table 2, the transistors of the samples 1 to 5 have stable electrical characteristics. In particular, the shifts in the threshold voltage (ΔVth) and the shift value (ΔShift) of the samples 1 and 2 are smaller than those of the other samples and thus the transistors of the samples 1 and 2 have extremely stable electrical characteristics. The thicknesses of the oxide semiconductor layers 206c of the samples are in the ascending order of the sample 1, the sample 2, the sample 3, and the sample 4, from a smallest thickness to a largest thickness. Thus, the transistor in which the oxide semiconductor layer 206c has a smaller thickness has higher reliability.

This application is based on Japanese Patent Application serial No. 2013-025025 filed with the Japan Patent Office on Feb. 12, 2013, the entire contents of which are hereby incorporated by reference.

What is claimed is:

1. A semiconductor device comprising:
a gate electrode;
a gate insulating film in contact with the gate electrode; and
a multilayer film which is in contact with the gate insulating film and includes a first oxide semiconductor layer, a second oxide semiconductor layer, and a third oxide semiconductor layer in the order from a side farthest from the gate insulating film,
wherein the first oxide semiconductor layer has a thickness greater than or equal to 20 nm and less than or equal to 200 nm,
wherein the third oxide semiconductor layer has a thickness greater than or equal to 0.3 nm and less than 10 nm, and
wherein each of the first oxide semiconductor layer and the third oxide semiconductor layer has energy at a bottom of a conduction band that is higher than energy at a bottom of a conduction band of the second oxide semiconductor layer.

2. The semiconductor device according to claim 1,
wherein the thickness of the first oxide semiconductor layer is different from the thickness of the third oxide semiconductor layer.

3. The semiconductor device according to claim 1,
wherein the first oxide semiconductor layer has energy at a bottom of a conduction band, which is higher than energy at a bottom of a conduction band of the second oxide semiconductor layer by 0.2 eV or more and 2 eV or less, and
wherein the third oxide semiconductor layer has energy at a bottom of a conduction band, which is higher than energy at the bottom of the conduction band of the second oxide semiconductor layer by 0.2 eV or more and 2 eV or less.

4. The semiconductor device according to claim 1, wherein a source electrode and a drain electrode are formed between the second oxide semiconductor layer and the third oxide semiconductor layer.

5. A semiconductor device comprising:
a gate electrode;
a gate insulating film in contact with the gate electrode; and
a multilayer film which is in contact with the gate insulating film and includes a first oxide semiconductor layer, a second oxide semiconductor layer, and a third oxide semiconductor layer in the order from a side farthest from the gate insulating film,
wherein the first oxide semiconductor layer, the second oxide semiconductor layer, and the third oxide semiconductor layer each contain indium, an element M, and zinc,
wherein the element M is aluminum, gallium, yttrium, or tin,
wherein the first oxide semiconductor layer has an atomic ratio of the element M to indium which is higher than an atomic ratio of the element M to indium of the second oxide semiconductor layer and has a thickness greater than or equal to 20 nm and less than or equal to 200 nm, and
wherein the third oxide semiconductor layer has an atomic ratio of the element M to indium which is higher than an atomic ratio of the element M to indium of the second oxide semiconductor layer and has a thickness greater than or equal to 0.3 nm and less than 10 nm.

6. The semiconductor device according to claim 5,
wherein the first oxide semiconductor layer has energy at a bottom of a conduction band, which is higher than energy at a bottom of a conduction band of the second oxide semiconductor layer, and
wherein the third oxide semiconductor layer has energy at a bottom of a conduction band, which is higher than energy at the bottom of the conduction band of the second oxide semiconductor layer.

7. The semiconductor device according to claim 5,
wherein the first oxide semiconductor layer has energy at a bottom of a conduction band, which is higher than energy at a bottom of a conduction band of the second oxide semiconductor layer by 0.2 eV or more and 2 eV or less, and
wherein the third oxide semiconductor layer has energy at a bottom of a conduction band, which is higher than energy at the bottom of the conduction band of the second oxide semiconductor layer by 0.2 eV or more and 2 eV or less.

8. The semiconductor device according to claim 5, wherein a source electrode and a drain electrode are formed between the second oxide semiconductor layer and the third oxide semiconductor layer.

9. A semiconductor device comprising:
a gate electrode;
a gate insulating film in contact with the gate electrode; and
a multilayer film which is in contact with the gate insulating film and includes a first oxide semiconductor layer, a second oxide semiconductor layer, and a third oxide semiconductor layer in the order from a side farthest from the gate insulating film,
wherein the first oxide semiconductor layer, the second oxide semiconductor layer, and the third oxide semiconductor layer each contain indium, an element M, and zinc,
wherein the element M is aluminum, gallium, yttrium, or tin,
wherein the first oxide semiconductor layer has an atomic ratio of the element M to indium which is 1.5 times or more as high as an atomic ratio of the element M to indium of the second oxide semiconductor layer and has a thickness greater than or equal to 20 nm and less than or equal to 200 nm, and wherein the third oxide semiconductor layer has an atomic ratio of the element M to indium which is 1.5 times or more as high as an atomic ratio of the element M to indium of the second oxide semiconductor layer and has a thickness greater than or equal to 0.3 nm and less than 10 nm.

10. The semiconductor device according to claim 9,
wherein the first oxide semiconductor layer has energy at a bottom of a conduction band, which is higher than energy at a bottom of a conduction band of the second oxide semiconductor layer, and
wherein the third oxide semiconductor layer has energy at a bottom of a conduction band, which is higher than energy at the bottom of the conduction band of the second oxide semiconductor layer.

11. The semiconductor device according to claim 9,
wherein the first oxide semiconductor layer has energy at a bottom of a conduction band, which is higher than energy at a bottom of a conduction band of the second oxide semiconductor layer by 0.2 eV or more and 2 eV or less, and
wherein the third oxide semiconductor layer has energy at a bottom of a conduction band, which is higher than energy at the bottom of the conduction band of the second oxide semiconductor layer by 0.2 eV or more and 2 eV or less.

12. The semiconductor device according to claim 9, wherein a source electrode and a drain electrode are formed between the second oxide semiconductor layer and the third oxide semiconductor layer.

* * * * *